US012648225B2

(12) United States Patent
Lee et al.

(10) Patent No.: US 12,648,225 B2
(45) Date of Patent: Jun. 2, 2026

(54) DISPLAY DEVICE AND METHOD OF FABRICATING THE SAME

(71) Applicant: Samsung Display Co., LTD., Yongin-si (KR)

(72) Inventors: Hyun Wook Lee, Yongin-si (KR); Tae Hee Lee, Yongin-si (KR); Jang Soon Park, Yongin-si (KR); Sung Geun Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 357 days.

(21) Appl. No.: 18/366,877

(22) Filed: Aug. 8, 2023

(65) Prior Publication Data

US 2024/0213275 A1 Jun. 27, 2024

(30) Foreign Application Priority Data

Dec. 21, 2022 (KR) ........................ 10-2022-0180905

(51) Int. Cl.
| | |
|---|---|
| *H10D 86/60* | (2025.01) |
| *H10D 86/01* | (2026.01) |
| *H10D 86/40* | (2025.01) |
| *H10W 90/00* | (2026.01) |

(52) U.S. Cl.
CPC ........... *H10D 86/60* (2025.01); *H10D 86/021* (2025.01); *H10D 86/451* (2025.01); *H10W 90/00* (2026.01); *H10D 86/441* (2025.01)

(58) Field of Classification Search
None
See application file for complete search history.

(56) References Cited

U.S. PATENT DOCUMENTS

| | | | |
|---|---|---|---|
| 10,943,947 B2 | 3/2021 | Im et al. | |
| 2018/0019369 A1* | 1/2018 | Cho ........................ | H05K 1/181 |
| 2021/0091159 A1 | 3/2021 | Lee et al. | |
| 2022/0013509 A1 | 1/2022 | Lee et al. | |
| 2022/0093836 A1 | 3/2022 | Lee et al. | |
| 2022/0149255 A1 | 5/2022 | Lee et al. | |
| 2022/0359791 A1 | 11/2022 | Kim et al. | |

(Continued)

FOREIGN PATENT DOCUMENTS

| | | |
|---|---|---|
| KR | 10-2019-0121894 | 10/2019 |
| KR | 10-2021-0029337 | 3/2021 |
| KR | 10-2022-0007818 | 1/2022 |

(Continued)

*Primary Examiner* — Bo B Jang

(74) *Attorney, Agent, or Firm* — Womble Bond Dickinson (US) LLP

(57) ABSTRACT

A display device may include pixel areas each including a first area and a second area; and a pixel in each pixel area. The pixel may include first to fifth insulating layers stacked on a substrate; a power line on the substrate; a pixel circuit component provided in the first area, and including a transistor disposed on the substrate and electrically connected to the power line; and an emission component provided in the second area, and including first, second, and third alignment electrodes disposed on the substrate, and a light emitting element disposed between the first, second, and third alignment electrodes. At least one of the first to the fifth insulating layers may be disposed under the first to the third alignment electrodes and may include an inorganic insulating layer.

20 Claims, 26 Drawing Sheets

(56) References Cited

U.S. PATENT DOCUMENTS

| | | |
|---|---|---|
| 2022/0375990 A1 | 11/2022 | Im et al. |
| 2022/0399398 A1 | 12/2022 | Kim et al. |

FOREIGN PATENT DOCUMENTS

| | | |
|---|---|---|
| KR | 10-2022-0038229 | 3/2022 |
| KR | 10-2022-0063871 | 5/2022 |
| KR | 10-2022-0166692 | 12/2022 |
| WO | 2022/240094 | 11/2022 |

* cited by examiner

| ENCAPSULATION LAYER | ~ ENC |
| OPTICAL LAYER | ~ LCL |

PCL ~

| PIXEL CIRCUIT LAYER | LIGHT—EMITTING—ELEMENT LAYER | ~ LDL |
| SUBSTRATE | ~ SUB |

DR3

DPL { LDL
       LCL

C1: BML
C3: ALE1, ALE2, FTP2
C4: PL1b, UE
C5: PE1, CTE

C1: D1, BML
C3: ALE1, ALE2, ALE3
C4: UE, PL1c
C5: PE1, PE2, CTE

C1: D1, BML
C3: ALE1, ALE2, ALE3
C4: UE, PL1c
C5: PE1, PE2, CTE

C1: D1, BML
C3: ALE1, ALE2, ALE3
C4: UE, PL1c
C5: PE1, PE2, CTE

C1: D1, BML
C3: ALE1, ALE2, ALE3
C4: UE, PL1c
C5: CTE, PE1, PE2

C1: BML
C3: ALL1, ALL2

C1: BML
C3: ALL1, ALL2

C1: BML
C3: ALL1, ALL2
C4: PL1b, UE

C1: BML
C3: ALL1, ALL2
C4: PL1b, UE

C1: BML
C3: ALL1, ALL2
C4: PL1b, UE

C1: BML
C3: ALL1, ALL2
C4: PL1b, UE

C1: BML
C3: ALL1, ALL2
C4: PL1b, UE

C1: BML
C3: ALL1, ALL2
C4: PL1b, UE
C5: PE1, CTE

FIG. 25

C1: D1, BML
C3: ALE1, ALE2, ALE3
C4: UE, PL1c
C5: PE1, PE2, CTE
LCL: CCL, CFL

C1: D1, BML
C3: ALE1, ALE2, ALE3
C4: UE, PL1c
C5: PE1, PE2, CTE
LCL: CCL, CFL

DISPLAY DEVICE AND METHOD OF FABRICATING THE SAME

CROSS-REFERENCE TO RELATED APPLICATION

The application claims priority to and benefits of Korean patent application number 10-2022-0180905 under 35 U.S.C. § 119, filed in the Korean Intellectual Property Office (KIPO) on Dec. 21, 2022, the entire disclosure of which is incorporated herein by reference.

BACKGROUND

1. Technical Field

Various embodiments of the disclosure relate to a display device and a method of fabricating the display device.

2. Description of Related Art

Recently, as interest in information display increases, research and development on display devices have been continuously conducted.

SUMMARY

Various embodiments of the disclosure may provide a display device having improved reliability.

Furthermore, various embodiments of the disclosure are directed to a method of fabricating the display device.

The technical objectives to be achieved by the disclosure are not limited to those described herein, and other technical objectives that are not mentioned herein would be clearly understood by a person skilled in the art from the description of the disclosure.

An embodiment of the disclosure may provide a display device including pixel areas each including a first area and a second area; and a pixel provided in each of the pixel areas. The pixel may include a first insulating layer, a second insulating layer, a third insulating layer, a fourth insulating layer, and a fifth insulating layer successively stacked on a substrate; a power line disposed on the substrate; a pixel circuit component provided in the first area, and comprising a transistor disposed on the substrate and electrically connected to the power line; and an emission component provided in the second area, and comprising first, second, and third alignment electrodes disposed on the substrate at positions spaced apart from each other, and a light emitting element disposed between the first, the second, and the third alignment electrodes. At least one of the first to the fifth insulating layers may be disposed under the first to the third alignment electrodes. The at least one of the first to the fifth insulating layers may include an inorganic insulating layer.

In an embodiment, the first, the second, and the third alignment electrodes may be formed of a third conductive layer disposed on the third insulating layer. Each of the first insulating layer, the second insulating layer, and the third insulating layer may include the inorganic insulating layer.

In an embodiment, the power line may include a first power line supplied with a voltage of a first driving power supply, and a second power line supplied with a voltage of a second driving power supply different from the voltage of the first driving power supply. The first power line may include a first vertical power line formed of a first conductive layer disposed on the substrate, a first horizontal power line formed of a fourth conductive layer disposed on the fourth insulating layer, and a first dummy power line integral with the first horizontal power line and extending in a direction different from the first horizontal power line. The second power line may include a second vertical power line formed of the first conductive layer, a second horizontal power line formed of the fourth conductive layer, and a second dummy power line integral with the second horizontal power line and extending in a direction different from the second horizontal power line.

In an embodiment, the emission component may further include a first floating pattern spaced apart from the first alignment electrode, a second floating pattern spaced apart from the second alignment electrode, and a third floating pattern spaced apart from the third alignment electrode. The first floating pattern may be electrically connected to the first horizontal power line, and the second and the third floating patterns may be electrically connected to the second horizontal power line.

In an embodiment, the transistor may include an active pattern disposed on the first insulating layer, a gate electrode disposed on the active pattern with the second insulating layer disposed between the gate electrode and the active pattern, a source electrode electrically connected to a first end of the active pattern, and a drain electrode electrically connected to a second end of the active pattern. The gate electrode may be formed of a second conductive layer disposed on the second insulating layer.

In an embodiment, the pixel may include an emission area in which light is emitted from the light emitting element, and a non-emission area enclosing the emission area; and a first bank provided in the non-emission area, and including an opening corresponding to the emission area. The emission area may be located in the second area.

In an embodiment, at least in the emission area, the first conductive layer and the second conductive layer may not be disposed under the first, the second, and the third alignment electrodes.

In an embodiment, at least in the emission area, the third alignment electrode, the first alignment electrode, and the second alignment electrode may be arranged in a first direction in a listed order. The light emitting element may include a first light emitting element disposed between the first alignment electrode and the second alignment electrode, and including a first end and a second end which face each other; and a second light emitting element disposed between the first alignment electrode and the third alignment electrode, and including a first end and a second end which face each other.

In an embodiment, the emission component may further include a first electrode, a second electrode, and an intermediate electrode which are formed of a fifth conductive layer disposed on the fifth insulating layer and are disposed to be spaced apart from each other. The first electrode may be disposed on a first side of the first alignment electrode and be electrically connected to the first end of the first light emitting element. The second electrode may be disposed on the third alignment electrode and be electrically connected to the second end of the second light emitting element. The intermediate electrode may be disposed on the second alignment electrode and electrically connected to the second end of the first light emitting element, and may be disposed on a second side of the first alignment electrode and electrically connected to the first end of the second light emitting element.

In an embodiment, the pixel circuit component may further include a storage capacitor electrically connected to the transistor, and a connection pattern electrically connected to an electrode of the storage capacitor and formed of the fourth conductive layer. The connection pattern may be located in the first area. The first electrode may extend to the first area and be electrically connected to the connection pattern through a first contactor passing through the fifth insulating layer.

In an embodiment, the emission component may further include a bridge line disposed in the non-emission area, and the bridge line being integral with the second electrode. The bridge line may include a protrusion part protruding in a second direction different from the first direction and electrically connected to the second power line through a second contactor passing through the fifth insulating layer.

In an embodiment, the display device may further include a pad area in which a pad electrically connected to the pixel is disposed. The pad may include a first pad electrode formed of the fourth conductive layer, and a second pad electrode formed of the fifth conductive layer. The first pad electrode and the second pad electrode may be electrically connected to each other through a pad contact hole passing through the fifth insulating layer.

In an embodiment, the pixel may include a second bank disposed over the first bank in the second area; a color conversion layer enclosed by the second bank and disposed over the light emitting elements; and a color filter disposed on the color conversion layer.

In an embodiment, the first vertical power line, the first horizontal power line, and the first dummy power line may be electrically connected to each other. The second vertical power line, the second horizontal power line, and the second dummy power line may be electrically connected to each other.

In an embodiment, the first dummy power line may overlap the first vertical power line in a plan view. The first horizontal power line may extend from the first dummy power line in a first direction. The second dummy power line may overlap the second vertical power line in a plan view. The second horizontal power line may extend from the second dummy power line in the first direction, An embodiment of the disclosure may provide a display device including a first sub-pixel area, a second sub-pixel area, and a third sub-pixel area disposed adjacent to each other, and each including a first area and a second area. Each of the first, the second, and the third sub-pixel areas may include a first insulating layer, a second insulating layer, a third insulating layer, a fourth insulating layer, and a fifth insulating layer successively stacked on a substrate; a power line disposed on the substrate, and comprising a first power line supplied with a voltage of a first driving power supply, and a second power line spaced apart from the first power line and supplied with a voltage of a second driving power supply; a pixel circuit component provided in the first area, and comprising a transistor disposed on the substrate and electrically connected to the power line, and a storage capacitor electrically connected to the transistor; and an emission component provided in the second area, and comprising first, second, and third alignment electrodes disposed on the substrate at positions spaced apart from each other, and a light emitting element disposed between the first, the second, and the third alignment electrodes. At least one of the first to the fifth insulating layers may be disposed under the first to the third alignment electrodes, and the at least one of the first to the fifth insulating layers may include an inorganic insulating layer.

In an embodiment, the second area may include an emission area in which light is emitted from the light emitting element. A conductive layer may not be disposed under the first, the second, and the third alignment electrodes at least in the emission area.

In an embodiment, the light emitting element may include a first light emitting element disposed between the first alignment electrode and the second alignment electrode, and including a first end and second end which face each other; and a second light emitting element disposed between the first alignment electrode and the third alignment electrode, and including a first end and second end which face each other. The emission component may further include a first electrode, a second electrode, and an intermediate electrode which are disposed on the fifth insulating layer and spaced apart from each other.

In an embodiment, the emission component may further include a bridge line located in the second area and electrically connected to the second electrode of each of the first, the second, and the third sub-pixel areas. The bridge line may include a protrusion part protruding from the second area to the first area and electrically connected to the second power line.

An embodiment of the disclosure may provide method of fabricating a display device, including forming, on a substrate, a pixel in each of pixel areas each including a first area and a second area. Forming the pixel may include forming a first insulating layer, a second insulating layer, and a third insulating layer on the substrate; forming first, second, and third alignment lines spaced apart from each other, on the third insulating layer in the second area; forming, on the first, the second, and the third alignment lines, a fourth insulating layer including a contact hole through which one area of each of the first, the second, and the third alignment lines is exposed; forming, on the fourth insulating layer in the second area, a first horizontal power line electrically connected to the first alignment line, and a second horizontal power line electrically connected to the second and the third alignment lines; forming a fifth insulating layer on the first and the second horizontal power lines; aligning a first light emitting element on the fifth insulating layer between the first alignment electrode and the second alignment electrode, and aligning a second light emitting element on the fifth insulating layer between the first alignment electrode and the third alignment electrode; forming a first electrode on a first end of the first light emitting element, forming an intermediate electrode on a second end of the first light emitting element and a first end of the second light emitting element, and forming a second electrode on a second end of the second light emitting element; and forming an alignment electrode and a floating pattern disposed to be spaced apart from each other by removing a portion of each of the first, the second, and the third alignment lines in the second area.

In an embodiment, each of the first insulating layer, the second insulating layer, and the third insulating layer that are located under the first, the second, and the third alignment lines may include an inorganic insulating layer.

BRIEF DESCRIPTION OF THE DRAWINGS

FIG. 1 is a schematic perspective view illustrating a light emitting element in accordance with an embodiment.

FIGS. 25 and 26 illustrate the first sub-pixel in accordance with an embodiment, and are schematic cross-sectional views corresponding to line of FIG. 8.

DETAILED DESCRIPTION OF THE EMBODIMENTS

Figure 2:
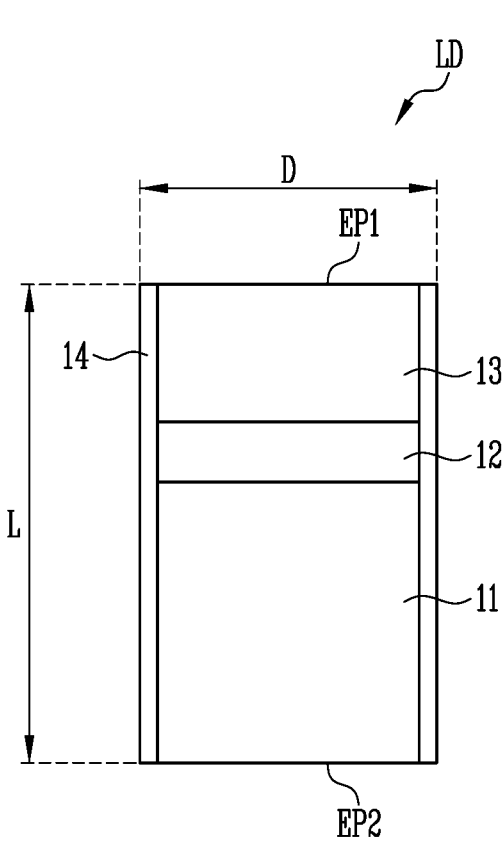
FIG. 2 is a schematic cross-sectional view illustrating the light emitting element of FIG. 1.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the technical scope of the disclosure are encompassed in the disclosure.

Throughout the disclosure, like reference numerals and/or reference characters refer to like parts throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. in case that used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that in case that an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that in case that an element (e.g., a first element) is referred to as being "directly coupled with/to" or "directly connected with/to" another element (e.g., a second element), no other element (e.g., a third element) intervenes between the element and the other element. To this end, the term "connected" may refer to physical, electrical, and/or fluid connection, with or without intervening elements.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural form or meaning as long as it is not specifically mentioned in a sentence.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value."

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
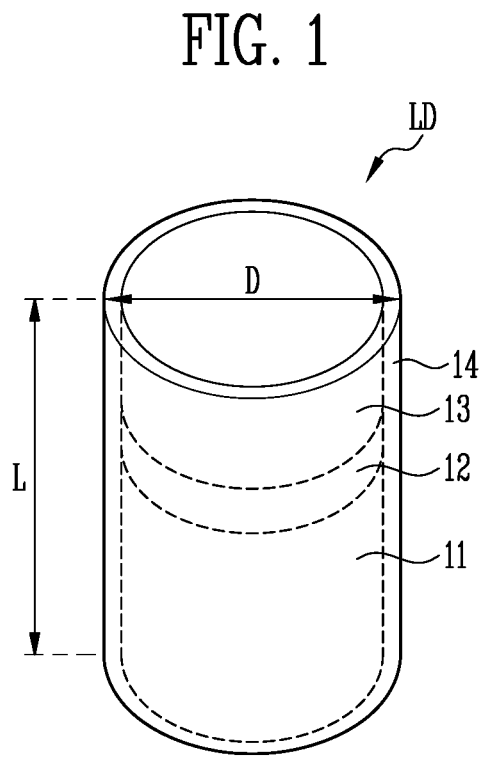

FIG. 1 is a schematic perspective view illustrating a light emitting element LD in accordance with an embodiment. FIG. 2 is a schematic cross-sectional view illustrating the light emitting element LD of FIG. 1.

Referring to FIGS. 1 and 2, the light emitting element LD may include at least one of a first semiconductor layer 11, a second semiconductor layer 13, and an active layer 12 interposed (or disposed) between the first and second semiconductor layers 11 and 13. For example, the light emitting element LD may be implemented as an emission stack (or referred to as a "stack pattern") formed by successively stacking the first semiconductor layer 11, the active layer 12, and the second semiconductor layer 13 on each other. The type and/or shape of the light emitting element LD is not limited to that of the embodiment illustrated in FIG. 1.

The light emitting element LD may be formed in a shape extending in a direction. If the direction in which the light emitting element LD extends is defined as a longitudinal direction, the light emitting element LD may have a first end EP1 and a second end EP2 that are opposite to each other in the longitudinal direction. A semiconductor layer of the first semiconductor layer 11 and the second semiconductor layer 13 may be disposed on the first end EP1 of the light emitting element LD, and the other semiconductor layer of the first semiconductor layer 11 and the second semiconductor layer 13 may be disposed on the second end EP2 of the light emitting element LD. For example, the second semiconductor layer 13 may be disposed on the first end EP1 of the light emitting element LD, and the first semiconductor layer 11 may be disposed on the second end EP2 of the light emitting element LD.

The light emitting element LD may be provided in various shapes. For example, as illustrated in FIG. 1, the light emitting element LD may have a rod-like shape, a bar-like shape, or a pillar-like shape which is long in the longitudinal direction (for example, to have an aspect ratio greater than about 1). As another example, the light emitting element LD may have a rod-like shape, a bar-like shape, or a pillar-like shape which is short in the longitudinal direction (for example, to have an aspect ratio less than about 1). As still another example, the light emitting element LD may have a rod-like shape, a bar-like shape, or a pillar-like shape having an aspect ratio of about 1.

The light emitting element LD may include a light-emitting diode (LED) fabricated to have a subminiature size, e.g., a diameter D and/or a length L corresponding to a range from the nano scale (or the nanometer scale) to the micro scale (or the micrometer scale).

In case that the light emitting element LD is long or elongated (e.g., to have an aspect ratio greater than about 1) in the longitudinal direction, the diameter D of the light emitting element LD may be in a range of about 0.5 μm to about 6 μm, and the length L thereof may be in a range of about 1 μm to about 10 μm. However, the diameter D and the length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes at least one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited thereto, and various other materials may be used to form the first conductive semiconductor layer 11.

The active layer 12 may be disposed on the first semiconductor layer 11 and have a single- or multi-quantum well structure. For example, in case that the active layer 12 has a multiple quantum well structure, the active layer 12 may be formed by periodically repeatedly stacking a barrier layer, a stain reinforcing layer, and a well layer which are provided as a unit. However, the structure of the active layer 12 is not limited to that of the foregoing embodiment.

The active layer 12 may emit light having a wavelength ranging from about 400 nm to about 900 nm, and have a double heterostructure. In an embodiment, a clad layer doped with a conductive dopant may be formed over or under the active layer 12 in the longitudinal direction of the light emitting element LD. For example, the clad layer may be formed of, formed as, or included in (hereinafter "formed of") an AlGaN layer or an InAlGaN layer. In an embodiment, material such as AlGaN or InAlGaN may be used to form the active layer 12, and various other materials may be used to form the active layer 12. The active layer 12 may include a first surface which contacts the first semiconductor layer 11, and a second surface which contacts the second semiconductor layer 13.

If an electric field having a certain voltage or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (or a light emitting source) of various light emitting devices as well as a pixel of a display device.

The second semiconductor layer 13 may be disposed on the second surface of the active layer 12 and include a semiconductor layer of a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of, e.g., InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13.

The first semiconductor layer 11 and the second semiconductor layer 13 may have different thicknesses in the longitudinal direction of the light emitting element LD. For example, the first semiconductor layer 11 may have a thickness greater than that of the second semiconductor layer 13 in the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although FIGS. 1 and 2 illustrate that each of the first semiconductor layer 11 and the second semiconductor layer 13 is formed of a single layer, the disclosure is not limited thereto. In an embodiment, depending on the material of the active layer 12, each of the first semiconductor layer 11 and the second semiconductor layer 13 may further include one or more layers, for example, a clad layer and/or a tensile strain barrier reducing (TSBR) layer. The TSBR layer may be a strain relief layer which is disposed between semiconductor layers having different lattice structures and thus can function as a buffer layer to reduce a difference in lattice constant. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (hereinafter referred to as a "first contact electrode") disposed over the second semiconductor layer 13, as well as including the first semiconductor layer 11, the active layer 12, and the second semiconductor layer 13. Furthermore, in an embodiment, the light emitting element LD may further include an additional contact electrode (hereinafter referred to as a "second contact electrode") disposed on an end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto. In an embodiment, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). Zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent.

In an embodiment, the light emitting element LD may further include an insulating layer 14. However, depending on an embodiment, the insulating layer 14 may be omitted, or may be provided to cover only some of the first semiconductor layer 11, the active layer 12, and the second semiconductor layer 13.

The insulating layer 14 may prevent the active layer 12 from short-circuiting due to contacting conductive material other than the first and second semiconductor layers 11 and 13. Furthermore, the insulating layer 14 may minimize a surface defect of the light emitting element LD, thus enhancing the lifespan and emission efficiency of the light emitting element LD. In case that light emitting elements LD are disposed in contact with each other, the insulating layer 14 may prevent an undesired short circuit from occurring between the light emitting elements LD. The presence or absence of the insulating layer 14 is not limited, so long as the active layer 12 can be prevented from short-circuiting with external conductive material.

The insulating layer 14 may be provided to enclose an overall outer circumferential surface of the emission stack including the first semiconductor layer 11, the active layer 12, and the second semiconductor layer 13.

Although in the foregoing embodiment the insulating layer 14 has been described as enclosing the entirety of the outer circumferential surface of each of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first semiconductor layer 11, or may enclose only a portion of the outer circumferential surface of the first semiconductor layer 11 without enclosing the other portion of the outer circumferential surface of the first semiconductor layer 11. Furthermore, in an embodiment, in case that the first contact electrode is disposed on the first end EP1 of the light emitting element LD and the second contact electrode is disposed on the second end EP2 of the light emitting element LD, the insulating layer 14 may allow at least one area of each of the first and second contact electrodes to be exposed.

The insulating layer 14 may include transparent insulating material. Various materials having insulation properties may be used as the material of the insulating layer 14.

The insulating layer 14 may have a single-layer structure or a multi-layer structure including a double-layer structure. For example, in case that the insulating layer 14 is formed of a double-layer structure including a first layer and a second layer that are successively stacked each other, the first layer and the second layer may be made of different materials (or substances) and be formed through different processes. Depending on an embodiment, the first layer and the second layer may include a same material and be formed through successive processes.

In an embodiment, the light emitting element LD may be implemented as a light emitting pattern having a core-shell structure.

The light emitting element LD may be employed as a light emitting source (or a light source) for various display devices. The light emitting element LD may be fabricated through a surface treatment process.

An emission component including the light emitting element LD described above may be used not only in a display device but also in various electronic devices which requires a light source.

Figure 3:
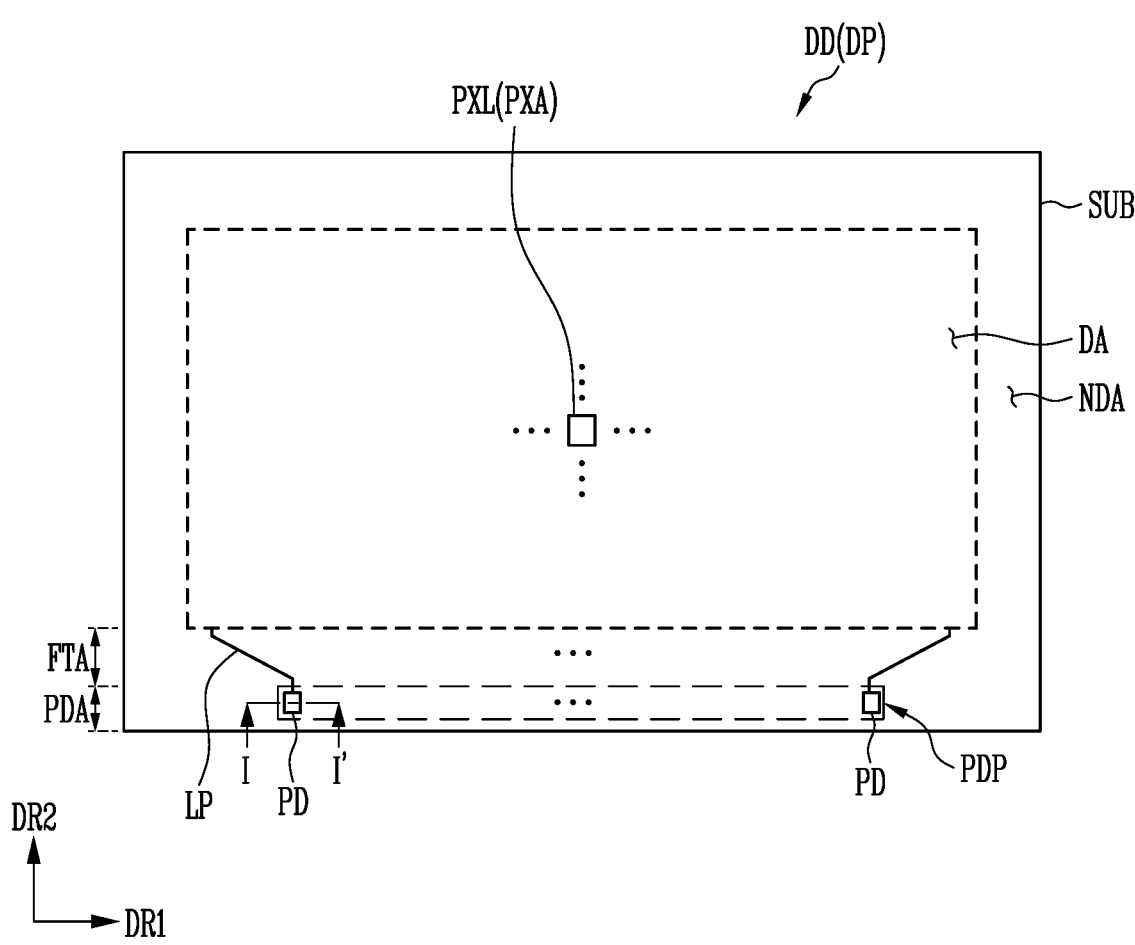
FIG. 3 is a schematic plan view illustrating a display device in accordance with an embodiment.
Figure 4:
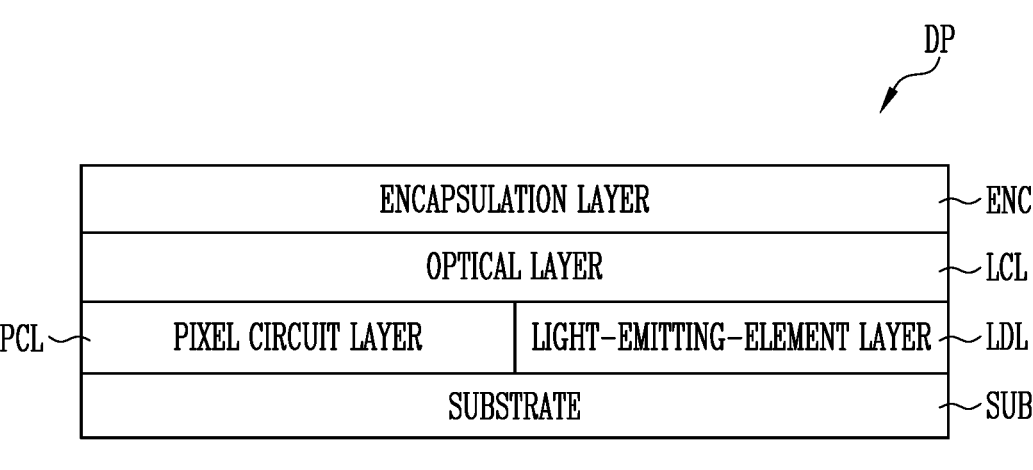
FIG. 4 is a schematic cross-sectional view illustrating a display panel of FIG. 3.
Figure 4:

FIG. 3 is a schematic plan view illustrating a display device DD in accordance with an embodiment. FIG. 4 is a schematic cross-sectional view illustrating a display panel DP of FIG. 3.

For the convenience sake, FIGS. 3 and 4 schematically illustrate the display device DD, for example, the structure of a display panel DP provided in the display device DD, centering on a display area DA in which an image is displayed.

Referring to FIGS. 1 to 4, the display device DD may include at least one of a substrate SUB, pixels PXL provided in a display area DA on the substrate SUB and each including at least one light emitting element LD, a driver provided on the substrate SUB and configured to drive the pixels PXL, and a line component provided to electrically connect the pixels PXL with the driver.

The display device DD may be classified into a passive matrix type display device and an active matrix type display device according to a method of driving the light emitting element LD. For example, in case that the display device DD is implemented as an active matrix type display device, each of the pixels PXL may include a driving transistor configured to control the amount of a current to be supplied to the light emitting element LD, and a switching transistor configured to transmit a data signal to the driving transistor.

The display panel DP (or the display device DD) may include a substrate SUB, and pixels PXL provided in of the display area DA on the substrate SUB. Each of the pixels PXL may include at least one light emitting element LD.

The substrate SUB may include transparent insulating material to allow light transmission. The substrate SUB may be a rigid substrate or a flexible substrate.

For example, the rigid substrate may be at least one of a glass substrate, a quartz substrate, a glass ceramic substrate, and a crystalline glass substrate.

The flexible substrate may be either a film substrate or a plastic substrate which includes polymer organic material. For example, the flexible substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the embodiments are not limited thereto.

An area of the substrate SUB may be provided as the display area DA in which the pixels PXL are disposed, and the other area of the substrate SUB may be provided as the non-display area NDA. For example, the substrate SUB may include the display area DA including pixel areas PXA on which the respective pixels PXL are disposed, and a non-display area NDA disposed around a perimeter of the display area DA (or adjacent to the display area DA). In an embodiment, the display area DA and the non-display area NDA may be defined in the display device DD.

The non-display area NDA may be provided on at least one side of the display area DA. The non-display area NDA may enclose the perimeter (or edges) of the display area DA. Portions of the line component electrically connected to the pixels PXL, and the driver electrically connected to the line component and configured to drive the pixels PXL may be provided in the non-display area NDA.

The non-display area NDA may be an area in which certain lines (e.g., fanout lines LP), pads PD, and/or an internal circuit that are electrically connected with the pixels PXL to drive the pixels PXL are provided.

In an embodiment, the non-display area NDA may include a fanout area FTA and a pad area PDA.

The pad area PDA may be an area of the non-display area NDA in which a pad component PDP is located, and may be disposed most adjacent to a perimeter (or an edge) of the non-display area NDA. The fanout area FTA may be another area of the non-display area NDA in which the fanout lines LP that are portions of the line component are located, and may be disposed adjacent to the display area DA in the non-display area NDA. For example, the fan-out area FTA may be an area of the non-display area NDA that is disposed between the pad area PDA and the display area DA. In an embodiment, the non-display area NDA may include an antistatic circuit area in which there is disposed an antistatic circuit which is electrically connected to signal lines disposed in the display area DA and is configured to prevent static electricity from occurring. The antistatic circuit area may be an area of the non-display area NDA between the display area DA and the fanout area FTA, but is not limited thereto.

The pad component PDP may be disposed in the pad area PDA. The fanout lines LP, which are portions of the line component, may be disposed in the fanout area FTA.

The fanout lines LP may be electrically connected to the pixels PXL so that certain signals applied from the driver may be transmitted to the pixels PXL. The fanout lines LP may be disposed in the fanout area FTA and electrically connect the driver to the pixels PXL.

The pad component PDP may include pads PD. The pads PD may supply (or transmit) driving power voltages and signals for driving the pixels PXL provided in the display area DA and/or the internal circuit. In an embodiment, in case that the driver is mounted in the non-display area NDA of the substrate SUB, the pad component PDP may overlap output pads of the driver in a direction or view (e.g., in a plan view) and be supplied with signals outputted from the driver.

Each of the pixels PXL may be disposed in the pixel area PXA. In an embodiment, the pixels PXL may be arranged in the display area DA in various arrangements, for example, a stripe arrangement manner or the like, but the disclosure is not limited thereto.

Each of the pixels PXL may include a pixel circuit layer PCL, a display element layer DPL, and an encapsulation layer ENC, which are disposed on the substrate SUB.

A pixel circuit PXC (see FIG. 5) may be disposed in the pixel circuit layer PCL. The pixel circuit PXC may be provided on the substrate SUB and include transistors, signal lines electrically connected to the transistors, and insulating layers. Each of the transistors may have a structure in which, for example, a semiconductor pattern, a gate electrode, a first terminal, and a second terminal are successively stacked each other with insulating layers interposed therebetween. The semiconductor pattern may include, e.g., at least one of amorphous silicon, poly silicon, low-temperature poly silicon, and an organic semiconductor, and an oxide semiconductor. Although the gate electrode, the first terminal (or the source electrode), and the second terminal (or the drain electrode) each may include, e.g., at least one of aluminum (Al), copper (Cu), titanium (Ti), and molybdenum (Mo), the disclosure is not limited thereto.

The display element layer DPL may include a light-emitting-element layer LDL and an optical layer LCL.

The light-emitting-element layer LDL may be disposed on the substrate SUB. In an embodiment, the light-emitting-element layer LDL and the pixel circuit layer PCL may be disposed on a same surface, and the light-emitting-element layer LDL may be spaced apart from the pixel circuit layer PCL without overlapping the pixel circuit layer PCL. An emission component EMU (see FIG. 5) including a light emitting element LD configured to emit light may be disposed in the light-emitting-element layer LDL. A first electrode and a second electrode electrically connected to the light emitting element LD may be disposed in the emission component EMU.

The optical layer LCL may convert light which is emitted from the light-emitting-element layer LDL and travels in an upward direction (or a third direction DR3) of the substrate SUB to light having excellent color reproducibility, and may emit the converted light. The optical layer LCL may include a color filter layer and a color conversion layer.

The encapsulation layer ENC may be disposed on the display element layer DPL (or the optical layer LCL). The encapsulation layer ENC may mitigate a step difference caused by components located thereunder, e.g., the optical layer LCL, and may prevent external air, water, or the like from permeating the display element layer DPL. The encapsulation layer ENC may include material capable of absorbing and/or blocking light to prevent external light from being introduced into the display element layer DPL. For example, the encapsulation layer ENC may include a black matrix, but is not limited thereto.

Figure 5:
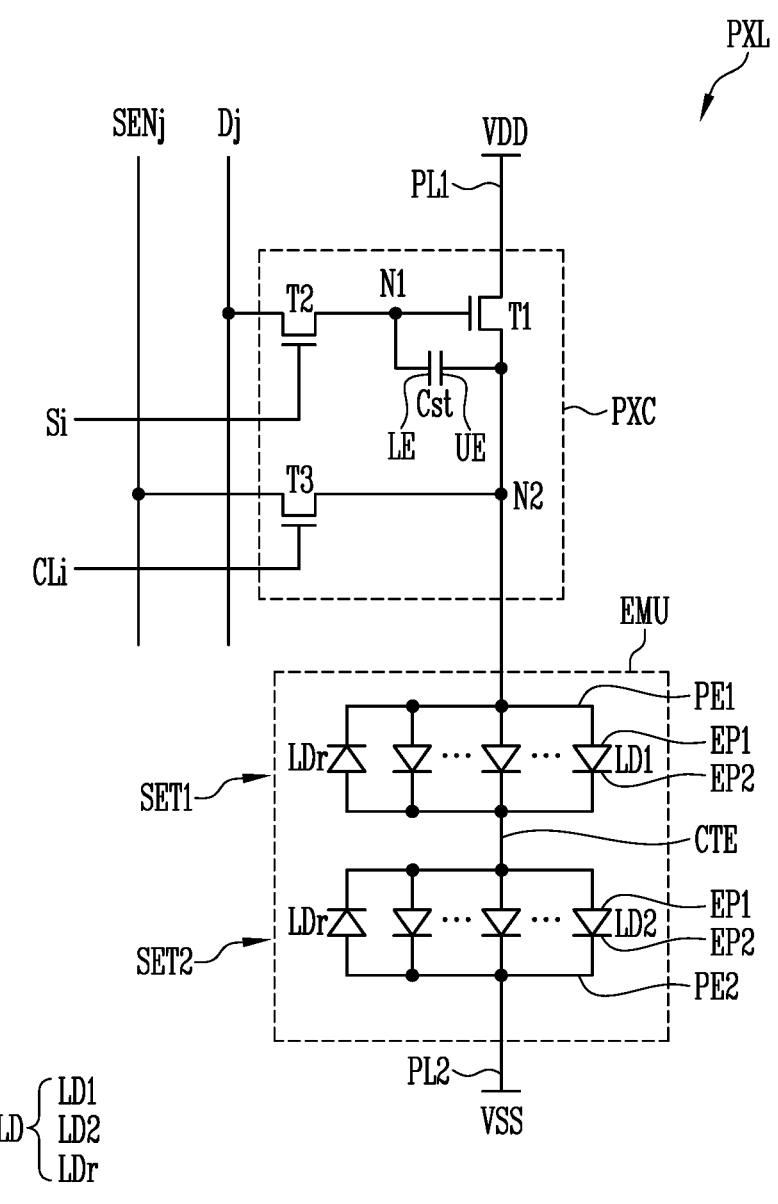
FIG. 5 is a schematic diagram of an equivalent circuit illustrating an electrical connection relationship of components included in each of the pixels illustrated in FIG. 3.

FIG. 5 is a schematic diagram of an equivalent circuit illustrating an electrical connection relationship of components included in each of the pixels PXL illustrated in FIG. 3.

For example, FIG. 5 illustrates the electrical connection relationship of components included in the pixel PXL that may be employed in an active matrix type display device in accordance with an embodiment. The connection relationship of the components of each pixel PXL is not limited thereto.

Referring to FIGS. 1 to 5, the pixel PXL may include an emission component EMU configured to generate light having a luminance corresponding to a data signal. Furthermore, the pixel PXL may include a pixel circuit PXC configured to drive the emission component EMU.

For example, the emission component EMU may include a first electrode PE1 (or a first pixel electrode) electrically connected to a first driving power supply VDD by the pixel circuit PXC and a first power line PL1, a second electrode PE2 (or a second pixel electrode) electrically connected to a second driving power supply VSS by a second power line PL2, and light emitting elements LD electrically connected between the first and second electrodes PE1 and PE2. The first driving power supply VDD and the second driving power supply VSS may have different potentials to allow the light emitting elements LD to emit light. For example, the first driving power supply VDD may be set to a high-potential power supply, and the second driving power supply VSS may be set to a low-potential power supply.

In an embodiment, the emission component EMU may include at least one series set. Each series set may include a pair of electrodes (e.g., two electrodes), and at least one light emitting element LD electrically connected in a forward direction between the pair of electrodes. The number of series sets that form the emission component EMU and the number of light emitting elements LD that form each series set are not particularly limited. For example, the numbers of light emitting elements LD that form the respective series sets may be identical to or different from each other. The number of light emitting elements LD of each series set is not particularly limited.

For example, the emission circuit EMU may include at least one of a first series set SET1 including at least one first light emitting element LD1, and a second series set SET2 including at least one second light emitting element LD2.

The first series set SET1 may include a first electrode PE1, an intermediate electrode CTE (or a bridge electrode), and at least one first light emitting element LD1 electrically connected between the first electrode PE1 and the intermediate electrode CTE. Each first light emitting element LD1 may be electrically connected in the forward direction between the first electrode PE1 and the first intermediate electrode CTE. For example, the first end EP1 of the first light emitting element LD1 may be electrically connected to the first electrode PE1. The second end EP2 of the first light emitting element LD1 may be electrically connected to the intermediate electrode CTE.

The second series set SET2 may include the intermediate electrode CTE, a second electrode PE2, and at least one second light emitting element LD2 electrically connected between the intermediate electrode CTE and the second electrode PE2. Each second light emitting element LD2 may be electrically connected in the forward direction between the intermediate electrode CTE and the second electrode PE2. For example, the first end EP1 of the second light emitting element LD2 may be electrically connected to the intermediate electrode CTE. The second end EP2 of the second light emitting element LD2 may be electrically connected to the second electrode PE2.

The first electrode of the emission component EMU, e.g., the first electrode PE1, may be an anode of the emission component EMU. The last electrode of the emission component EMU, e.g., the second electrode PE2, may be a cathode of the emission component EMU.

In case that the light emitting elements LD are electrically connected to have a series/parallel structure, power efficiency may be enhanced, compared to the case where an equal number of light emitting elements LD are electrically connected only in parallel to each other. Furthermore, in the pixel PXL in which the light emitting elements LD are electrically connected to have a series/parallel structure, sufficient luminance can be expressed by the light emitting elements LD of some series stages, so that the probability of occurrence of a black spot defect in the pixel PXL can be reduced. However, the disclosure is not limited thereto. The emission component EMU may be formed by electrically connecting the light emitting elements LD only in series. As another example, the emission component EMU may be formed by electrically connecting the light emitting elements LD only in parallel.

Each of the light emitting elements LD may include a first end EP1 (e.g., a p-type end) electrically connected to the first driving power supply VDD via at least one electrode (e.g., the first electrode PE1), the pixel circuit PXC, the first power line PL1, and/or the like, and a second end EP2 (e.g., an n-type end) electrically connected to the second driving power supply VSS via at least one additional electrode (e.g., the second electrode PE2), the second power line PL2, and the like. For example, the light emitting elements LD may be electrically connected in the forward direction between the first driving power supply VDD and the second driving power supply VSS. The light emitting elements LD that are electrically connected in the forward direction may form valid light sources of the emission component EMU.

In an embodiment, the emission component EMU may further include at least one reverse light emitting element LDr, as well as the light emitting elements LD that form the respective valid light sources.

The light emitting elements LD of the emission component EMU may emit light having a luminance corresponding to a driving current supplied thereto through the pixel circuit PXC. For example, during each frame period, the pixel circuit PXC may supply a driving current corresponding to a grayscale value of a corresponding frame data to the emission component EMU. The driving current supplied to the emission component EMU may be divided into parts which flow into the respective light emitting elements LD. Hence, each of the light emitting elements LD may emit light having a luminance corresponding to a current applied thereto, so that the emission component EMU may emit light having a luminance corresponding to the driving current.

The pixel circuit PXC may be electrically connected to a scan line Si and a data line Dj of the corresponding pixel PXL. For example, if the pixel PXL is disposed on an i-th row and a j-th column of the display area DA, the pixel circuit PXC of the pixel PXL may be electrically connected to an i-th scan line Si and a j-th data line Dj of the display area DA. Furthermore, the pixel circuit PXC may be electrically connected to an i-th control line CLi and a j-th sensing line SENj of the display area DA.

The pixel circuit PXC may include at least one of a first transistor T1, a second transistor T2, and a third transistor T3, and a storage capacitor Cst.

The first transistor T1 may be a driving transistor configured to control a driving current to be applied to the emission component EMU, and may be electrically connected between the first driving power supply VDD and the emission component EMU. For example, a first terminal of the first transistor T1 may be electrically connected to the first driving power supply VDD by the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of a driving current to be applied from the first driving power supply VDD to the emission component EMU through the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be electrically connected between the data line Dj (e.g., a j-th data line) and the first node N1. A first terminal of the second transistor T2 may be electrically connected to the data line Dj. A second terminal of the second transistor T2 may be electrically connected to the first node N1 (or the gate electrode of the first transistor T1). A gate electrode of the second transistor T2 may be electrically connected to the scan line Si (e.g., the i-th scan line). The first terminal and the second terminal of the second transistor T2 may be different terminals, and, for example, if the first terminal is a drain electrode, the second terminal may be a source electrode.

In case that a scan signal having a gate-on voltage (e.g., a high-level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by electrically connecting the first transistor T1 to the sensing line SENj (e.g., the j-th sensing line), and may detect, by using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi (e.g., the i-th control line). Furthermore, the first terminal of the third transistor T3 may be electrically connected to an initialization power supply. The third transistor T3 may be an initialization transistor configured to initialize the second node N2, and may be turned on in case that a sensing control signal is supplied thereto from the control line CLi, so that the voltage of the initialization power supply can be transmitted to the second node N2. Hence, an upper electrode UE (or a second storage electrode) of the storage capacitor Cst that is electrically connected to the second node N2 may be initialized.

The storage capacitor Cst may include a lower electrode LE (or a first storage electrode) and the upper electrode UE (or the second storage electrode). The lower electrode LE may be electrically connected to the first node N1. The upper electrode UE may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

Although FIG. 5 illustrates an embodiment where all of the first to third transistors T1, T2, and T3 are n-type transistors, the disclosure is not limited thereto. For example, at least one of the first to third transistors T1, T2, and T3 may be changed to a p-type transistor. In an embodiment, the emission component EMU may be electrically connected between the first driving power supply VDD and the pixel circuit PXC.

The structure of the pixel circuit PXC may be changed in various ways.

In an embodiment, for the sake of explanation, a transverse direction (or an X-axis direction) in a plan view will be indicated by a first direction DR1, a longitudinal direction (or a Y-axis direction) in a plan view will be indicated by a second direction DR2, and a vertical direction in a sectional view will be indicated by a third direction DR3.

Figure 6:
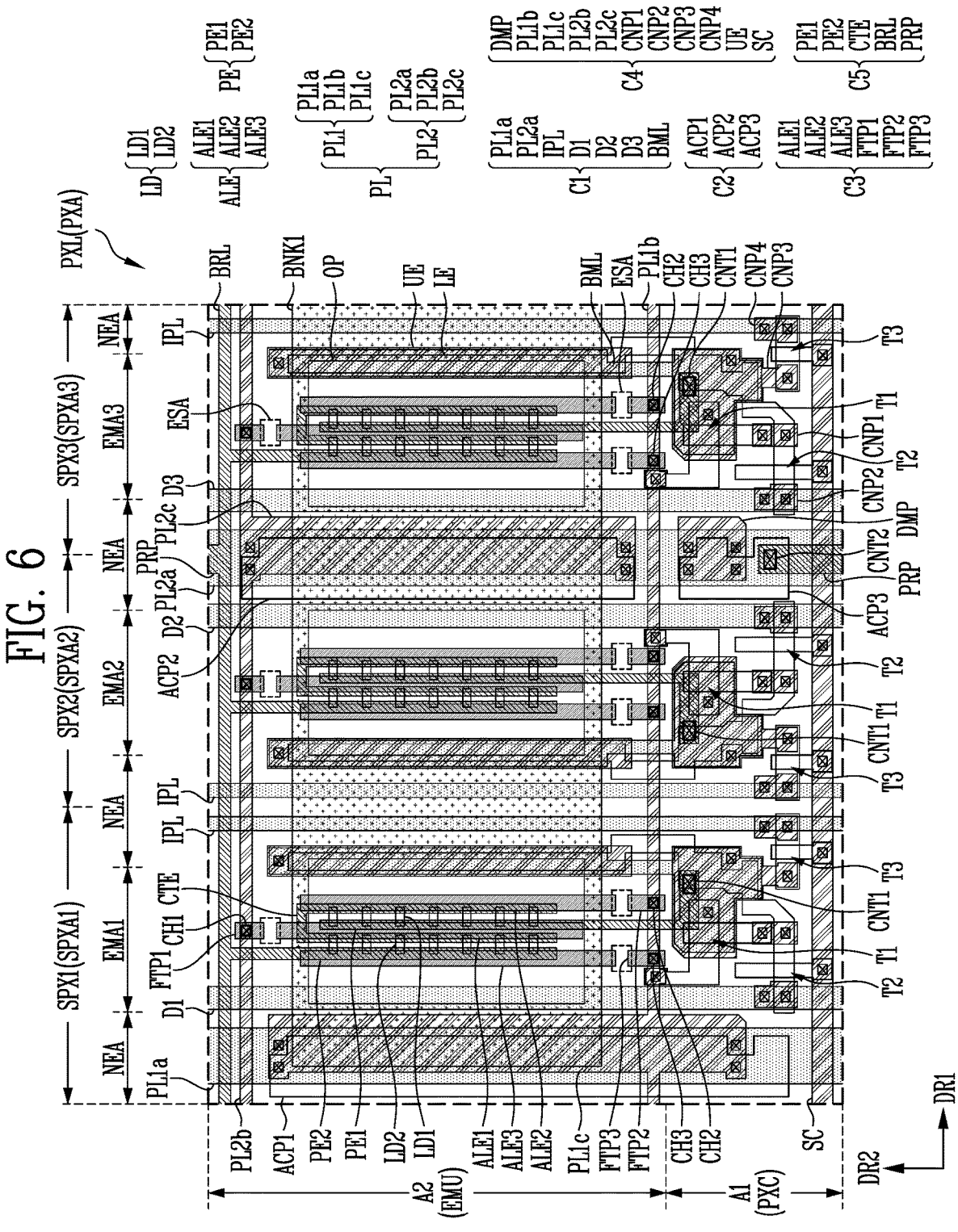
FIG. 6 is a schematic plan view illustrating a pixel in accordance with an embodiment.
Figure 7:
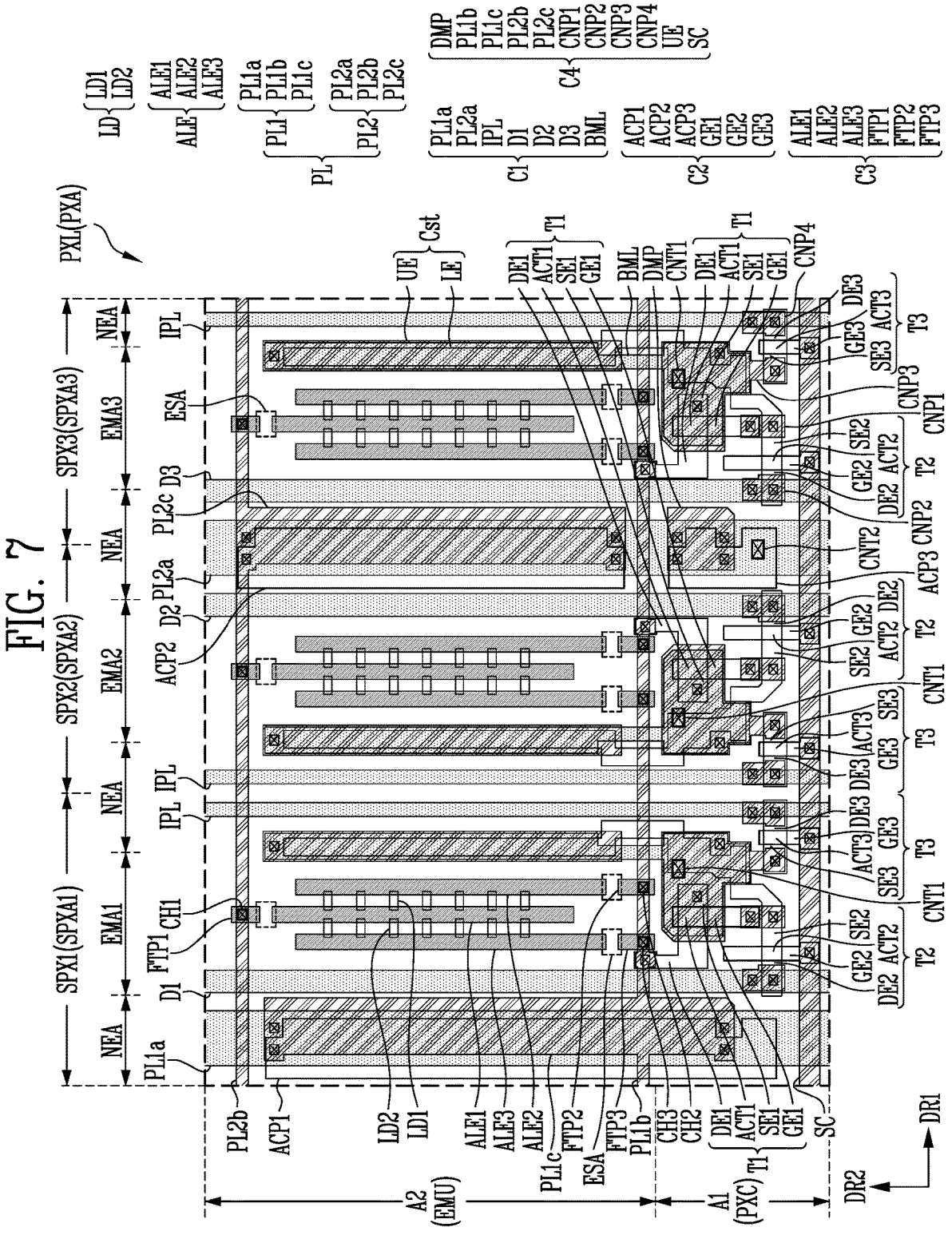
FIG. 7 is a schematic plan view illustrating the pixel of FIG. 6 from which some components have been omitted.
Figure 8:
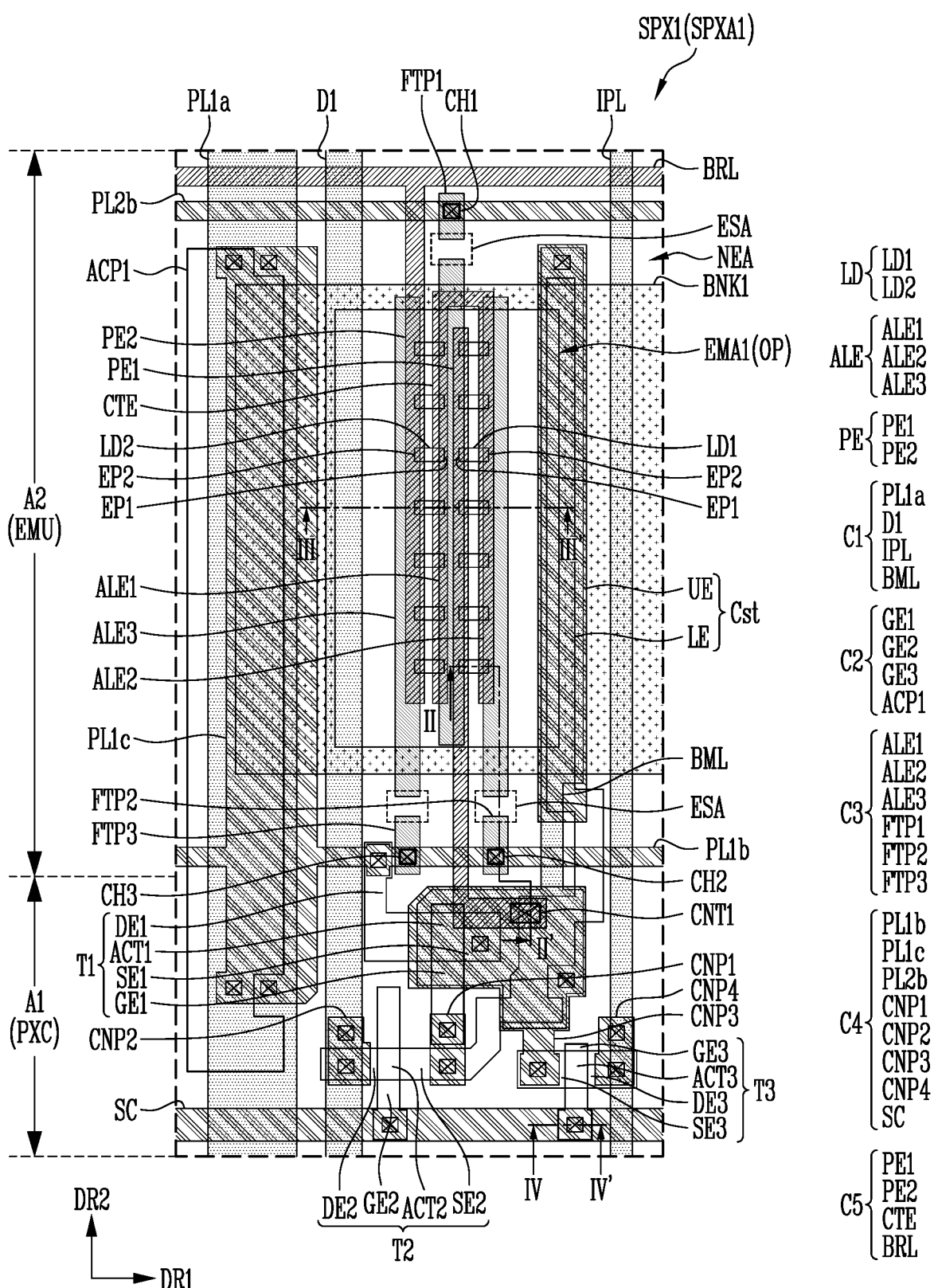
FIG. 8 is a schematic plan view illustrating a first subpixel of FIG. 6.
Figure 9:
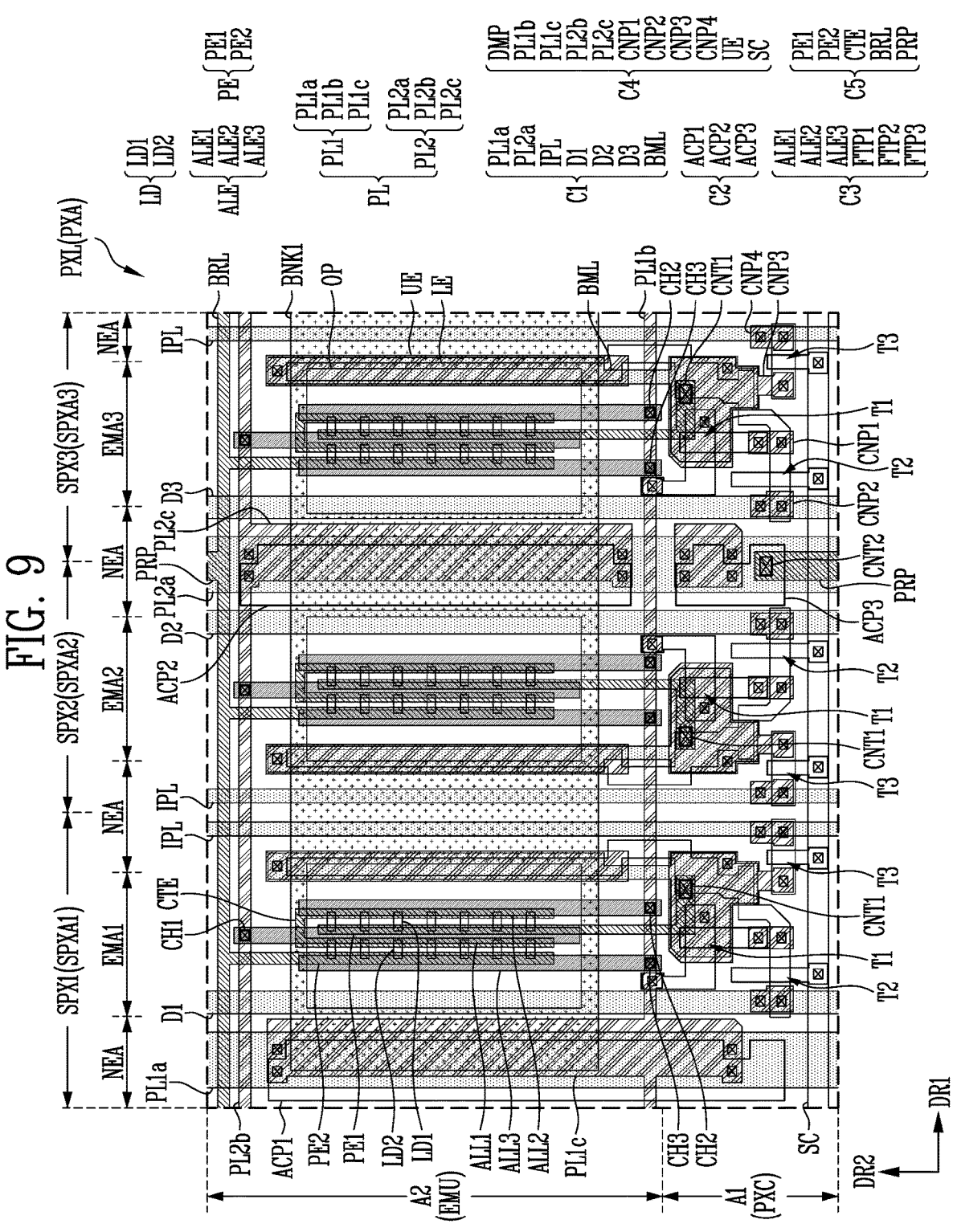
FIG. 9 is a schematic plan view illustrating the pixel of FIG. 6 before alignment electrodes are electrically separated from corresponding floating patterns.

FIG. 6 is a schematic plan view illustrating a pixel PXL in accordance with an embodiment. FIG. 7 is a schematic plan view illustrating the pixel PXL of FIG. 6 from which some components have been omitted. FIG. 8 is a schematic plan view illustrating a first sub-pixel SPX1 of FIG. 6. FIG. 9 is a schematic plan view illustrating the pixel PXL of FIG. 6 before alignment electrodes ALE are electrically separated from corresponding floating patterns FTP1, FTP2, and FTP3.

In FIGS. 6 to 9, not only the components included in the pixel PXL but also an area in which the components are provided (or located) may be embraced in the definition of the term "pixel PXL".

Referring to FIGS. 1 to 9, the pixel PXL may include at least one of a first sub-pixel SPX1, a second sub-pixel SPX2, and a third sub-pixel SPX3.

The first sub-pixel SPX1 may be located in a first sub-pixel area SPXA1 of the pixel area PXA. The second sub-pixel SPX2 may be located in a second sub-pixel area SPXA2 of the pixel area PXA. The third sub-pixel SPX3 may be located in a third sub-pixel area SPXA3 of the pixel area PXA.

Each of the first to third sub-pixel areas SPXA1, SPXA2, and SPXA3 may include or may be disposed in a first area A1 and a second area A2. For example, each of the first to third sub-pixel areas SPXA1, SPXA2, and SPXA3 may include the first area A1 and the second area A2 which are partitioned from each other in the second direction DR2. A pixel circuit PXC (or a pixel circuit component) of each of the first to third sub-pixels SPX1, SPX2, and SPX3 may be disposed in the first area A1. An emission component EMU of each of the first to third sub-pixels SPX1, SPX2, and SPX3 may be disposed in the second area A2. Furthermore, the second area A2 in which the emission component EMU is disposed may include an emission area of the corresponding sub-pixel. For example, the second area A2 of the first sub-pixel SPX1 may include a first emission area EMA1. The second area A2 of the second sub-pixel SPX2 may include a second emission area EMA2. The second area A2 of the third sub-pixel SPX3 may include a third emission area EMA3.

The pixel area PXA may include at least one of a non-emission area NEA that is adjacent to the first emission area EMA1 (or encloses the perimeter of the first emission area EMA1), a non-emission area NEA that is adjacent to the second emission area EMA2 (or encloses the perimeter of the second emission area EMA2), and a non-emission area NEA that is adjacent to the third emission area EMA3 (or encloses the perimeter of the third emission area EMA3).

Signal lines that are electrically connected to the pixel circuit PXC of each of the first to third sub-pixels SPX1, SPX2, and SPX3 may be disposed in the pixel area PXA. For example, an initialization power line IPL, data lines D1, D2, and D3, a power line PL, a scan line SC, and the like may be disposed in the pixel area PXA, but the disclosure is not limited thereto.

The scan line may be selectively supplied with a scan signal and a sensing control signal. The scan line SC may extend in a first direction DR1. The scan line SC may be formed of a fourth conductive layer C4. The fourth conductive layer C4 may be formed of a single layer or multiple layers, e.g., made of (or including) at least one of molybdenum (Mo), copper (Cu), aluminum (Al), chromium (Cr), gold (Au), silver (Ag), titanium (Ti), nickel (Ni), neodymium (Nd), indium (In), tin (Sn), and an oxide or alloy thereof.

The scan line SC may be electrically connected to a second transistor T2 included in the pixel circuit PXC of each of the first to third sub-pixels SPX1, SPX2, and SPX3 through a corresponding contact hole. For example, the scan line SC may be electrically connected to a second gate electrode GE2 of the second transistor T2 included in the pixel circuit PXC of the first sub-pixel SPX1, may be electrically connected to a second gate electrode GE2 of the second transistor T2 included in the pixel circuit PXC of the second sub-pixel SPX2, and may be electrically connected to a second gate electrode GE2 of the second transistor T2 included in the pixel circuit PXC of the third sub-pixel SPX3.

Furthermore, the scan line SC may be electrically connected to a third transistor T3 included in the pixel circuit PXC of each of the first to third sub-pixels SPX1, SPX2, and SPX3 through a corresponding contact hole. For example, the scan line SC may be electrically connected to a third gate electrode GE3 of the third transistor T3 included in the pixel circuit PXC of the first sub-pixel SPX1, may be electrically connected to a third gate electrode GE3 of the third transistor T3 included in the pixel circuit PXC of the second sub-pixel SPX2, and may be electrically connected to a third gate electrode GE3 of the third transistor T3 included in the pixel circuit PXC of the third sub-pixel SPX3.

The second gate electrodes GE2 and the third gate electrodes GE3 may be formed of a second conductive layer C2. The second conductive layer C2 and the fourth conductive layer C4 may include a same material. For example, the second conductive layer C2 may include one or more suitable (or selected) materials among materials that may be used to form the constituent material of the fourth conductive layer C4, e.g., as discussed herein, but the disclosure is not limited thereto.

The scan line SC may supply a scan signal to the second transistor T2 of the pixel circuit PXC of each of the first to third sub-pixels SPX1, SPX2, and SPX3 during a driving period of the light emitting elements LD, and may supply a sensing control signal to the third transistor T3 of the pixel circuit PXC of each of the first to third sub-pixels SPX1, SPX2, and SPX3 during a sensing period.

The data lines D1, D2, and D3 may include a first data line D1, a second data line D2, and a third data line D3 which extend in the second direction DR2 and are arranged in the first direction DR1. A data signal may be applied to each of the first to third data lines D1, D2, and D3.

The first data line D1 may be electrically connected to the second transistor T2 of the pixel circuit PXC of the first sub-pixel SPX1. The second data line D2 may be electrically connected to the second transistor T2 of the pixel circuit PXC of the second sub-pixel SPX2. The third data line D3 may be electrically connected to the second transistor T2 of the pixel circuit PXC of the third sub-pixel SPX3. Each of the first to third data lines D1, D2, and D3 may be formed of a first conductive layer C1. The first conductive layer C1 and the fourth conductive layer C4 may include a same material. For example, the first conductive layer C1 may include one or more suitable materials among materials that may be used to form the constituent material of the fourth conductive layer C4, e.g., as discussed herein, but the disclosure is not limited thereto.

The power line PL may include a first power line PL1 and a second power line PL2.

The first power line PL1 may be supplied with a voltage of the first driving power supply VDD. The first power line PL1 may include at least one of a first vertical power line PL1a, a first horizontal power line PL1b, and a first dummy power line PL1c.

The first vertical power line PL1a may extend in the second direction DR2, and may be formed of the first conductive layer C1. The first horizontal power line PL1b may extend in the first direction DR1, and may be formed of the fourth conductive layer C4. The first dummy power line PL1c may be formed of the fourth conductive layer C4, and may extend in the second direction DR2 and overlap the first vertical power line PL1a. The first dummy power line PL1c may be integral with the first horizontal power line PL1b. The first dummy power line PL1c may be an area of the first horizontal power line PL1b. In an embodiment, the first horizontal power line PL1b may be provided in a shape extending (or protruding) from the first dummy power line PL1c in the first direction DR1.

The first vertical power line PL1a formed of the first conductive layer C1 and the first dummy power line PL1c (or the first horizontal power line PL1b) formed of the fourth conductive layer C4 may be electrically connected to each other through a corresponding contact hole. Therefore, the first vertical power line PL1a, the first dummy power line PL1c, and the first horizontal power line PL1b may be electrically connected to each other. The first vertical power line PL1a, the first horizontal power line PL1b, and the first dummy power line PL1c that are electrically connected to each other may have a mesh structure.

The first dummy power line PL1c may be electrically connected, through a corresponding contact hole, to a first additional conductive pattern ACP1 disposed in or on a different layer. The first additional conductive pattern ACP1 may be formed of the second conductive layer C2 and extend in the second direction DR2 to overlap the first dummy power line PL1c. The first dummy power line PL1c may be electrically connected, through the corresponding contact hole, to the first additional conductive pattern ACP1 disposed in or on the different layer, thus forming a double-layer structure. Hence, line resistance of the first dummy power line PL1c may be reduced.

The second power line PL2 may be supplied with a voltage of the second driving power supply VSS. The second power line PL2 may include at least one of a second vertical power line PL2a, a second horizontal power line PL2b, and a second dummy power line PL2c.

The second vertical power line PL2a may extend in the second direction DR2, and may be formed of the first conductive layer C1. The second vertical power line PL2a may extend in the first direction DR1, and may be formed of the fourth conductive layer C4. The second dummy power line PL2c may be formed of the fourth conductive layer C4, and may extend in the second direction DR2 and overlap the second vertical power line PL2a. The second dummy power line PL2c may be integral with the second horizontal power line PL2b. The second dummy power line PL2c may be an area (or portion) of the second horizontal power line PL2b. In an embodiment, the second horizontal power line PL2b may be provided in a shape extending (or protruding) from the second dummy power line PL2c in the first direction DR1.

The second vertical power line PL2a formed of the first conductive layer C1 and the second dummy power line PL2c (or the second horizontal power line PL2b) formed of the fourth conductive layer C4 may be electrically connected to each other through a corresponding contact hole. Therefore, the second vertical power line PL2a, the second dummy power line PL2c, and the second horizontal power line PL2b may be electrically connected to each other. The second vertical power line PL2a, the second horizontal power line PL2b, and the second dummy power line PL2c that are electrically connected to each other may have a mesh structure.

The second dummy power line PL2c may be electrically connected, through a corresponding contact hole, to a second additional conductive pattern ACP2 disposed in a different layer. The second additional conductive pattern ACP2 may be formed of the second conductive layer C2 and extend in the second direction DR2 to overlap the second dummy power line PL2c. Because the second dummy power line PL2c is electrically connected, through the corresponding contact hole, to the second additional conductive pattern ACP2 located in the different layer, line resistance of the second dummy power line PL2c may be reduced.

Furthermore, the second vertical power line PL2a may be electrically connected, through a corresponding contact hole, to a dummy pattern DMP located in a different layer. The dummy pattern DMP may be formed of the fourth conductive layer C4, and may overlap an area of the second vertical power line PL2a. The dummy pattern DMP may be electrically connected, through a corresponding contact hole, to a third additional conductive pattern ACP3 located in a different layer. The third additional conductive pattern ACP3 may be formed of the second conductive layer C2, and may overlap the dummy pattern DMP. The second vertical power line PL2a may be electrically connected to the third additional conductive pattern ACP3 and the dummy pattern DMP that are disposed in the different layers, thus forming a multilayer structure. Hence, line resistance of the second vertical power line PL2a may be reduced.

The initialization power line IPL may extend in the second direction DR2. The initialization power line IPL may be located in each of the first to third sub-pixel areas SPXA1, SPXA2, and SPXA3, and may be disposed to be spaced apart from a corresponding data line. The initialization power line IPL may be formed of the first conductive layer C1. The initialization power line IPL may be the sensing line SENj described with reference to FIG. 5. The initialization power line IPL may be supplied with a voltage of the initialization power supply. The initialization power line IPL in each of the first to third sub-pixel areas SPXA1, SPXA2, and SPXA3 may be electrically connected, by a fourth connection pattern CNP4, to the third transistor T3 included in the pixel circuit PXC of each of the first to third sub-pixels SPX1, SPX2, and SPX3.

The fourth connection pattern CNP4 may be formed of the fourth conductive layer C4, and may be electrically connected to the initialization power line IPL through a corresponding contact hole. The fourth connection pattern CNP4 may be electrically connected to the third transistor T3 of each of the first to third sub-pixels SPX1, SPX2, and SPX3 through a corresponding contact hole.

The pixel circuit PXC of each of the first to third sub-pixels SPX1, SPX2, and SPX3 may include at least one of a first transistor T1, a second transistor T2, a third transistor T3, and a storage capacitor Cst.

The pixel circuit PXC of the first sub-pixel SPX1, the pixel circuit PXC of the second sub-pixel SPX2, and the pixel circuit PXC of the third sub-pixel SPX3 may have a substantially identical or similar structure. Hereinafter, the pixel circuit PXC of the first sub-pixel SPX1 will be described as a representative example. The description of the pixel circuit PXC of the first sub-pixel SPX1 may be applied to the pixel circuit PXC of the second sub-pixel SPX2 and the pixel circuit PXC of the third sub-pixel SPX3.

The pixel circuit PXC of the first sub-pixel SPX1 may be located in the first area A1 of the first sub-pixel area SPXA1. For example, the first to third transistors T1, T2, and T3 and the storage capacitor Cst may be located in the first area A1 of the first sub-pixel area SPXA1.

The first transistor T1 may include a first gate electrode GE1, a first active pattern ACT1, a first source electrode SE1, and a first drain electrode DE1.

The first gate electrode GE1 may be electrically connected to a first connection pattern CNP1 through a contact hole. The first gate electrode GE1 may be formed of the second conductive layer C2.

The first connection pattern CNP1 may be formed of the fourth conductive layer C4. A first end of the first connection pattern CNP1 may be electrically connected to the first gate electrode GE1 through a corresponding contact hole. A second end of the first connection pattern CNP1 may be electrically connected to the second source electrode SE2 through a corresponding contact hole. The first gate electrode GE1 and the second source area SE2 may be electrically connected to each other through the first connection pattern CNP1.

The first active pattern ACT1, the first source electrode SE1, and the first drain electrode DE1 each may be configured of a semiconductor pattern formed of poly silicon, amorphous silicon, an oxide semiconductor, or the like. Each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be doped with an impurity and have conductivity. The first active pattern ACT1 may be formed of (or formed as) an intrinsic semiconductor layer which is not doped with an impurity.

The first active pattern ACT1 may be located under the first gate electrode GE1 formed of the second conductive layer C2, and may overlap the first gate electrode GE1. The first active pattern ACT1 may form a channel area of the first transistor T1.

The first source electrode SE1 may be electrically connected to a first end of the first active pattern ACT1. The first source electrode SE1 may be doped with an impurity during an impurity doping process which is performed after the second conductive layer C2 is formed, and may thus have conductivity. The first source electrode SE1 may be electrically connected to a third connection pattern CNP3 through a corresponding contact hole.

The third connection pattern CNP3 may be formed of the fourth conductive layer C4. A first end of the third connection pattern CNP3 may be electrically connected to the first source electrode SE1 through a corresponding contact hole. A second end of the third connection pattern CNP3 may be electrically connected to a bottom metal pattern BML through a corresponding contact hole. Furthermore, the second end of the third connection pattern CNP3 may be electrically connected to a third source electrode SE3 of the third transistor T3 through a corresponding contact hole. The first source electrode SE1, the bottom metal pattern BML, and the third source electrode SE3 may be electrically connected to each other through the third connection pattern CNP3.

In an embodiment, the third connection pattern CNP3 may be electrically connected to the emission component EMU of the first sub-pixel SPX1 through a first contactor CNT1. For example, the third connection pattern CNP3 may be electrically connected to the first electrode PE1 through the first contactor CNT1.

The bottom metal layer BML may be formed of the first conductive layer C1. The bottom metal pattern BML may be electrically connected to the third connection pattern CNP3 through a corresponding contact hole. The bottom metal pattern BML may be electrically connected to the first source electrode SE1 by the third connection pattern CNP3. Hence, a driving range of a voltage to be supplied to the first gate electrode GE1 may be increased. Furthermore, because the bottom metal pattern BML is electrically connected to the first source electrode SE1, the bottom metal pattern BML may be prevented from floating. In an embodiment, the bottom metal pattern BML may extend from the first area A1 to the second area A2. The bottom metal pattern BML that extends to the second area A2 may be electrically connected to the upper electrode UE of the storage capacitor Cst through a corresponding contact hole. Hence, the bottom metal pattern BML and the upper electrode UE may be supplied with a same signal. The bottom metal pattern BML that extends to the second area A2 may overlap the lower electrode LE of the storage capacitor Cst so that the capacitance of the storage capacitor Cst may be further increased.

The first drain electrode DE1 may be electrically connected to a second end of the first active pattern ACT1. Furthermore, the first drain electrode DE1 may be electrically connected to the first horizontal power line PL1*b* through a corresponding contact hole.

The second transistor T2 may include a second gate electrode GE2, a second active pattern ACT2, a second source electrode SE2, and a second drain electrode DE2.

The second gate electrode GE2 may be electrically connected to the scan line SC through a corresponding contact hole. The second gate electrode GE2 may overlap the second active pattern ACT2.

The second active pattern ACT2, the second source electrode SE2, and the second drain electrode DE2 each may be configured of a semiconductor pattern formed of poly silicon, amorphous silicon, an oxide semiconductor, or the like. Each of the second source electrode SE2 and the second drain electrode DE2 may be doped with an impurity and have conductivity. The second active pattern ACT2 may be formed of an intrinsic semiconductor layer which is not doped with an impurity.

The second active pattern ACT2 may be located under the second gate electrode GE2 formed of the second conductive layer C2, and may overlap the second gate electrode GE2. The second active pattern ACT2 may form a channel area of the second transistor T2.

The second source electrode SE2 may be electrically connected to a first end of the second active pattern ACT2. The second source electrode SE2 may be doped with an impurity during an impurity doping process which is performed after the second conductive layer C2 is formed, and may thus have conductivity. The second source electrode SE2 may be electrically connected to the first connection pattern CNP1 through a corresponding contact hole.

The second drain electrode DE2 may be electrically connected to a second end of the second active pattern ACT2. The second drain electrode DE2 may be doped with an impurity during an impurity doping process which is performed after the second conductive layer C2 is formed, and may thus have conductivity. The second drain electrode DE2 may be electrically connected to a second connection pattern CNP2 through a corresponding contact hole.

The second connection pattern CNP2 may be formed of the fourth conductive layer C4. A first end of the second connection pattern CNP2 may be electrically connected to the second drain electrode DE2 through a corresponding contact hole. A second end of the second connection pattern CNP2 may be electrically connected, through a corresponding contact hole, to the first data line D1 formed of the first conductive layer C1. The second drain electrode DE2 and the first data line D1 may be electrically connected to each other by the second connection pattern CNP2.

The third transistor T3 may include a third gate electrode GE3, a third active pattern ACT3, a third source electrode SE3, and a third drain electrode DE3.

The third gate electrode GE3 may be electrically connected to the scan line SC through a corresponding contact hole. The third gate electrode GE3 may overlap the third active pattern ACT3.

The third active pattern ACT3, the third source electrode SE3, and the third drain electrode DE3 each may be configured of a semiconductor pattern formed of poly silicon, amorphous silicon, an oxide semiconductor, or the like. Each of the third source electrode SE3 and the third drain electrode DE3 may be doped with an impurity and have conductivity. The third active pattern ACT3 may be formed of an intrinsic semiconductor layer which is not doped with an impurity.

The third active pattern ACT3 may be located under the third gate electrode GE3 formed of the second conductive layer C2, and may overlap the third gate electrode GE3. The third active pattern ACT3 may form a channel area of the third transistor T3.

The third source electrode SE3 may be electrically connected to a first end of the third active pattern ACT3. The third source electrode SE3 may be doped with an impurity during an impurity doping process which is performed after the second conductive layer C2 is formed, and may thus have conductivity. The third source electrode SE3 may be electrically connected to the third connection pattern CNP3 through a corresponding contact hole.

The third drain electrode DE3 may be electrically connected to a second end of the third active pattern ACT3. The third drain electrode DE3 may be doped with an impurity during an impurity doping process which is performed after the second conductive layer C2 is formed, and may thus have conductivity. The third drain electrode DE3 may be electrically connected to the fourth connection pattern CNP4 through a corresponding contact hole.

The storage capacitor Cst may include the lower electrode LE and the upper electrode UE.

The lower electrode LE may be provided in a shape extending from the second source electrode SE2 to the second area A2. In an embodiment, the lower electrode LE may be integral with the second source electrode SE2. The lower electrode LE may be configured of a semiconductor pattern formed of poly silicon, amorphous silicon, an oxide semiconductor, or the like, and may have conductivity after having been doped with an impurity.

The upper electrode UE may be formed of the fourth conductive layer C4, and may extend in the second direction DR2 in the second area A2. The upper electrode UE may be disposed to overlap the lower electrode LE, and may be electrically connected to the bottom metal pattern BML through a corresponding contact hole. The upper electrode UE may be electrically connected to the first electrode PE1 of the emission component EMU through the third connection pattern CNP3 that is electrically connected to the bottom metal pattern BML.

The emission component EMU of each of the first to third sub-pixels SPX1, SPX2, and SPX3 may include light emitting elements LD located in the second area A2 of the corresponding sub-pixel. Furthermore, the emission component EMU of each of the first to third sub-pixels SPX1, SPX2, and SPX3 may include at least one of an electrode PE, an intermediate electrode CTE, and an alignment electrode ALE which are electrically connected to the light emitting elements LD. A first bank BNK1 may be disposed in a non-emission area NEA of each of the first to third sub-pixels SPX1, SPX2, and SPX3.

The first bank BNK1 may be a pixel defining layer as a structure which defines (or partitions) the first, second, and third emission areas EMA1, EMA2, and EMA3. For example, the first bank BNK1 may be a structure which defines the emission area of each of adjacent sub-pixels PXL. The first bank BNK1 may define a supply position of light emitting elements LD during a process of supplying (or inputting) the light emitting elements LD to each of the first to third sub-pixels SPX1, SPX2, and SPX3. For example, because the first to third emission areas EMA1, EMA2, and EMA3 are partitioned (or defined) by the first bank BNK1, a mixed solution (e.g., ink) including a target amount and/or type of light emitting elements LD may be supplied (or inputted) to a corresponding emission area. In an embodiment, the first bank BNK1 may include at least one light block material and/or reflective material (or scattering material), thus preventing a light leakage defect in which light (or rays) leaks between adjacent sub-pixels. In an embodiment, the first bank BNK1 may include transparent material (or substance). The transparent material may include, for example, polyamides resin, polyimides resin, and the like, but the disclosure is not limited thereto. In an embodiment, to enhance the efficiency of light emitted from each of the first to third sub-pixels SPX1, SPX2, and SPX3, a separate reflective layer may be provided and/or formed on the first bank BNK1.

The first bank BNK1 may include, in the pixel area PXA, an opening OP through which components disposed thereunder are exposed. In an embodiment, each of the first to third emission areas EMA1, EMA2, and EMA3 may correspond to the opening OP of the first bank BNK1.

Since the first bank BNK1 is disposed in the non-emission area NEA between the first to third emission areas EMA1, EMA2, and EMA3, a supply (or input) area of the pixel area PXA to which light emitting elements LD are to be supplied (or inputted) may be determined. Hence, at the step of supplying light emitting elements LD to the pixel PXL, the light emitting elements LD may be prevented from being supplied to undesired areas, and the light emitting elements LD may be efficiently supplied to each of the first to third emission areas EMA1, EMA2, and EMA3. Hence, the light emitting elements LD may be prevented from being unnecessarily wasted. Thus, the manufacturing cost of the display device DD (or the pixel PXL) may be reduced.

An electrode separation area ESA may be disposed in a non-emission area NEA of each of the first to third sub-pixels SPX1, SPX2, and SPX3. The electrode separation area ESA may be an area in which the alignment electrode ALE is separated from the corresponding floating pattern in each of the first to third sub-pixels SPX1, SPX2, and SPX3.

The emission component EMU of the first sub-pixel SPX1, the emission component EMU of the second sub-pixel SPX2, and the emission component EMU of the third sub-pixel SPX3 may have a substantially identical or similar structure. Hereinafter, the emission component EMU of the first sub-pixel SPX1 will be described as a representative example. The description of the emission component EMU of the first sub-pixel SPX1 may be applied to the emission component EMU of the second sub-pixel SPX2 and the emission component EMU of the third sub-pixel SPX3.

The emission component EMU of the first sub-pixel SPX1 may include at least one of an electrode PE and an intermediate electrode CTE disposed in at least the first emission area EMA1, light emitting elements LD electrically connected to the electrode PE and the intermediate electrode CTE, and an alignment electrode ALE provided at a position corresponding to the electrode PE and the intermediate electrode CTE. For example, the emission component EMU of the first sub-pixel SPX1 may include a first electrode PE1 (or a first pixel electrode), a second electrode PE2 (or a second pixel electrode), an intermediate electrode CTE (or a bridge electrode), light emitting elements LD, and first to third alignment electrodes ALE1, ALE2, and ALE3 which are disposed in at least the first emission area EMA1. The electrode PE, the intermediate electrode CTE, and/or the alignment electrodes ALE each may be changed in number, shape, size, arrangement structure, and the like in various ways depending on the structure of the first sub-pixel SPX1.

In an embodiment, based on a surface of the substrate SUB on which the first sub-pixel SPX1 is provided, the alignment electrodes ALE, the light emitting elements LD, the electrode PE, and/or the intermediate electrode CTE may be provided in the order listed, but the disclosure is not limited thereto. The positions and formation sequence of electrode patterns that form the emission component EMU may be changed in various ways. Descriptions of a stacked structure (or a cross-sectional structure) of the first sub-pixel SPX1 will be provided below with reference to FIGS. 10 to 15.

The alignment electrodes ALE may be disposed in at least the first emission area EMA1, and be spaced apart from each other in the first direction DR1 in the first emission area EMA1, and each may extend in the second direction DR2. In an embodiment, the alignment electrodes ALE may include at least one of the third alignment electrode ALE3, the first alignment electrode ALE1, and the second alignment electrode ALE2 which are arranged to be spaced apart from each other in the first direction DR1.

Each of the first to third alignment electrodes ALE1, ALE2, and ALE3 may be separated from the corresponding power line PL by removing a portion thereof after the light emitting elements LD are aligned in the first emission area EMA1 during the process of fabricating the display device DD (or the pixel PXL). For example, the first alignment electrode ALE1 may be electrically separated from the second horizontal power line PL2*b* by removing an area of the first alignment electrode ALE1 that is located in the electrode separation area ESA after the light emitting elements LD are aligned in the first emission area EMA1. The second alignment electrode ALE2 may be electrically separated from the first horizontal power line PL1*b* by removing an area of the second alignment electrode ALE2 that is located in the electrode separation area ESA after the light emitting elements LD are supplied and aligned in the first emission area EMA1. The third alignment electrode ALE3 may be electrically separated from the first horizontal power line PL1*b* by removing an area of the third alignment electrode ALE3 that is located in the electrode separation area ESA after the light emitting elements LD are supplied and aligned in the first emission area EMA1.

The first alignment electrode ALE1 may be formed to be integrally connected to (or integral with) a first floating pattern FTP1 during the process of fabricating the display device DD (or the pixel PXL), thus forming a first alignment line ALL1, as illustrated in FIG. 9. The first floating pattern FTP1 may be electrically connected to the second horizontal power line PL2*b* through a first contact hole CH1. During a process of aligning the light emitting elements LD, a first alignment signal may be supplied to the first alignment line ALL1 through the second horizontal power line PL2*b*. After the process of aligning the light emitting elements LD has been completed, a portion of the first alignment line ALL1 around the first contact hole CH1 located in the non-emission area NEA may be removed (or the first alignment line ALL1 may be cut off), whereby the electrical connection between the first alignment line ALL1 and the second horizontal power line PL2*b* may be interrupted. For example, the first alignment line ALL1 may be divided into the first alignment electrode ALE1 and the first floating pattern FTP1 by cutting off the first alignment line ALL1 in the electrode separation area ESA located around the first floating pattern FTP1.

The second alignment electrode ALE2 may be formed to be integrally connected to (or integral with) a second floating pattern FTP2 during the process of fabricating the display device DD, thus forming a second alignment line ALL2, as illustrated in FIG. 9. The second floating pattern FTP2 may be electrically connected to the first horizontal power line PL1*b* through a second contact hole CH2. During the process of aligning the light emitting elements LD, a second alignment signal may be supplied to the second alignment line ALL2 through the first horizontal power line PL1*b*. After the process of aligning the light emitting elements LD has been completed, a portion of the second alignment line ALL2 around the second contact hole CH2 located in the non-emission area NEA may be removed (or the second alignment line ALL2 may be cut off), whereby the electrical connection between the second alignment line ALL2 and the first horizontal power line PL1*b* may be interrupted. For example, the second alignment line ALL2 may be divided into the second alignment electrode ALE2 and the second floating pattern FTP2 by cutting off the second alignment line ALL2 in the electrode separation area ESA located around the second floating pattern FTP2.

The third alignment electrode ALE3 may be formed to be integrally connected (or integral with) to a third floating pattern FTP3 during the process of fabricating the display device DD, thus forming a third alignment line ALL3, as illustrated in FIG. 9. The third floating pattern FTP3 may be electrically connected to the first horizontal power line PL1*b* through a third contact hole CH3. During the process of aligning the light emitting elements LD, a second alignment signal may be supplied to the third alignment line ALL3 through the first horizontal power line PL1*b*. After the process of aligning the light emitting elements LD has been completed, a portion of the third alignment line ALL3 around the third contact hole CH3 located in the non-emission area NEA may be removed (or the third alignment line ALL3 may be cut off), whereby the electrical connection between the third alignment line ALL3 and the first horizontal power line PL1*b* may be interrupted. For example, the third alignment line ALL3 may be divided into the third alignment electrode ALE3 and the third floating pattern FTP3 by cutting off the third alignment line ALL3 in the electrode separation area ESA located around the third floating pattern FTP3.

The foregoing first and second alignment signals may be signals each having a voltage difference and/or a phase difference enabling the light emitting elements LD to be aligned between the first to third alignment lines ALL1, ALL2, and ALL3. At least one of the first and second alignment signals may be an AC signal, but the disclosure is not limited thereto.

In an embodiment, the first to third alignment electrodes ALE1, ALE2, and ALE3 and the first to third floating patterns FTP1, FTP2, and FTP3 may be formed of a third conductive layer C3. For example, the third conductive layer C3 may be a conductive layer located between the second conductive layer C2 and the fourth conductive layer C4 among the conductive layers formed on the substrate SUB. In the first emission area EMA1 located in the second area A2, other conductive layers, e.g., the first and second conductive layers C1 and C2 and a semiconductor pattern having conductivity, may not be located under the first to third alignment electrodes ALE1, ALE2, and ALE3.

In a plan view, the third alignment electrode ALE3, the first alignment electrode ALE1, and the second alignment electrode ALE2 may be arranged in the order listed in the first direction DR1 in the first emission area EMA1. The third alignment electrode ALE3 and the second alignment electrode ALE2 may face each other with the first alignment electrode ALE1 interposed therebetween.

Each of the first to third alignment electrodes ALE1, ALE2, and ALE3 may be provided in the form of a bar having a constant width in at least the first emission area EMA1, but the disclosure is not limited thereto.

In an embodiment, each of the first to third alignment electrodes ALE1, ALE2, and ALE3 may float rather than being electrically connected to any electrode. During a process of driving the light emitting elements LD, an electrical effect of the first to third alignment electrodes ALE1, ALE2, and ALE3 on the first and second electrodes PE1 and PE2 and the intermediate electrode CTE may be reduced or prevented.

Although at least two to several tens of light emitting elements LD may be aligned and/or provided in the first emission area EMA1 (or the first sub-pixel area SPXA1), the number of light emitting elements LD is not limited thereto.

The light emitting elements LD may be disposed between the first alignment electrode ALE1 and the second alignment electrode ALE2 and between the first alignment electrode ALE1 and the third alignment electrode ALE3. In a plan view, each of the light emitting elements LD may include a first end EP1 and a second end EP2 which are located (or face each other) on respective opposite ends of the light emitting element LD in the longitudinal direction thereof, e.g., in the first direction DR1. In an embodiment, the second semiconductor layer 13 including a p-type semiconductor layer may be disposed on the first end EP1 (or the p-type end), and the first semiconductor layer 11 including an n-type semiconductor layer may be disposed on the second end EP2 (or the n-type end). The light emitting elements LD may be electrically connected in parallel to each other between the first alignment electrode ALE1 and the second alignment electrode ALE2 and between the first alignment electrode ALE1 and the third alignment electrode ALE3.

The light emitting elements LD may be disposed at positions spaced apart from each other and aligned in substantially parallel to each other. A distance by which the light emitting elements LD are spaced apart from each other is not particularly limited. In an embodiment, light emitting elements LD may be disposed adjacent to each other to form a group, and additional light emitting elements LD may be spaced apart from each other at regular intervals to form a group. The light emitting elements LD may be aligned in a direction with an uneven density.

The light emitting elements LD may be inputted (or supplied) to the first emission area EMA1 (or the opening OP of the first bank BNK1) by an inkjet printing scheme, a slit coating scheme, or other various schemes. For example, the light emitting elements LD may be mixed with a volatile solvent and then input (or supplied) to the first emission area EMA1 by an inkjet printing scheme or a slit coating scheme.

The light emitting elements LD may include a first light emitting element LD1 and a second light emitting element LD2.

The first light emitting element LD1 may be aligned between a first side (e.g., the right side) of the first alignment electrode ALE1 and the second alignment electrode ALE2 and electrically connected to the first electrode PE1 and the intermediate electrode CTE. The second light emitting element LD2 may be aligned between a second side (e.g., the left side) of the first alignment electrode ALE1 and the third alignment electrode ALE3 and electrically connected to the intermediate electrode CTE and the second electrode PE2.

First light emitting elements LD1 and second light emitting elements LD2 may be provided. The first end EP1 of each of the first light emitting elements LD1 may be electrically connected to the first electrode PE1. The second end EP2 of each of the first light emitting elements LD1 may be electrically connected to the intermediate electrode CTE. The first end EP1 of each of the second light emitting elements LD2 may be electrically connected to the intermediate electrode CTE. The second end EP2 of each of the second light emitting elements LD2 may be electrically connected to the second electrode PE2.

The first light emitting elements LD1 may be electrically connected in parallel to each other between the first electrode PE1 and the intermediate electrode CTE. The second light emitting elements LD2 may be electrically connected in parallel to each other between the intermediate electrode CTE and the second electrode PE2.

The electrodes PE and the intermediate electrode CTE may be provided in at least the first emission area EMA1, and each may be provided at a position corresponding to at least one alignment electrode ALE and at least one light emitting element LD. For example, each electrode PE and each intermediate electrode CTE may be formed on the corresponding alignment electrodes ALE and the corresponding light emitting elements LD to overlap the alignment electrodes ALE and the light emitting elements LD, and thus may be electrically connected to at least the light emitting elements LD.

The electrodes PE may include a first electrode PE1 and a second electrode PE2 which are spaced apart from each other.

The first electrode PE1 (which may be referred to as "first pixel electrode" or "anode" herein) may be formed on the first side of the first alignment electrode ALE1 and the respective first ends EP1 of the first light emitting elements LD1, and thus may be electrically connected to the respective first ends EP1 of the first light emitting elements LD1. The first electrode PE1 may have a bar shape having a constant width in an extension direction thereof, e.g., the second direction DR2.

The second electrode PE2 (which may be referred to as "second pixel electrode" or "cathode" herein) may be formed on the third alignment electrode ALE3 and the respective second ends EP2 of the second light emitting elements LD2, and thus may be electrically connected to the respective second ends EP2 of the second light emitting elements LD2. The second electrode PE2 may have a bar shape having a constant width in an extension direction thereof, e.g., the second direction DR2.

The intermediate electrode CTE may be formed on the second alignment electrode ALE2 and the respective second ends EP2 of the first light emitting elements LD1, and thus may be electrically connected to the respective second end EP2 of the first light emitting elements LD1. Furthermore, the intermediate electrode CTE may be formed on the second side of the first alignment electrode ALE1 and the respective first ends EP1 of the second light emitting elements LD2, and thus may be electrically connected to the respective first ends EP1 of the second light emitting elements LD2. To this end, the intermediate electrode CTE may have a bent shape. For example, the intermediate electrode CTE may have a bent or curved structure on a boundary between an area in which at least one first light emitting element LD1 is disposed and an area in which at least one second light emitting element LD2 is disposed.

The first electrode PE1, the intermediate electrode CTE, and the second electrode PE2 may be disposed to be spaced apart from each other in the first emission area EMA1. The first electrode PE1, the intermediate electrode CTE, and the second electrode PE2 may be formed of a fifth conductive layer C5.

In the foregoing scheme, the light emitting elements LD may be electrically connected to each other in a desired shape by using the first electrode PE1, the intermediate electrode CTE, and the second electrode PE2. For example, the first light emitting elements LD1 and the second light emitting elements LD2 may be successively electrically connected in series to each other by using the first electrode PE1, the intermediate electrode CTE, and the second electrode PE2.

In an embodiment, the first electrode PE1 may extend to the first area A1 and be electrically connected to the third connection pattern CNP3 through the first contactor CNT1. The first contactor CNT1 may be formed by opening (e.g., removing) a portion of at least one insulating layer disposed between the first electrode PE1 formed of the fifth conductive layer C5 and the third connection pattern CNP3 formed of the fourth conductive layer C4. A portion of the third connection pattern CNP3 may be exposed through the first contactor CNT1.

In an embodiment, the second electrode PE2 may be integrally formed (or integral) with a bridge line BRL disposed between pixels PXL of different rows. The bridge line BRL may be formed of the fifth conductive layer C5.

The bridge line BRL may extend in the first direction DR1 and be integrally formed with and connected to the second electrode PE2. Furthermore, the bridge line BRL may be integrally formed with the second electrode PE2 of each of the second and third pixels SPX2 and SPX3. The second electrode PE2 of each of the first to third sub-pixels SPX1, SPX2, and SPX3 may diverge from the bridge line BRL in the second direction DR2 and extend to the second area A2 of a corresponding sub-pixel. Because the bridge line BRL and the second electrode PE2 of each of the first to third sub-pixels SPX1, SPX2, and SPX3 are electrically connected to each other, the second electrode PE2 of the first sub-pixel SPX1, the second electrode PE2 of the second sub-pixel SPX2, and the second electrode PE2 of the third sub-pixel SPX3 may be electrically connected to each other.

The bridge line BRL may include, in the non-emission area NEA between the second sub-pixel SPX2 and the third sub-pixel SPX3, a protrusion part PRP protruding to the first area A1 in the second direction DR2. The protrusion part PRP may be integral with the bridge line BRL and be an area of the bridge line BRL. The protrusion part PRP may be electrically connected to the third additional conductive pattern ACP3 through a second contactor CNT2. The second contactor CNT2 may be formed by opening a portion of at least one insulating layer located between the protrusion part PRP (or the bridge line BRL) formed of the fifth conductive layer C5 and the third additional conductive pattern ACP3 formed of the second conductive layer C2. A portion of the third additional conductive pattern ACP3 may be exposed through the second contactor CNT2.

As described above, because the third additional conductive pattern ACP3 is electrically connected to the second vertical power line PL2a through the dummy pattern DMP, the protrusion part PRP (or the bridge line BRL) may be electrically connected to the second vertical power line PL2a. Hence, the second electrode PE2 of each of the first to third sub-pixels SPX1, SPX2, and SPX3 may be electrically connected to the second vertical power line PL2a and thus electrically connected to the second driving power line VSS.

In an embodiment, the first electrode PE1 may be an anode of the emission component EMU of the first sub-pixel SPX1. The second electrode PE2 may be a cathode of the emission component EMU.

Hereinafter, the stacked structure (or the cross-sectional structure) of the first sub-pixel SPX1 in accordance with the foregoing embodiment will be described with reference to FIGS. 10 to 15.

Figure 10:
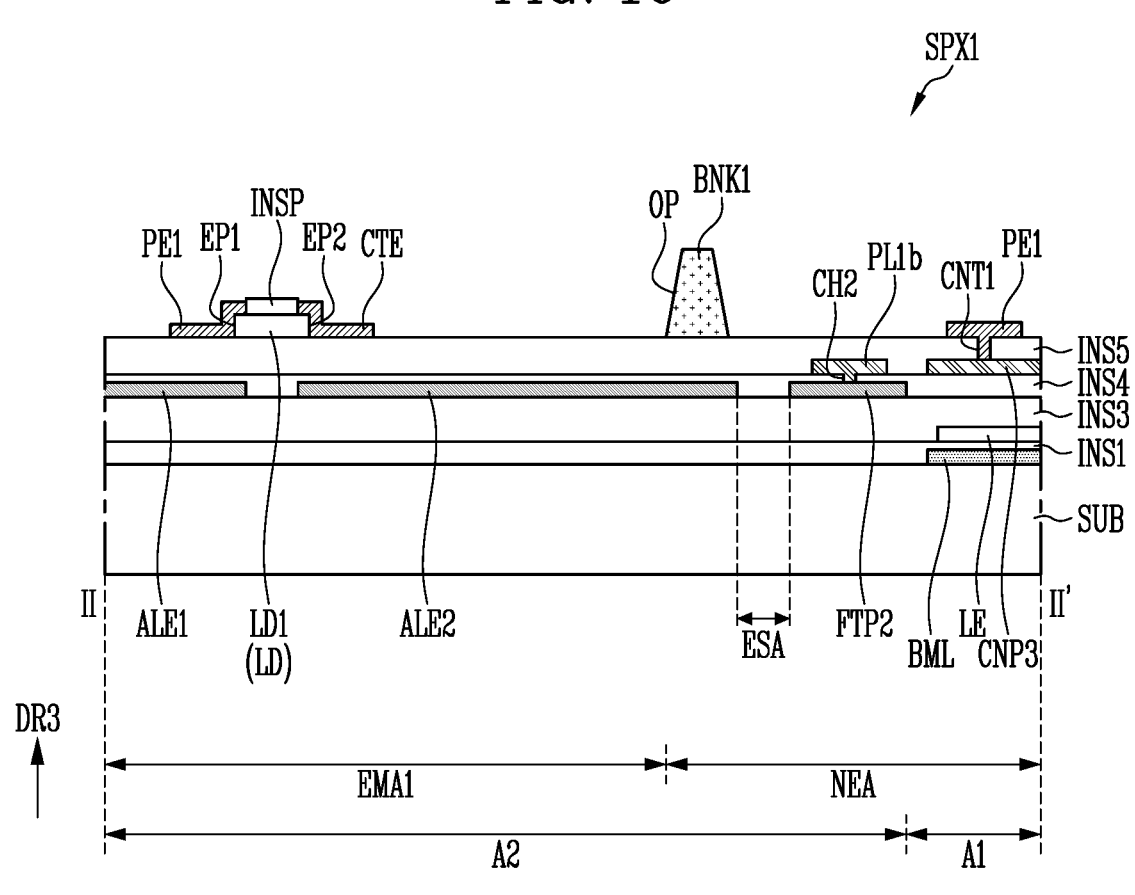
FIG. 10 is a schematic cross-sectional view taken along line II-II' of FIG. 8.

FIG. 10 is a schematic cross-sectional view taken along line II-II' of FIG. 8. FIGS. 11 to 14 are schematic cross-sectional views taken along line of FIG. 8. FIG. 15 is a schematic cross-sectional diagram taken along line IV-IV' of FIG. 8.

Figure 11:
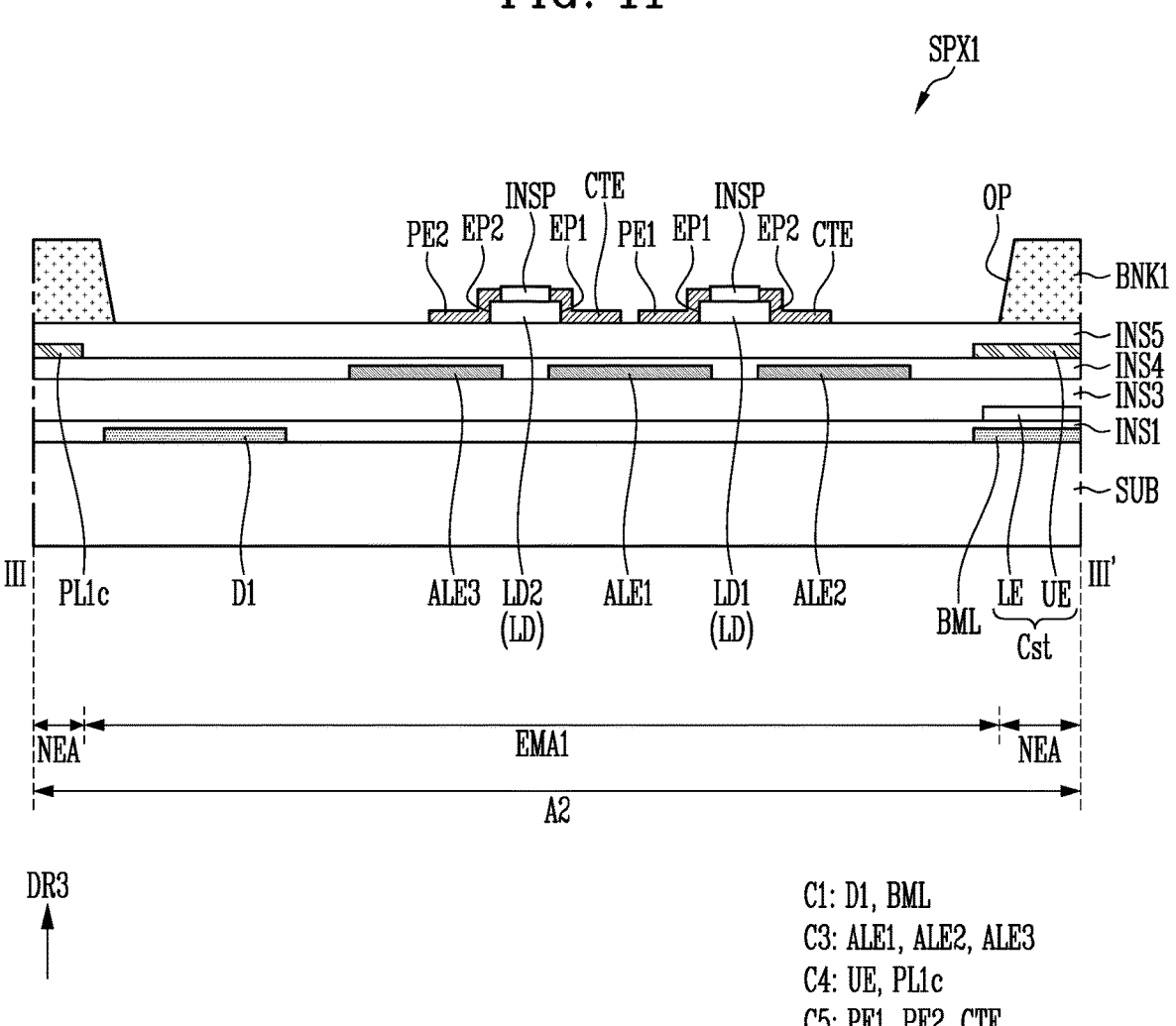
FIGS. 11 to 14 are schematic cross-sectional views taken along line of FIG. 8.
Figure 12:
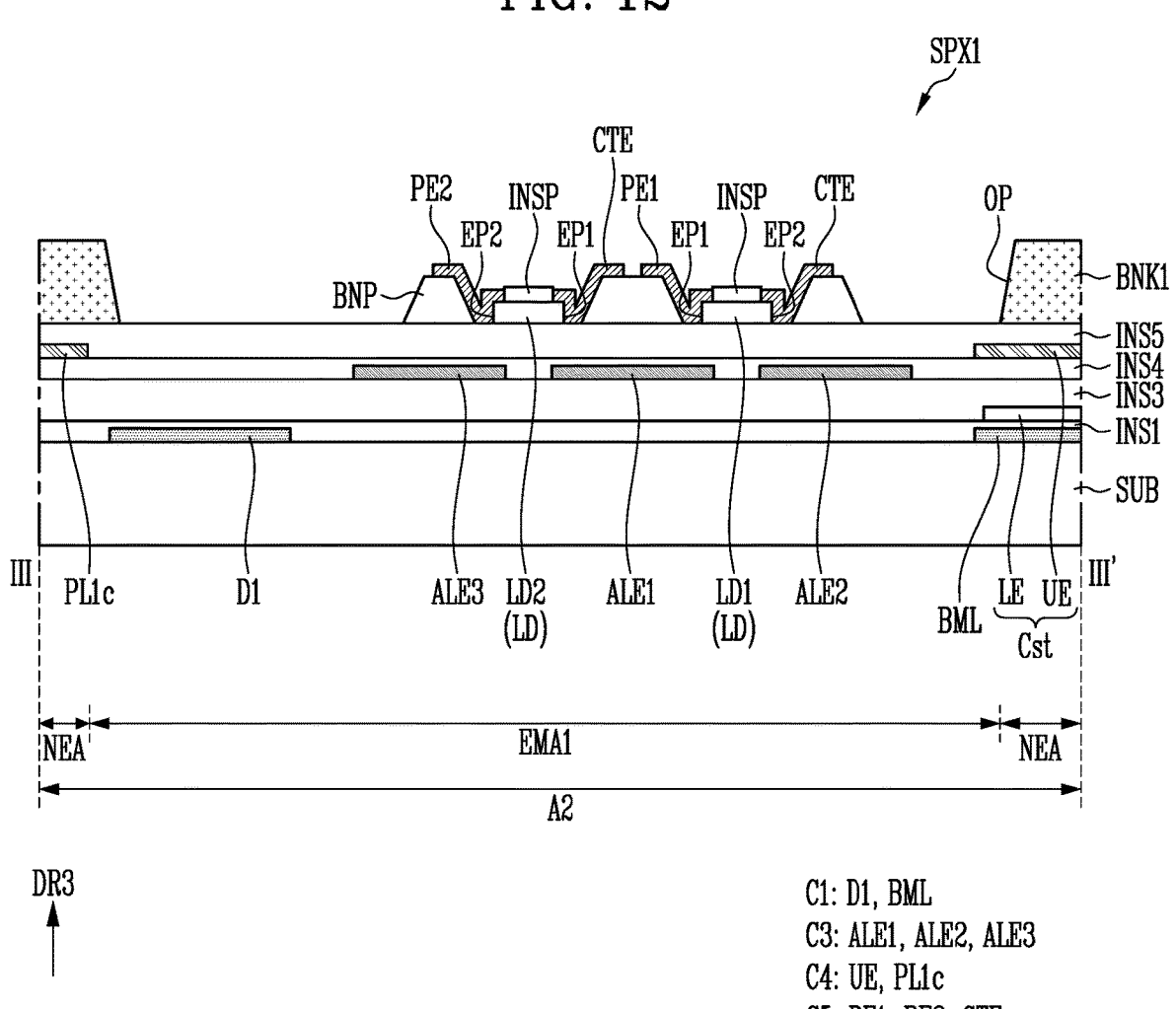

An embodiment of FIG. 12 refers to a modification of an embodiment of FIG. 11 pertaining to the presence or absence of a bank pattern BNP.

Figure 13:
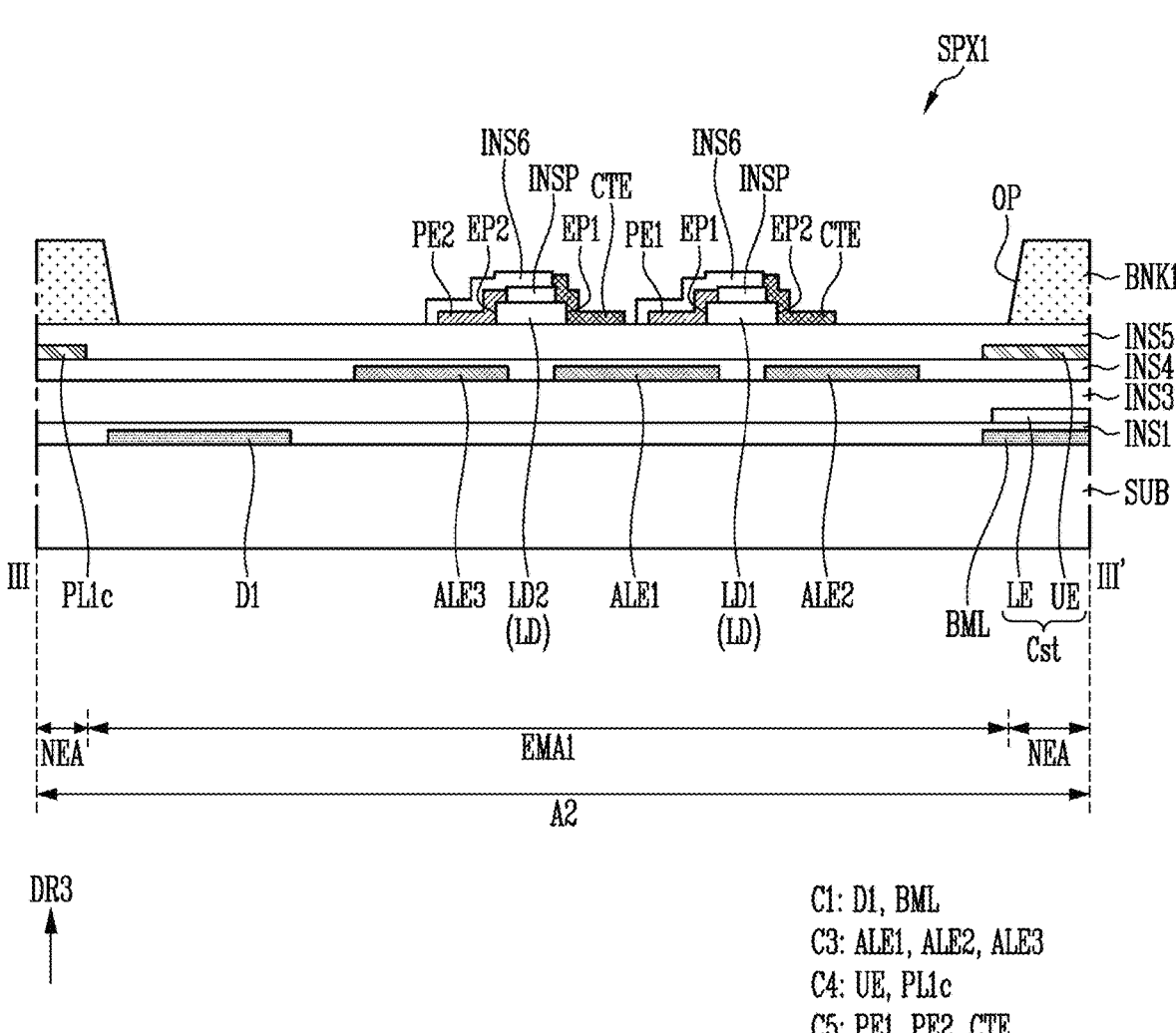
Figure 14:
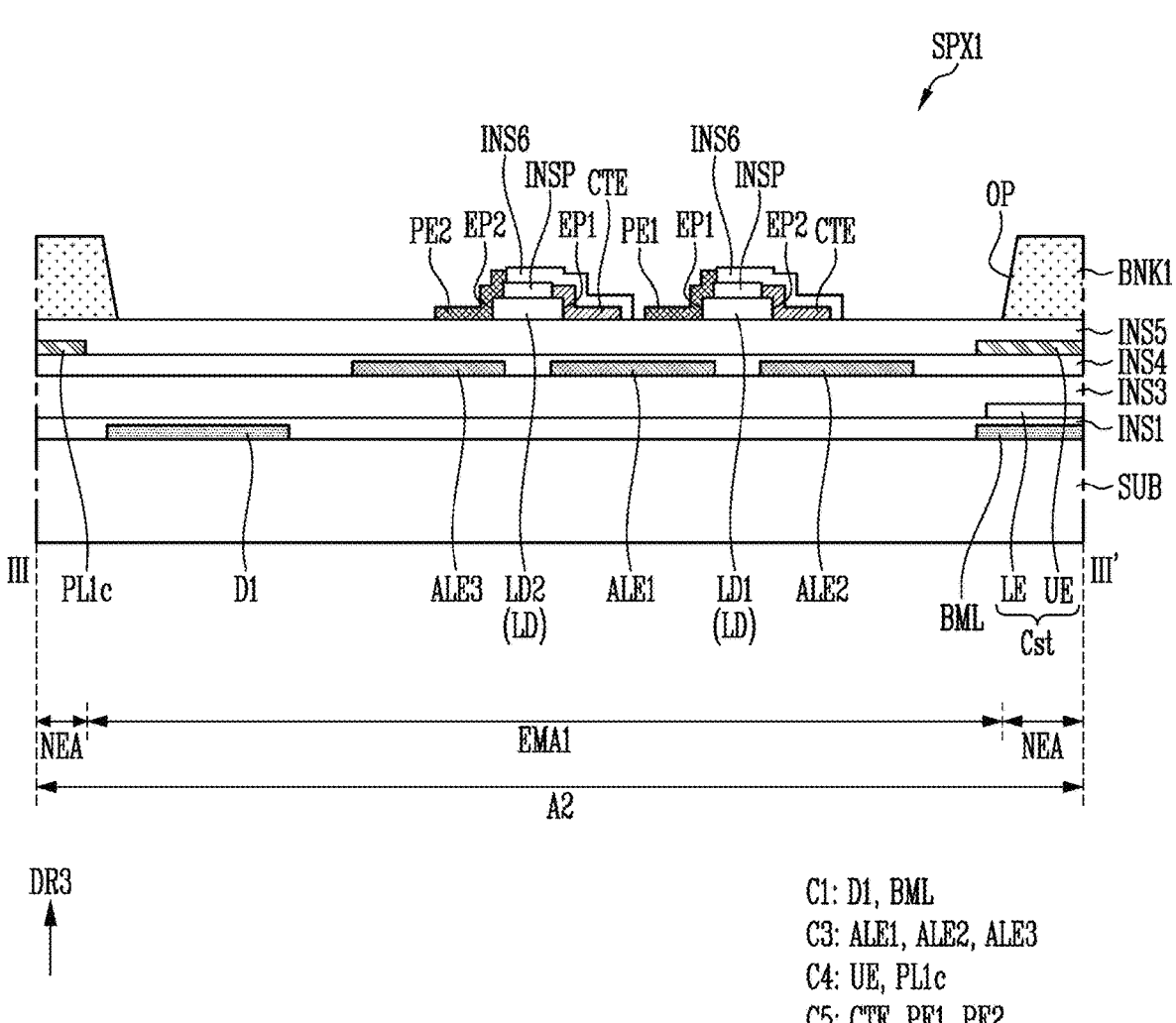
Figure 15:
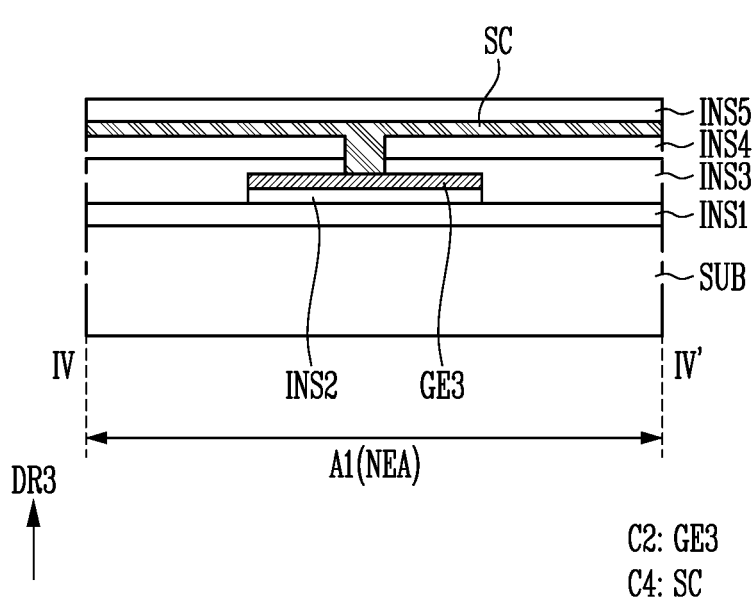
FIG. 15 is a schematic cross-sectional view taken along line IV-IV' of FIG. 8.

Embodiments of FIGS. 13 and 14 refer to modifications of the embodiment of FIG. 11 pertaining both to the step of forming the first and second electrodes PE1 and PE2 and the intermediate electrode CTE and to the presence or absence of a sixth insulating layer INS6. For example, FIG. 13 illustrates an embodiment in which the intermediate electrode CTE is formed after the first and second electrodes PE1 and PE2 and the sixth insulating layer INS6 are formed. FIG. 14 illustrates an embodiment in which the first and second electrodes PE1 and PE2 are formed after the intermediate electrode CTE and the sixth insulating layer INS6 are formed.

Although FIGS. 10 to 15 schematically illustrate the stacked structure (or the cross-sectional structure) of the first sub-pixel SPX1, e.g., illustrating that each electrode is formed of a single-layered electrode and each insulating layer is formed of a single insulating layer, the disclosure is not limited thereto.

The following description related to embodiments of FIGS. 10 to 15 will be focused on differences from the above-mentioned embodiments so as to avoid redundant description.

Referring to FIGS. 1 to 15, the first sub-pixel SPX1 in accordance with an embodiment may be located in a first sub-pixel area SPXA1 provided in the display device DD or the substrate SUB. The first sub-pixel area SPXA1 may include a first area A1 and a second area A2.

Circuit elements (e.g., transistors T1, T2, and T3) for forming the pixel circuit PXC of the first sub-pixel SPX1, and signal lines electrically connected to the circuit elements PXC may be disposed in the first area A1.

A light-emitting-element layer LDL that forms the emission component EMU of the first sub-pixel SPX1, and signal lines provided in the first area A1 may be disposed in the second area A2. The second area A2 may include the first emission area EMA1 from which light may be emitted.

At least one or more insulating layers may be disposed on the substrate SUB. For example, a first insulating layer INS1, a second insulating layer INS2, a third insulating layer INS3, a fourth insulating layer INS4, and a fifth insulating layer INS5 which are successively stacked each other in the third direction DR3 may be disposed on the substrate SUB. In an embodiment, a sixth insulating layer INS6 may be selectively disposed on the fifth insulating layer INS5.

At least one or more conductive layers may be disposed on the substrate SUB. For example, the conductive layers may include at least one of a first conductive layer C1 disposed on the substrate SUB, a second conductive layer C2 disposed on the second insulating layer INS2, a third conductive layer C3 disposed on the third insulating layer INS3, a fourth conductive layer C4 disposed on the fourth insulating layer INS4, and a fifth conductive layer C5 disposed on the fifth insulating layer INS5.

The first conductive layer C1 may include at least one of the first vertical power line PL1a, the second vertical power line PL2a, the initialization power line IPL, the first to third data lines D1, D2, and D3, and the bottom metal pattern BML. The second conductive layer C2 may include at least one of the first to third gate electrodes GE1, GE2, and GE3, and the first to third additional conductive patterns ACP1, ACP2, and ACP3. The third conductive layer C3 may include at least one of the first to third alignment electrodes ALE1, ALE2, and ALE3 and the first to third floating patterns FTP1, FTP2, and FTP3. The fourth conductive layer C4 may include at least one of the first horizontal power line PL1b, the first dummy power line PL1c, the second horizontal power line PL2b, the second dummy power line PL2c, the first to fourth connection patterns CNP1, CNP2, CNP3, and CNP4, the upper electrode UE, the dummy pattern DMP, and the scan line SC. The fifth conductive layer C5 may include at least one of the first electrode PE1, the second electrode PE2, the intermediate electrode CTE, the bridge line BRL, and the protrusion part PRP.

The substrate SUB may include transparent insulating material to allow light transmission. The substrate SUB may be a rigid substrate or a flexible substrate.

The first insulating layer INS1 (or a buffer layer) may be disposed on the overall surface of the substrate SUB. The first insulating layer INS1 may prevent impurities from diffusing into the transistors T1, T2, and T3 included in the pixel circuit PXC. The first insulating layer INS1 may be an inorganic insulating layer including inorganic material. The first insulating layer INS1 may include at least one of silicon nitride ($SiN_x$), silicon oxide ($SiO_x$), and silicon oxynitride ($SiO_xN_y$), or at least one of metal oxides such as aluminum oxide ($AlO_x$). The first insulating layer INS1 may have a single-layer structure. As another example, the first insulating layer INS1 may have a multilayer structure having at least two or more layers. In case that the first buffer layer BFL1 has a multi-layer structure, the respective layers may be formed of a same material or different materials. The first insulating layer INS1 may be omitted depending on the material of the substrate SUB or processing conditions.

The second insulating layer INS2 (or a gate insulating layer) may be partially disposed on the first insulating layer INS1. For example, the second insulating layer INS2 may be disposed under only the second conductive layer C2, and the second insulating layer INS2 and the second conductive layer C2 may have a same width. The second insulating layer INS2 and first insulating layer INS1 may include a same material, or the second insulating layer INS2 may include suitable (or selected) materials among materials that may be used to form the constituent material of the first insulating layer INS1, e.g., as discussed herein. For example, the second insulating layer INS2 may be formed of an inorganic insulating layer including inorganic material.

The third insulating layer INS3 (or an interlayer insulating layer) may be provided and/or formed on the overall surfaces of the first insulating layer INS1 and the second conductive layer C2. The third insulating layer INS3 and the first insulating layer INS1 may include a same material, or the third insulating layer INS3 may include one or more suitable (or selected) materials among materials that may be used to form the constituent material of the first insulating layer INS1, e.g., as discussed herein. For example, the third insulating layer INS3 may be formed of an inorganic insulating layer including inorganic material.

The fourth insulating layer INS4 (or a passivation layer) may be provided and/or formed on the overall surface of the third insulating layer INS3. The fourth insulating layer INS4 and the first insulating layer INS1 may include a same material, or the fourth insulating layer INS4 may include one or more suitable (or selected) materials among materials that may be used to form the constituent material of the first insulating layer INS1, e.g., as discussed herein. For example, the fourth insulating layer INS4 may be formed of an inorganic insulating layer including inorganic material.

The pixel circuit PXC may include first to third transistors T1, T2, and T3 and a storage capacitor Cst which are disposed on the first insulating layer INS1.

The first transistor T1 may include a first active pattern ACT1, a first source electrode SE1, and a first drain electrode DE1 which are disposed on the first insulating layer INS1, and a first gate electrode GE1 disposed on the second insulating layer INS2. The bottom metal pattern BML may be disposed under the first transistor T1. The bottom metal pattern BML may be formed of the first conductive layer C1 located between the substrate SUB and the first insulating layer INS1.

The second transistor T2 may include a second active pattern ACT2, a second source electrode SE2, and a second drain electrode DE2 which are disposed on the first insulating layer INS1, and a second gate electrode GE2 disposed on the second insulating layer INS2.

The third transistor T3 may include a third active pattern ACT3, a third source electrode SE3, and a third drain electrode DE3 which are disposed on the first insulating layer INS1, and a third gate electrode GE3 disposed on the second insulating layer INS2.

The first to third gate electrodes GE1, GE2, and GE3 may be formed of the second conductive layer C2.

The storage capacitor Cst may include a lower electrode LE disposed on the first insulating layer INS1, and an upper electrode UE disposed on the fourth insulating layer INS4. The lower electrode LE may be integral with the second source electrode SE2 and electrically connected to the second source electrode SE2, and may thus have conductivity. The upper electrode UE may be formed of the fourth conductive layer C4, and may be electrically connected to the bottom metal pattern BML through a corresponding contact hole that passes through the fourth insulating layer INS4, the third insulating layer INS3, and the first insulating layer INS1.

In an embodiment, the first to third transistors T1, T2, and T3 and the storage capacitor Cst which form the pixel circuit PXC of the first sub-pixel SPX1 may include conductive patterns which are formed of the first conductive layer C1, the second conductive layer C2, and the fourth conductive layer C4.

The fifth insulating layer INS5 may be provided and/or formed on the pixel circuit PXC.

The fifth insulating layer INS5 (or a via layer) may be provided and/or formed on the overall surface of the fourth insulating layer INS4. The fifth insulating layer INS5 may be an inorganic insulating layer including inorganic material or an organic insulating layer including organic material. The inorganic insulating layer may include, for example, at least one of silicon nitride ($SiN_x$), silicon oxide ($SiO_x$), silicon oxynitride ($SiO_xN_y$), and aluminum oxide ($AlO_x$). The organic insulating layer may include, for example, at least one of polyacrylic resin, epoxy resin, phenolic resin, polyamide resin, polyimide rein, unsaturated polyester resin, poly-phenylen ether resin, poly-phenylene sulfide resin, and benzocyclobutene resin. In an embodiment, the fifth insulating layer INS5 may be formed of an organic insulating layer.

The emission component EMU may include at least one of first to third alignment electrodes ALE1, ALE2, and ALE3, first to third floating patterns FTP1, FTP2, and FTP3, and light emitting elements LD which are disposed on the third insulating layer INS3, and first and second electrodes PE1 and PE2 and/or an intermediate electrode CTE which are disposed on the fifth insulating layer INS5.

The first to third alignment electrodes ALE1, ALE2, and ALE3 may be located in the first emission area EAM1 of the second area A2 and disposed on the third insulating layer INS3. The first to third alignment electrodes ALE1, ALE2, and ALE3 may be formed of the third conductive layer C3.

The first to third alignment electrodes ALE1, ALE2, and ALE3 may be disposed on a same plane, and have a same thickness in the third direction DR3. The first to third alignment electrodes ALE1, ALE2, and ALE3 may be simultaneously formed through a same process, or may be successively formed.

The first to third alignment electrodes ALE1, ALE2, and ALE3 may be formed of material having a reflectivity to allow light emitted from the light emitting elements LD to travel in an image display direction (or a frontal direction) of the display device DD. For example, the first to third alignment electrodes ALE1, ALE2, and ALE3 may be formed of conductive material (or substance). The conductive material may include opaque metal that is suitable for reflecting, in the image display direction of the display device DD, light emitted from the light emitting elements LD.

Each of the first to third alignment electrodes ALE1, ALE2, and ALE3 may have a single-layer structure, but is not limited thereto. In an embodiment, each of the first to third alignment electrodes ALE1, ALE2, and ALE3 may be provided and/or formed in a multilayer structure formed by stacking at least two or more materials among metals, alloys, conductive oxides, and conductive polymers on each other.

In case that the first to third alignment electrodes ALE1, ALE2, and ALE3 are formed of conductive material having a reflectivity, light emitted from the first and second ends EP1 and EP2 of each of the light emitting elements LD may more reliably travel in the image display direction of the display device DD.

In an embodiment, in the first emission area EMA1 (or the second area A2) in which the first to third alignment electrodes ALE1, ALE2, and ALE3 are disposed, another conductive layer may not be disposed under the first to third alignment electrodes ALE1, ALE2, and ALE3. For example, conductive patterns, e.g., the first and second conductive layers C1 and C2 and semiconductor patterns having conductivity, other than the first to third insulating layers INS1, INS2, and INS3 formed of inorganic insulating layers, may not be disposed under the first to third alignment electrodes ALE1, ALE2, and ALE3. Hence, in the first emission area EMA1 (or the second area A2), each of the first to third alignment electrodes ALE1, ALE2, and ALE3 may not be affected by a step difference (or height difference) which may be caused by components located thereunder, thus having an even surface.

In an embodiment, the first to third floating patterns FTP1, FTP2, and FTP3, which are formed of the third conductive layer C3 disposed on the third insulating layer INS3 may be disposed in the second area A2. The first floating pattern FTP1 may be disposed to be spaced apart from the first alignment electrode ALE1 with the electrode separation area ESA interposed therebetween. The second floating pattern FTP2 may be disposed to be spaced apart from the second alignment electrode ALE2 with the electrode separation area ESA interposed therebetween. The third floating pattern FTP3 may be disposed to be spaced apart from the third alignment electrode ALE3 with the electrode separation area ESA interposed therebetween.

The fourth insulating layer INS4 may be provided and/or formed on the first to third alignment electrodes ALE1, ALE2, and ALE3 and the first to third floating patterns FTP1, FTP2, FTP3. For example, the first to third alignment electrodes ALE1, ALE2, and ALE3 and the first to third floating patterns FTP1, FTP2, FTP3 may be covered with the fourth insulating layer INS4.

In an embodiment, the first floating pattern FTP1 may be electrically connected to the second horizontal power line PL2b which is formed of the fourth conductive layer C4 disposed on the fourth insulating layer INS4. For example, the first floating pattern FTP1 may be electrically connected to the second horizontal power line PL2b through the first contact hole CH1 that passes through the fourth insulating layer INS4.

The second floating pattern FTP2 may be electrically connected to the first horizontal power line PL1b which is formed of the fourth conductive layer C4 disposed on the fourth insulating layer INS4. For example, the second floating pattern FTP2 may be electrically connected to the first horizontal power line PL1b through the second contact hole CH2 that passes through the fourth insulating layer INS4.

The third floating pattern FTP3 may be electrically connected to the first horizontal power line PL1b which is formed of the fourth conductive layer C4 disposed on the fourth insulating layer INS4. For example, the third floating pattern FTP3 may be electrically connected to the first horizontal power line PL1b through the third contact hole CH3 that passes through the fourth insulating layer INS4.

The fifth insulating layer INS5 may be disposed on the fourth insulating layer INS4.

The first bank BNK1 may be disposed on the fifth insulating layer INS5 in the non-emission area NEA of the second area A2.

The first bank BNK1 may be disposed on the fifth insulating layer INS5 in at least the second area A2, but the disclosure is not limited thereto. The first bank BNK1 may be formed between adjacent sub-pixels to enclose the first emission area EMA1, so that a pixel defining layer for partitioning (or defining) the first emission area EMA1 may be formed. At the step of supplying the light emitting elements LD to the first emission area EMA1, the first bank BNK1 may be a dam structure configured to prevent a solution (or ink) mixed with the light emitting elements LD from being introduced into the second or third emission areas EMA2 or EMA3 or control the amount of a solution such that the amount of the solution is supplied to each of the first to third emission areas EMA1, EMA2, and EMA3.

In an embodiment, as illustrated in FIG. 12, the bank pattern BNP may be disposed in the first emission area EMA1.

The bank pattern BNP may be disposed on the fifth insulating layer INS5, and may protrude in the third direction DR3 on a surface of the fifth insulating layer INS5. The bank pattern BNP may include an inorganic insulating layer including inorganic material and/or an organic insulating layer including organic material. In an embodiment, the bank pattern BNP may include an organic insulating layer having a single-layer structure and/or an inorganic insulating layer having a single-layer structure, but the disclosure is not limited thereto. In an embodiment, the bank pattern BNP may be provided in a multilayer structure formed by stacking one or more organic insulating layers and one or more inorganic insulating layers on each other. However, the material of the bank pattern BNP is not limited to the foregoing embodiment. In an embodiment, the bank pattern BNP may include conductive material (or substance). In this case, the bank pattern BNP may be used as a reflector. For example, the bank pattern BNP may be used as a reflector configured to guide light emitted from the light emitting element LD in the image display direction of the display device DD, thus enhancing the light output efficiency of the first sub-pixel SPX1.

The bank pattern BNP may be located over each of the first to third alignment electrodes ALE1, ALE2, and ALE3 in at least the first emission area EMA1 and may overlap the corresponding alignment electrode ALE. The first light emitting element LD1 may be aligned on the fifth insulating layer INS5 between the bank pattern BNP on the first alignment electrode ALE1 and the bank pattern BNP on the second alignment electrode ALE2. The second light emitting element LD2 may be aligned on the fifth insulating layer INS5 between the bank pattern BNP on the first alignment electrode ALE1 and the bank pattern BNP on the third alignment electrode ALE3. The bank pattern BNP may be a structure for accurately defining (or providing) an alignment position of the light emitting elements LD in the first emission area EMA1.

The first bank BNK1 and the bank pattern BNP may be formed through (or by) different processes and provided in different layers, but the disclosure is not limited thereto. In an embodiment, the first bank BNK1 and the bank pattern BNP may be formed through different processes and provided in a same layer, or may be formed through a same process and provided in a same layer.

In the second area A2, the light emitting elements LD may be aligned (or disposed) in the first emission area EMA1 in which the fifth insulating layer INS5 and the first bank BNK1 are formed. For example, the light emitting elements LD may be supplied (or inputted) to the first emission area EMA1 through an inkjet printing scheme or the like. The light emitting elements LD may be aligned between the first to third alignment electrodes ALE1, ALE2, and ALE3 by an electric field formed by signals (or alignment signals) which are respectively applied to the first to third alignment electrodes ALE1, ALE2, and ALE3. For example, the light emitting elements LD may be aligned on the fifth insulating layer INS5 between the first alignment electrode ALE1 and the second alignment electrode AEL2 and on the fifth insulating layer INS5 between the first alignment electrode ALE1 and the third alignment electrode ALE3.

The first light emitting element LD1 may be arranged between the first side (or the right side) of the first alignment electrode ALE1 and the second alignment electrode ALE2. The first light emitting element LD1 may include a first end EP1 that overlaps the first alignment electrode ALE1, and a second end EP2 that overlaps the second alignment electrode ALE2.

The second light emitting element LD2 may be arranged between the second side (or the left side) of the first alignment electrode ALE1 and the third alignment electrode ALE3. The second light emitting element LD2 may include a first end EP1 that overlaps the first alignment electrode ALE1, and a second end EP2 that overlaps the third alignment electrode ALE3.

An insulating pattern INSP may be disposed on the first and second light emitting elements LD1 and LD2. The insulating pattern INSP may be disposed on each of the first and second light emitting elements LD1 and LD2, and partially cover an outer circumferential surface (or a surface) of each of the first and second light emitting elements LD1 and LD2 so that the first end EP1 and the second end EP2 of each of the first and second light emitting elements LD1 and LD2 may be exposed to the outside.

The insulating pattern INSP may include an inorganic insulating layer including inorganic material and/or an organic insulating layer. For example, the insulating pattern INSP may include an inorganic insulating layer suitable for protecting the active layer 12 of each of the first and second light emitting elements LD1 and LD2 from external oxygen, water, or the like. However, the disclosure is not limited thereto. The insulating pattern INSP may be formed of an organic insulating layer including organic material, depending on design conditions and the like of the display device DD (or the display panel DP) to which the first and second light emitting elements LD1 and LD2 are applied. The insulating pattern INSP may be formed of a single layer or multiple layers.

Because the insulating pattern INSP is formed on the light emitting elements LD that have been aligned (e.g., completely aligned) in the first emission area EMA1, the light emitting elements LD may be prevented from being removed from the aligned positions.

Different electrodes among the first electrode PE1, the second electrode PE2, and the intermediate electrode CTE may be formed on the first and second ends EP1 and EP2 of the light emitting elements LD that are not covered with the insulating pattern INSP. For example, the first electrode PE1 may be formed on the first end EP1 of the first light emitting element LD1. The intermediate electrode CTE may be formed on the second end EP2 of the first light emitting element LD1. The intermediate electrode CTE may be formed on the first end EP1 of the second light emitting element LD2. The second electrode PE2 may be formed on the second end EP2 of the second light emitting element LD2.

In an embodiment, the first electrode PE1, the intermediate electrode CTE, and the second electrode PE2 may be formed in a same layer or different layers. For example, relative positions and/or a formation sequence of the first electrode PE1, the intermediate electrode CTE, and the second electrode PE2 may be changed in various ways depending on the embodiment.

In an embodiment of FIGS. 11 and 12, the first electrode PE1, the second electrode PE2, and the intermediate electrode CTE may be simultaneously formed with the corresponding insulating pattern INSP interposed therebetween. For example, the first electrode PE1 may be located adjacent to a first side surface (e.g., a left side surface) of the insulating pattern INSP on the first light emitting element LD1. The intermediate electrode CTE may be located adjacent to a second side surface (e.g., a right side surface) of the insulating pattern INSP. The second electrode PE2 may be located adjacent to a first side surface (e.g., a left side surface) of the insulating pattern INSP on the second light emitting element LD2. The intermediate electrode CTE may be located adjacent to a second side surface (e.g., a right side surface) of the insulating pattern INSP. The first electrode PE1 may directly contact the first end EP1 of the first light emitting element LD1 and be electrically connected to the first light emitting element LD1. The intermediate electrode CTE may directly contact each of the second end EP2 of the first light emitting element LD1 and the first end EP1 of the second light emitting element LD2 and may thus be electrically connected to each of the first and second light emitting elements LD1 and LD2. The second electrode PE2 may directly contact the second end EP2 of the second light emitting element LD2 and may be electrically connected to the second light emitting element LD2. In an embodiment of FIGS. 11 and 12, in case that the first electrode PE1, the second electrode PE2, and the intermediate electrode CTE are disposed in a same layer and are simultaneously formed, a process of fabricating the first sub-pixel SPX1 (or the display device DD) may be simplified, and the fabrication efficiency thereof may be enhanced.

In an embodiment of FIG. 13, the first and second electrodes PE1 and PE2 may be first formed on the insulating pattern INSP. The first electrode PE1 may directly contact the first end EP1 of the first light emitting element LD1 and/or may be electrically connected to the first light emitting element LD1. The second electrode PE2 may directly contact the second end EP2 of the second light emitting element LD2 and/or may be electrically connected to the second light emitting element LD2. The sixth insulating layer INS6 may be formed to cover the first and second electrodes PE1 and PE2. The sixth insulating layer INS6 may be located on the first and second electrodes PE1 and PE2 and may cover the first and second electrodes PE1 and PE2 (or prevent the first and second electrodes PE1 and PE2 from being exposed), thus protecting the first and second electrodes PE1 and PE2.

The sixth insulating layer INS6 may be formed of an inorganic insulating layer including inorganic material, or an organic insulating layer including organic material. The sixth insulating layer INS6 may be formed of a single layer or multiple layers.

The intermediate electrode CTE may be formed on the sixth insulating layer INS6. The intermediate electrode CTE may directly contact the second end EP2 of the first light emitting element LD1 and the first end EP1 of the second light emitting element LD2 and may thus be electrically connected between the first light emitting element LD1 and the second light emitting element LD2.

In an embodiment of FIG. 14, the intermediate electrode CTE may be first formed on the insulating pattern INSP.

Thereafter, the sixth insulating layer INS6 may be formed to cover the intermediate electrode CTE. The first and second electrodes PE1 and PE2 may be formed in the first emission area EMA1 in which the sixth insulating layer INS6 has been formed.

As illustrated in the embodiments of FIGS. 13 and 14, in case that the electrodes that are disposed on the first end EP1 and the second end EP2 of each light emitting element LD are disposed in or on different layers, the electrodes may be reliably electrically separated from each other, so that electrical stability between the first and second ends EP1 and EP2 of the light emitting elements LD can be secured.

Each of the first electrode PE1, the second electrode PE2, and the intermediate electrode CTE may be formed of various transparent conductive materials. For example, each of the first electrode PE1, the second electrode PE2, and the intermediate electrode CTE may include at least one of various transparent conductive materials including, e.g., indium tin oxide, indium zinc oxide, indium tin zinc oxide, aluminum zinc oxide, gallium zinc oxide, zinc tin oxide, and gallium tin oxide, and may be substantially transparent or translucent to provide satisfactory transmittance. Hence, light emitted from the first and second ends EP1 and EP2 of the light emitting elements LD may pass through the electrodes PE and the intermediate electrode CTE and may be emitted out of the display device DD (or the display panel DP).

At least one overcoat layer may be further disposed over the electrodes PE and the intermediate electrode CTE.

In an embodiment, an optical layer LCL may be selectively disposed on the first electrode PE1, the second electrode PE2, and the intermediate electrode CTE. For example, the optical layer LCL may include at least one of a color conversion layer and a color filter layer which may convert light emitted from the light emitting elements LD to light having excellent color reproducibility and emit the converted light. Detailed descriptions of the optical layer LCL will be provided below with reference to FIGS. 25 and 26.

As described above, each of the first sub-pixel area SPXA1 in which the first sub-pixel SPX1 is disposed, the second sub-pixel area SPXA2 in which the second sub-pixel SPX2 is disposed, and the third sub-pixel area SPXA3 in which the third sub-pixel SPX3 is disposed may be partitioned into the first area A1 in which the pixel circuit PXC is disposed, and the second area A2 in which the emission component EMU is disposed. In the foregoing embodiment, each of the first to third alignment electrodes ALE1, ALE2, and ALE3 that form the emission component EMU may be formed of the third conductive layer C3 disposed on the third insulating layer INS3. In each of at least the first to third emission areas EMA1, EMA2, and EMA3, additional conductive patterns, except the first to third insulating layers INS1, INS2, and INS3 including inorganic insulating layers, may not be disposed under the first to third alignment electrodes ALE1, ALE2, and ALE3. For example, the additional conductive patterns may include at least one of electrode patterns and signal lines which are formed of the first conductive layer C1, electrode patterns which are formed of the second conductive layer C2, and semiconductor patterns having conductivity. In each of at least the first to third emission areas EMA1, EMA2, and EMA3, the first to third insulating layers INS1, INS2, and INS3 may have uniform profiles because the conductive patterns are not disposed therein, and thus may have even surfaces. Because the first to third alignment electrodes ALE1, ALE2, and ALE3 are disposed on the first to third insulating layers INS1, INS2, and INS3 each having an even surface, the first to third alignment electrodes ALE1, ALE2, and ALE3 can be prevented from being affected by a step difference (or height difference) formed by the components disposed thereunder, so that the step coverage of the first to third alignment electrodes ALE1, ALE2, and ALE3 can be improved.

Because the step coverage of the first to third alignment electrodes ALE1, ALE2, and ALE3 are improved, the alignment of the light emitting elements LD that are aligned on the first to third alignment electrodes ALE1, ALE2, and ALE3 may be enhanced. The number of light emitting elements LD which can be used as valid light sources in each of the first to third sub-pixels SPX1, SPX2, and SPX3 may be increased, so that the light output efficiency of each of the first to third sub-pixels ALE1, ALE2, and ALE3 may be enhanced.

Because the step coverage of the first to third alignment electrodes ALE1, ALE2, and ALE3 are improved, the reliability of the components, e.g., the light emitting elements LD, the first and second electrodes PE1 and PE2, and the intermediate electrode CTE, which are disposed over the first to third alignment electrodes ALE1, ALE2, and ALE3, may be enhanced.

According to the foregoing embodiment, the light emitting elements LD may be intensively aligned in a desired area, e.g., the second area A2 of each of the first to third sub-pixels SPX1, SPX2, and SPX3, so that alignment distribution of the light emitting elements LD in each sub-pixel and alignment distribution of the light emitting elements LD in adjacent sub-pixels may be uniform. The display device DD may have uniform light output distribution in the overall area thereof, whereby the reliability thereof may be enhanced.

Figure 16:
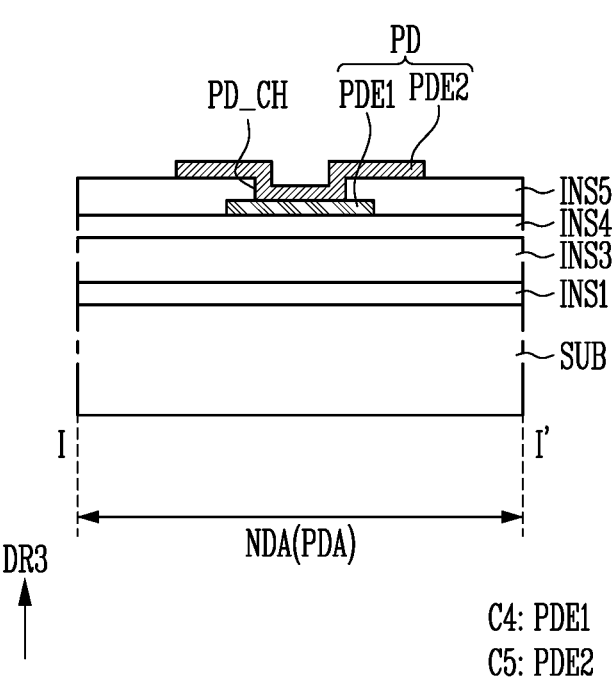
FIG. 16 is a schematic cross-sectional view taken along line I-I' of FIG. 3.
Figure 17:
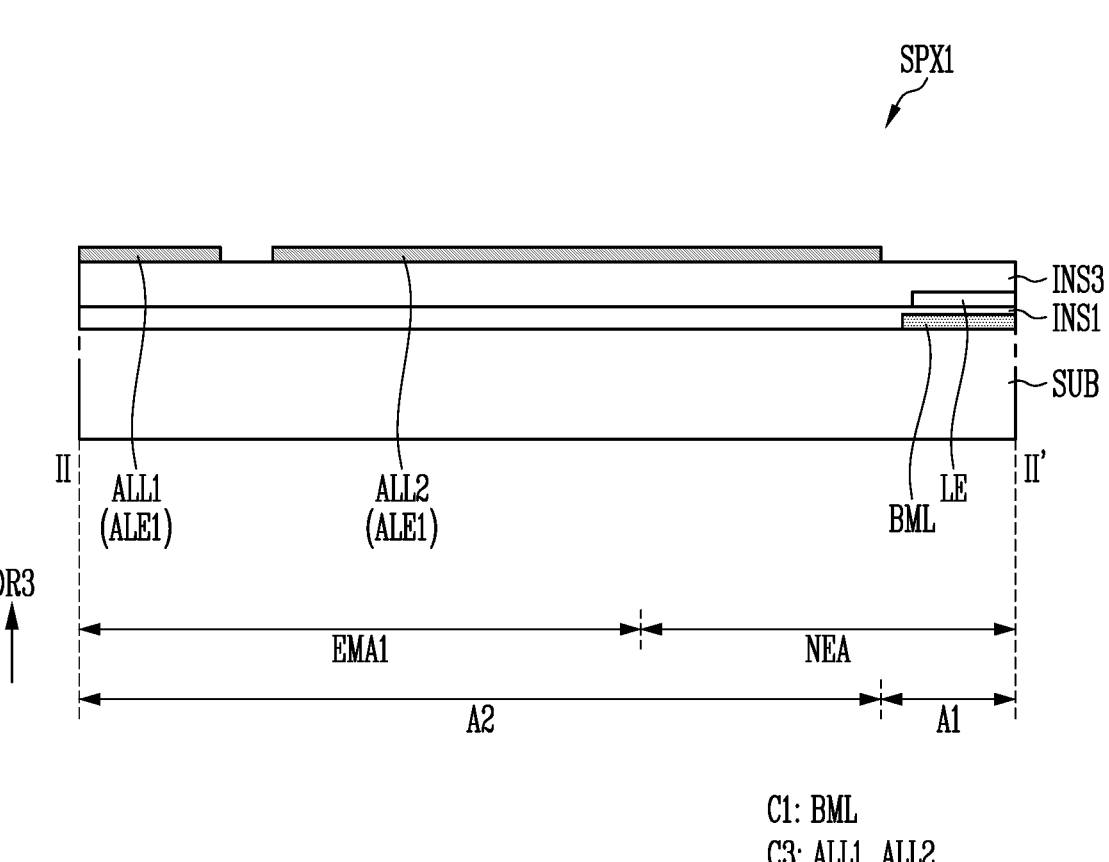
FIGS. 17 to 24 are diagrams for describing a method of fabricating the first sub-pixel in accordance with an embodiment, and are schematic cross-sectional views corresponding to line II-II' of FIG. 8.
Figure 18:
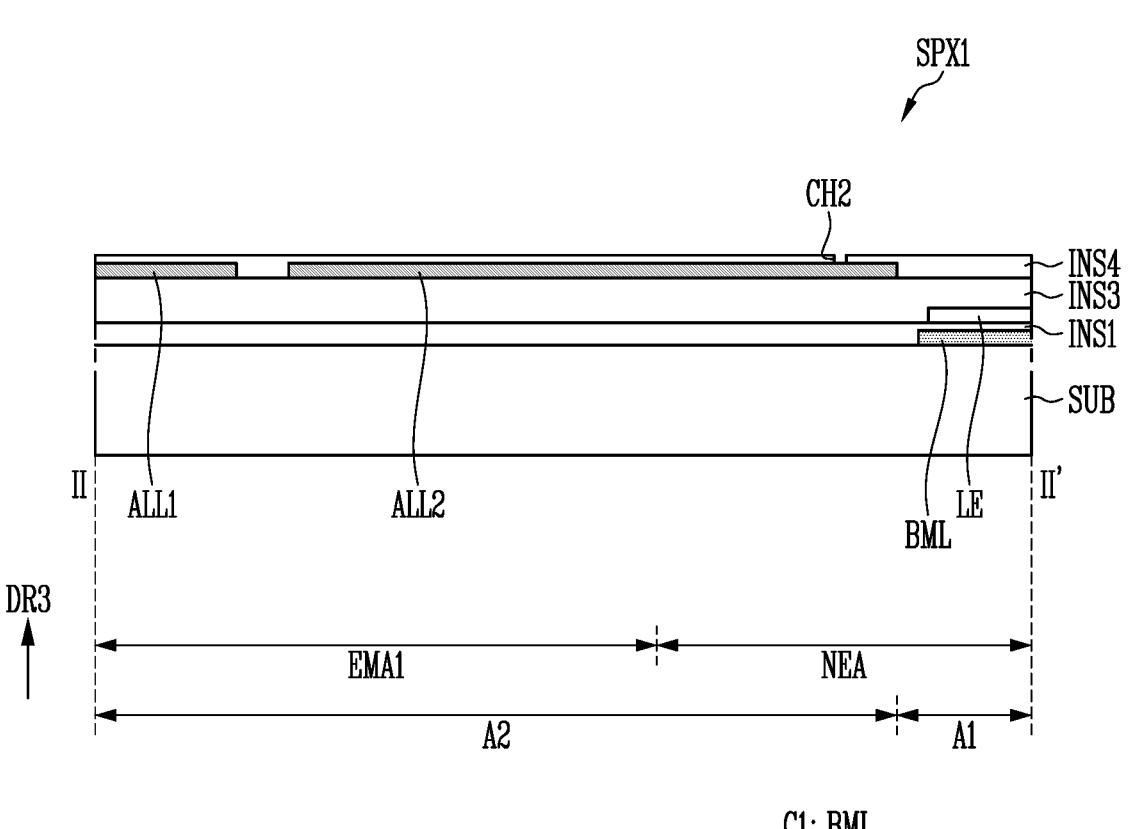
Figure 19:
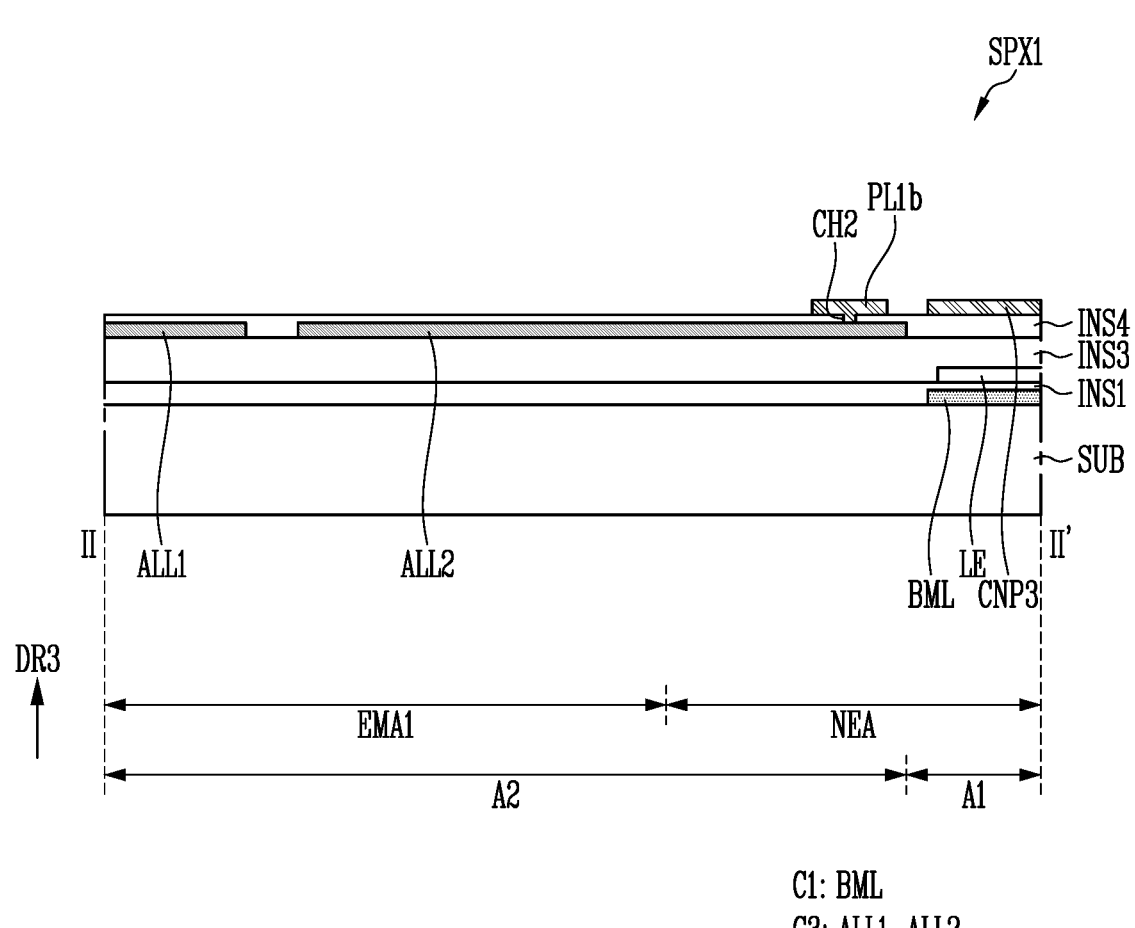
Figure 20:
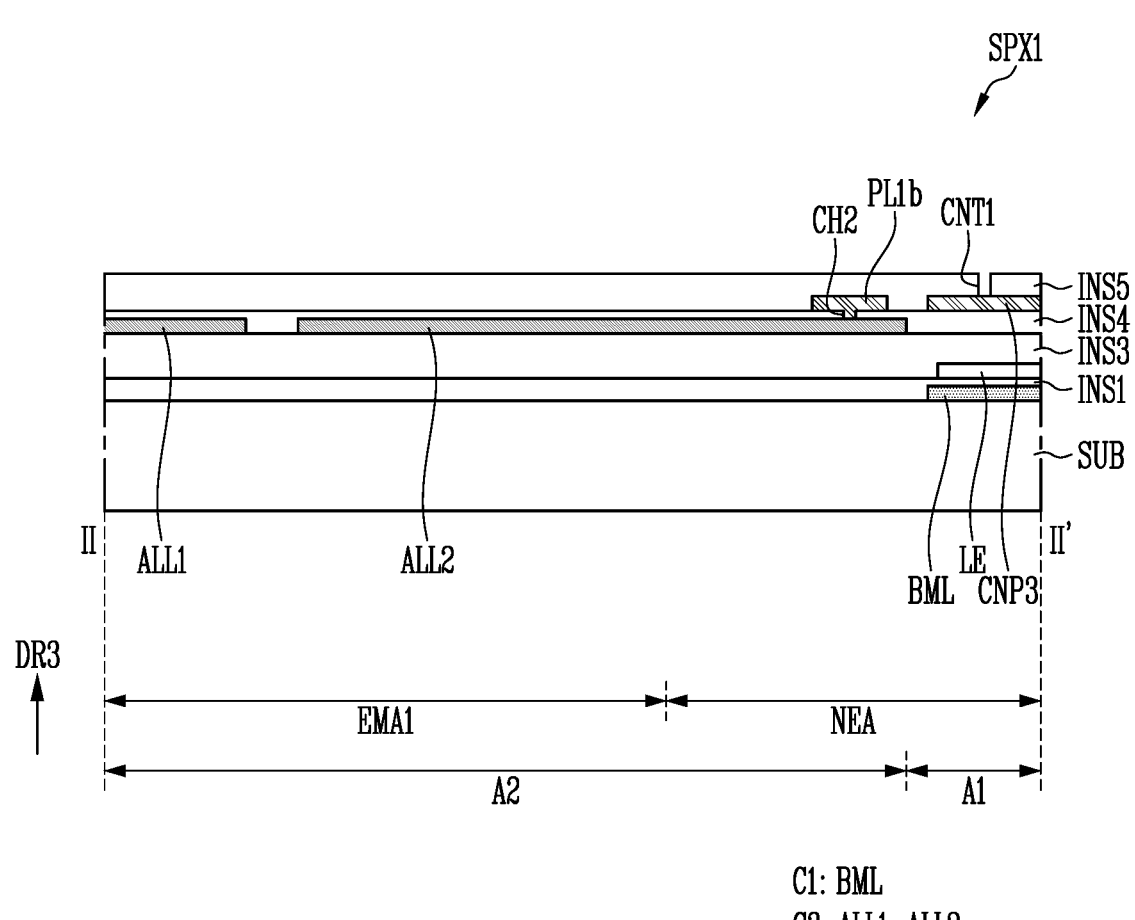
Figure 21:
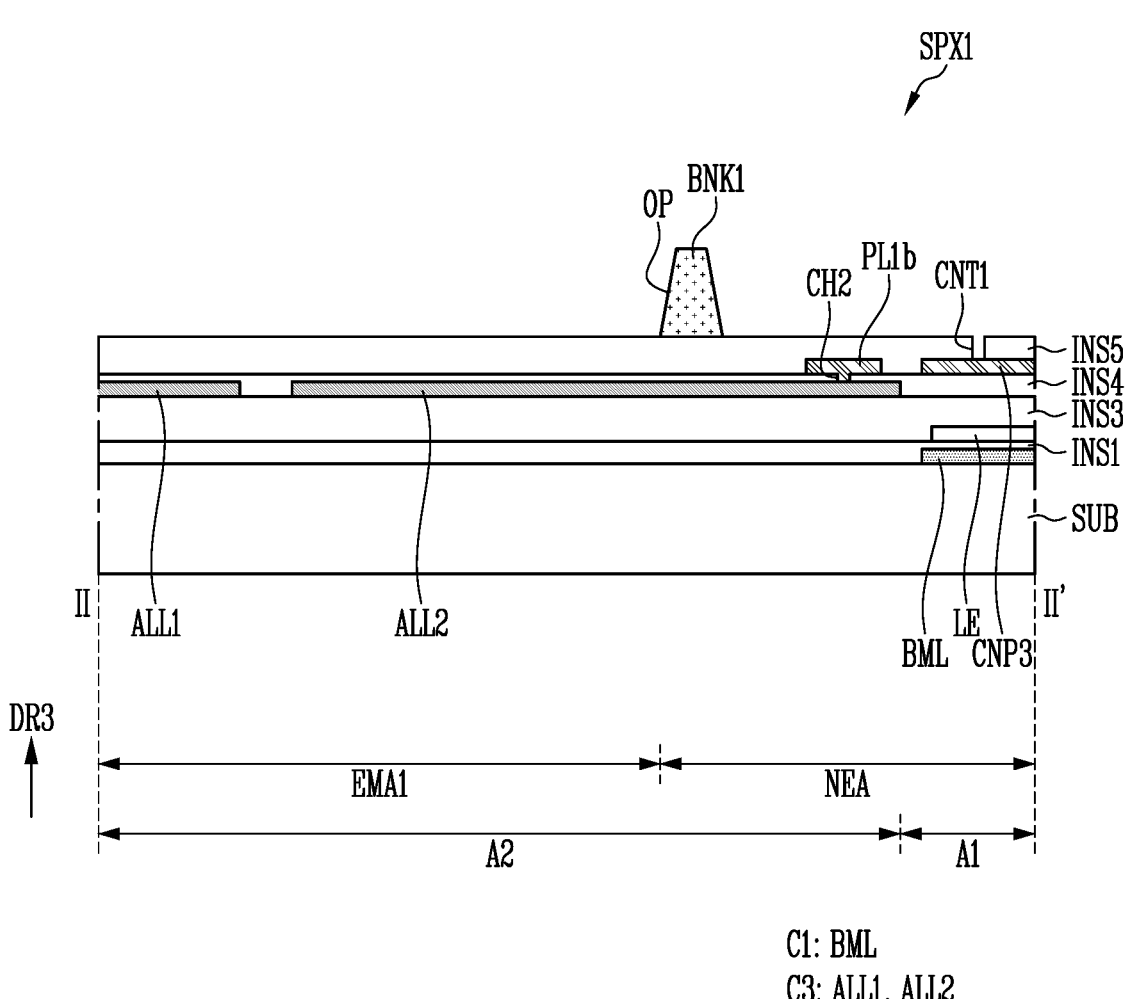
Figure 22:
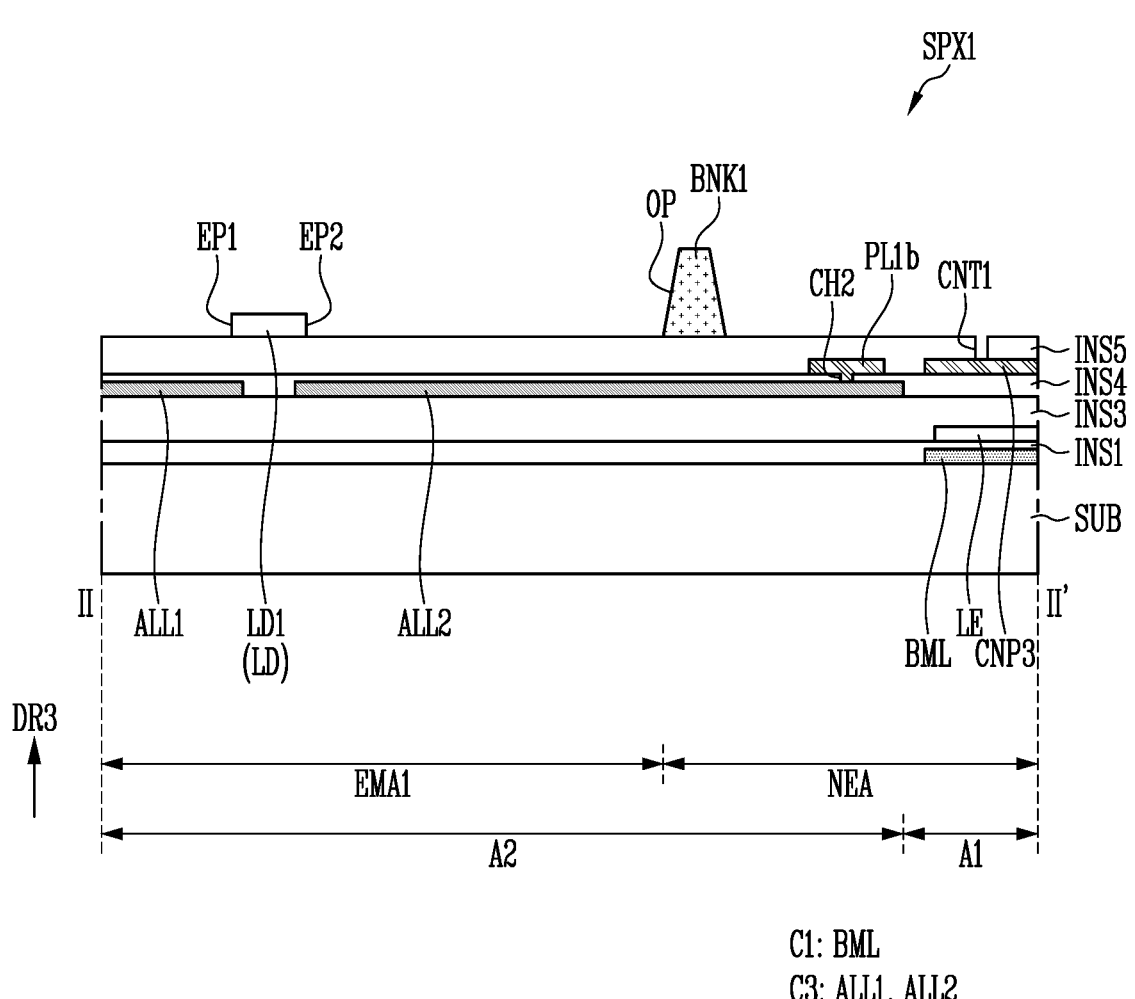
Figure 23:
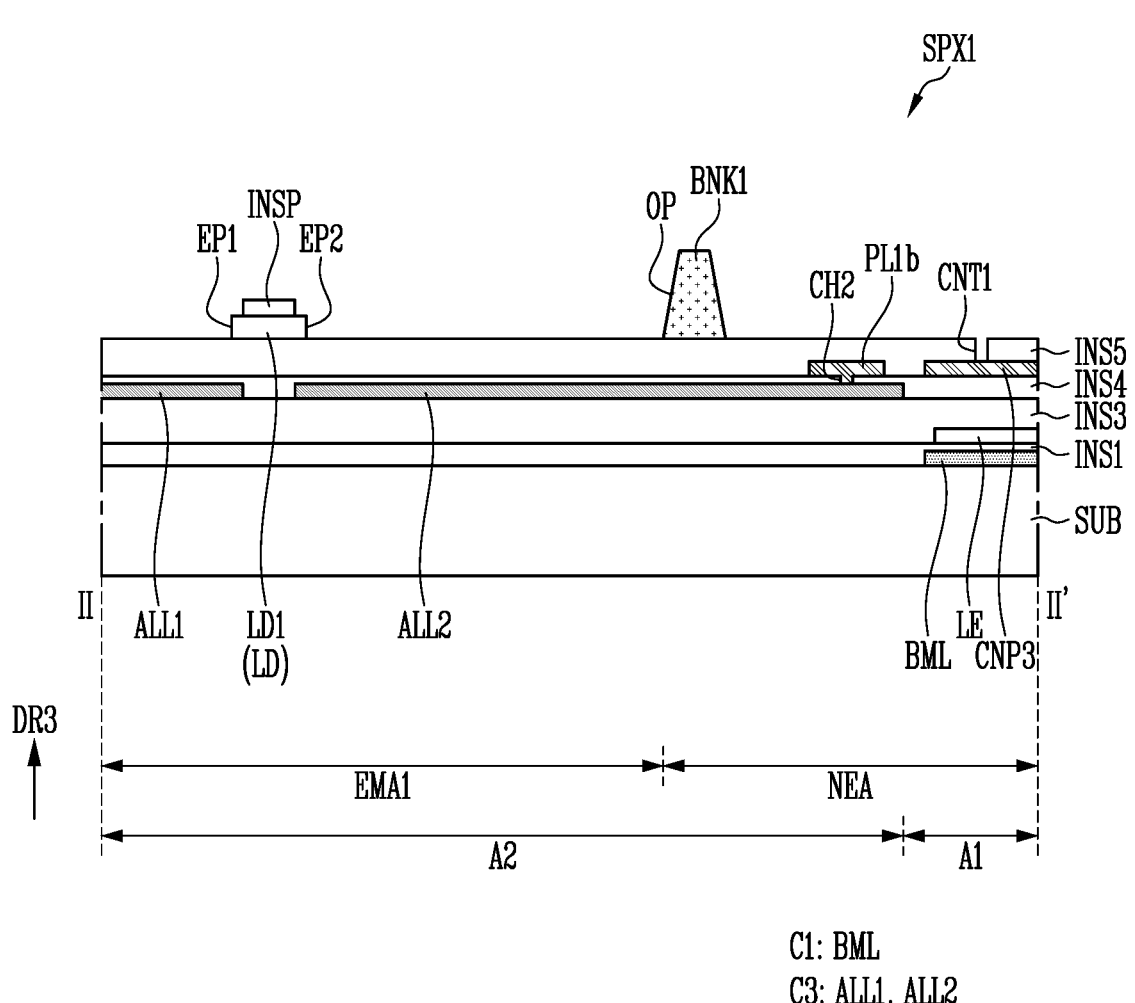
Figure 24:
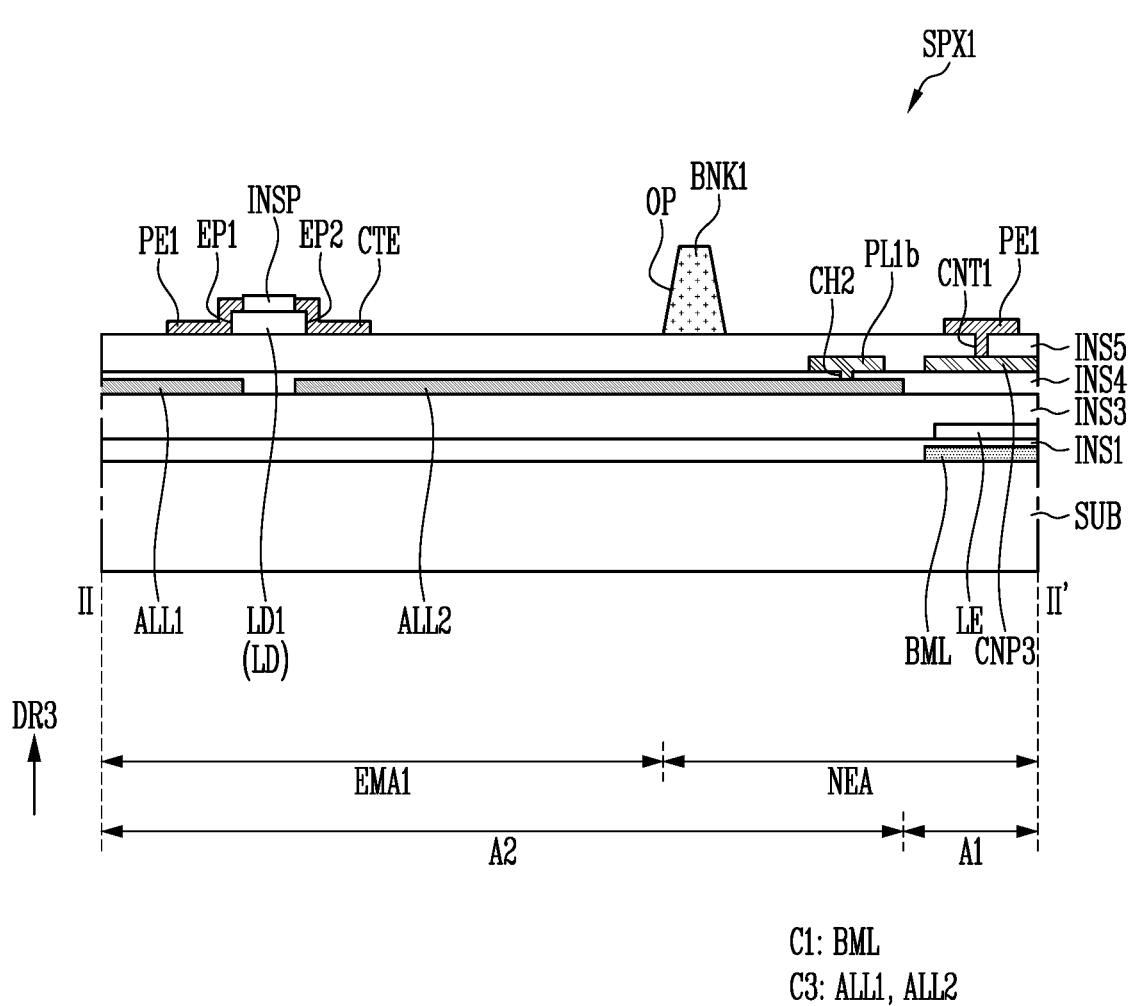

FIG. 16 is a schematic cross-sectional view taken along line I-I' of FIG. 3.

The following description with reference to FIG. 16 will be focused on differences from that of the foregoing embodiments to avoid redundant description.

Referring to FIGS. 3 and 16, each of the pads PD disposed in the pad area PDA of the non-display area NDA may include a first pad electrode PDE1 and a second pad electrode PDE2.

The first pad electrode PDE1 may be formed of the fourth conductive layer C4 disposed on the fourth insulating layer INS4. The first pad electrode PDE1 and the connection patterns CNP1, CNP2, CNP3, and CNP4, the upper electrode UE, the dummy pattern DMP, and the like that are described with reference to FIGS. 6 to 15 may be provided in a same layer, and may have a same material.

The fifth insulating layer INS5 may be disposed on the first pad electrode PDE1.

The fifth insulating layer INS5 may be partially open to expose an area of the first pad electrode PDE1 in the pad area PDA. For example, the fifth insulating layer INS5 may be partially open (e.g., may be partially removed) to include a pad contact hole PD_CH through which an area (or portion) of the first pad electrode PDE1 is exposed in at least the pad area PDA.

The second pad electrode PDE2 may be formed of the fifth conductive layer C5 disposed on the fifth insulating layer INS5. The second pad electrode PDE2 and the first electrode PE1, the second electrode PE2, and the intermediate electrode CTE that are described with reference to FIGS. 6 to 15 may be provided in or on a same layer, and may include a same material. The second pad electrode PDE2 may directly contact the first pad electrode PDE1 exposed through the pad contact hole PD_CH and may be electrically connected to the first pad electrode PDE1. The second pad electrode PDE2 may be exposed to the outside and electrically connected to a driver by a conductive adhesive or the like.

FIGS. 17 to 24 are schematic diagrams for describing a method of fabricating the first sub-pixel SPX1 in accordance with an embodiment, and are schematic cross-sectional views corresponding to line II-II' of FIG. 8.

Hereinafter, the method of fabricating the first sub-pixel SPX1 (or the display device) in accordance with an embodiment will be sequentially described with reference to FIGS. 17 to 24.

In an embodiment, there is illustrated a case where the steps of fabricating the first sub-pixel (or the display device) are sequentially performed according to the sectional views, but without changing the technical scope of the disclosure, some steps illustrated as being successively performed may be simultaneously performed, the sequence of the steps may be changed, some steps may be skipped, or an additional step may be further included between the steps.

The description with reference to FIGS. 17 to 24 will be focused on differences from the above-mentioned embodiments so as to avoid redundant description.

Referring to FIGS. 1 to 17, the first conductive layer C1 may be formed on the substrate SUB. The first conductive layer C1 may include at least one of the first vertical power line PL1a, the second vertical power line PL2a, the initialization power line IPL, the first to third data lines D1, D2, and D3, and the bottom metal pattern BML. The first conductive layer C1 may be located in the first area A1 and the second area A2.

The first insulating layer INS1 may be formed on the overall surfaces of the first conductive layer C1 and the substrate SUB. The first insulating layer INS1 may be disposed on the first conductive layer C1 and the substrate SUB in the first area A1 and the second area A2. In an embodiment, the first insulating layer INS1 may include an inorganic insulating layer including inorganic material. For example, the first insulating layer INS1 may include an inorganic insulating layer including a first layer formed of silicon nitride ($SiN_x$) and a second layer formed of silicon oxide ($SiO_x$).

A semiconductor pattern may be formed on the first insulating layer INS1. The semiconductor pattern may include at least one of first to third active patterns ACT1, ACT2, and ACT3, first to third source electrodes SE1, SE2, and SE3, first to third drain electrodes DE1, DE2, and DE3, and a lower electrode LE. The first to third active patterns ACT1, ACT2, and ACT3, the first to third source electrodes SE1, SE2, and SE3, and the first to third drain electrodes DE1, DE2, and DE3 may be located in the first area A1 (or only in the first area A1). The lower electrode LE may be located in the first area A1 and the second area A2.

The second insulating layer INS2 and the second conductive layer C2 formed on the second insulating layer INS2 may be formed on the semiconductor pattern and the first insulating layer INS1. The second insulating layer INS2 may include an inorganic insulating layer including inorganic material. The second conductive layer C2 may be provided in a double-layer structure stacked in a sequence of titanium (Ti)/copper (Cu), but the present disclosure is not limited thereto.

The second conductive layer C2 may include at least one of the first to third gate electrodes GE1, GE2, and GE3, and the first to third additional conductive patterns ACP1, ACP2, and ACP3. The first to third gate electrodes GE1, GE2, and GE3 may be located in the first area A1 (e.g., only in the first area A1). The first to third additional conductive patterns ACP1, ACP2, and ACP3 may be located in the first area A1 and the second area A2.

The third insulating layer INS3 may be formed on the overall surfaces of the second conductive layer C2 and the first insulating layer INS1. The third insulating layer INS3 may be disposed on the second conductive layer C2 and the first insulating layer INS1 in the first area A1 and the second area A2. In an embodiment, the third insulating layer INS3 may include an inorganic insulating layer including inorganic material. For example, the third insulating layer INS3 may include an inorganic insulating layer including silicon oxynitride ($SiO_xN_y$). However, the embodiments are not limited thereto.

The third conductive layer C3 may be formed on the third insulating layer INS3 in the second area A2. The third conductive layer C3 may include at least one of first to third alignment lines ALL1, ALL2, and ALL3. The first alignment line ALL1 may be divided into the first alignment electrode ALE1 and the first floating pattern FTP1 by removing a portion thereof in the electrode separation area ESA after the light emitting elements LD are aligned. The second alignment line ALL2 may be divided into the second alignment electrode ALE2 and the second floating pattern FTP2 by removing a portion thereof in the electrode separation area ESA after the light emitting elements LD are aligned. The third alignment line ALL3 may be divided into the third alignment electrode ALE3 and the third floating pattern FTP3 by removing a portion thereof in the electrode separation area ESA after the light emitting elements LD are aligned.

Referring to FIGS. 1 to 18, the fourth insulating layer INS4 may be formed on the overall surfaces of the first to third alignment lines ALL1, ALL2, and ALL3 and the third insulating layer INS3. The fourth insulating layer INS4 may be disposed on the third insulating layer INS3 in the first area A1, and may be disposed on the third insulating layer INS3 and the third conductive layer C3 in the second area A2. In an embodiment, the fourth insulating layer INS4 may include an inorganic insulating layer including inorganic material. For example, the fourth insulating layer INS4 may include an inorganic insulating layer including silicon nitride ($SiN_x$). However, the embodiments are not limited thereto.

The fourth insulating layer INS4 may be partially open (or partially removed) to include contact holes. In an embodiment, the fourth insulating layer INS4 may be partially open to include, in the second area A2, at least one of a first contact hole CH1 through which an area (or portion) of the first alignment line ALL1 is exposed, a second contact hole CH2 through which an area of the second alignment line ALL2 is exposed, and a third contact hole CH3 through which an area (or portion) of the third alignment line ALL3 is exposed.

Referring to FIGS. 1 to 19, the fourth conductive layer C4 may be formed on the fourth insulating layer INS4. The fourth conductive layer C4 may be located in the first area A1 and the second area A2. The fourth conductive layer C4 may be provided in a multilayer structure stacked, e.g., in a sequence of titanium, copper, and indium tin oxide, but the disclosure is not limited thereto.

The fourth conductive layer C4 may include at least one of the first horizontal power line PL1b, the first dummy power line PL1c, the second horizontal power line PL2b, the second dummy power line PL2c, the first to fourth connection patterns CNP1, CNP2, CNP3, and CNP4, the upper electrode UE, the dummy pattern DMP, and the scan line SC. The second horizontal power line PL2*b* may be electrically connected to the first alignment line ALL1 exposed through the first contact hole CH1 in the second area A2. The first horizontal power line PL1*b* in the second area A2 may be electrically connected both to the second alignment line ALL2 exposed through the second contact hole CH2 and to the third alignment line ALL3 exposed through the third contact hole CH3.

Referring to FIGS. 1 to 20, the fifth insulating layer INS5 may be formed on the overall surface of the fourth conductive layer C4 and the fourth insulating layer INS4. The fifth insulating layer INS5 may be disposed on the fourth insulating layer INS4 and the fourth conductive layer C4 in the first area A1, and may be disposed on the fourth insulating layer INS4 in the second area A2.

The fifth insulating layer INS5 may be partially open (or partially removed) to include the first contactor CNT1 and the second contactor CNT2. In an embodiment, the fifth insulating layer INS5 may be partially open to include, in the first area A1, at least one of the first contactor CNT1 through which an area (or portion) of the third connection pattern CNP3 is exposed, and the second contactor CNT2 through which an area (or portion) of the third additional conductive pattern ACP3 is exposed.

Referring to FIGS. 1 to 21, the first bank BNK1 may be formed on the fifth insulating layer INS5 in the second area A2. The first bank BNK1 may define the first emission area EMA1 of the first sub-pixel SPX1. Furthermore, the first bank BNK1 may define the second emission area EMA2 of the second sub-pixel SPX2 adjacent to the first sub-pixel SPX1, and the third emission area EMA3 of the third sub-pixel SPX3 adjacent to the second sub-pixel SPX2.

Referring to FIGS. 1 to 22, the first alignment line ALL1 electrically connected to the second horizontal power line PL2*b* and the second and third alignment lines ALL2 and ALL3 electrically connected to the first horizontal power line PL1*b* may be supplied with respective corresponding alignment signals, so that an electric field may be formed between the first to third alignment lines ALL1, ALL2, and ALL3.

Ink including light emitting elements LD may be inputted to the second area A2 through an inkjet printing scheme or the like. For example, at least one inkjet nozzle may be disposed on the fifth insulating layer INS5 in the second area A2, and ink mixed with light emitting elements LD may be inputted to the second area A2 through the inkjet nozzle. Self-alignment of the first light emitting elements LD1 on the fifth insulating layer INS5 between the first alignment line ALL1 and the second alignment line ALL2 may be induced. Self-alignment of the second light emitting elements LD2 on the fifth insulating layer INS5 between the first alignment line ALL1 and the third alignment line ALL3 may be induced.

After the first and second light emitting elements LD1 and LD2 are self-aligned, a solvent included in the ink may be removed by a volatilization scheme or other schemes.

Referring to FIGS. 1 to 23, an insulating pattern INSP may be formed on each of the first and second light emitting elements LD1 and LD2. The first and second ends EP1 and EP2 of each of the first and second light emitting elements LD1 and LD2 may be exposed from the insulating pattern INSP.

Referring to FIGS. 1 to 24, the fifth conductive layer C5 may be formed on the insulating pattern INSP and the fifth insulating layer INS5. The fifth conductive layer C5 may be located in the first area A1 and the second area A2. The fifth conductive layer C5 may include at least one of the first and second electrodes PE1 and PE2, the intermediate electrode CTE, the bridge line BRL, and the protrusion part PRP. In an embodiment, the first electrode PE1 may be formed over the second area A2 and the first area A1, and may be electrically connected to the third connection pattern CNP3 through the first contactor CNT1. The second electrode PE2 may diverge from the bridge line BRL and be located in the second area A2. The bridge line BRL may include the protrusion part PRP extending to the first area A1. The protrusion part PRP may be electrically connected to the third additional conductive pattern ACP3 through the second contactor CNT2.

After the fifth conductive layer C5 is formed, an electrode separation process of forming the first to third alignment electrodes ALE1, ALE2, and ALE3 by removing respective portions of the first to third alignment lines ALL1, ALL2, and ALL3 in the electrode separation area ESA of the second area A2, may be performed.

In the first sub-pixel SPX1 (or the display device DD) formed through the above-mentioned fabrication method, other conductive patterns except the first to third insulating layers INS1, INS2, and INS3 formed of inorganic insulating layers may not be disposed under the first to third alignment electrodes ALE1, ALE2, and ALE3 in the second area A2 in which the first to third alignment electrodes ALE1, ALE2, and ALE3 are located. Consequently, the step coverage of the first to third alignment electrodes ALE1, ALE2, and ALE3 may be enhanced.

Figure 25:
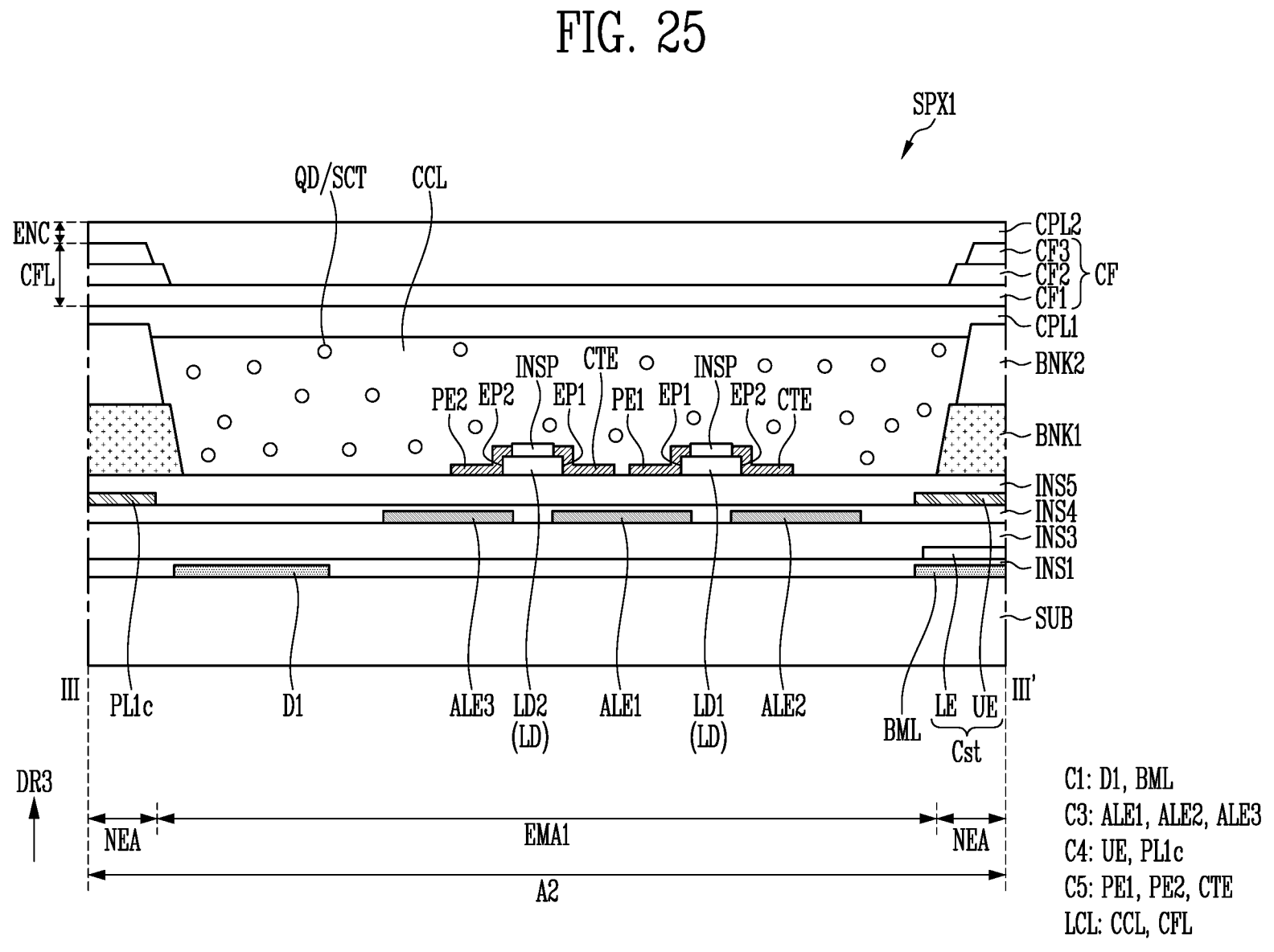
Figure 26:
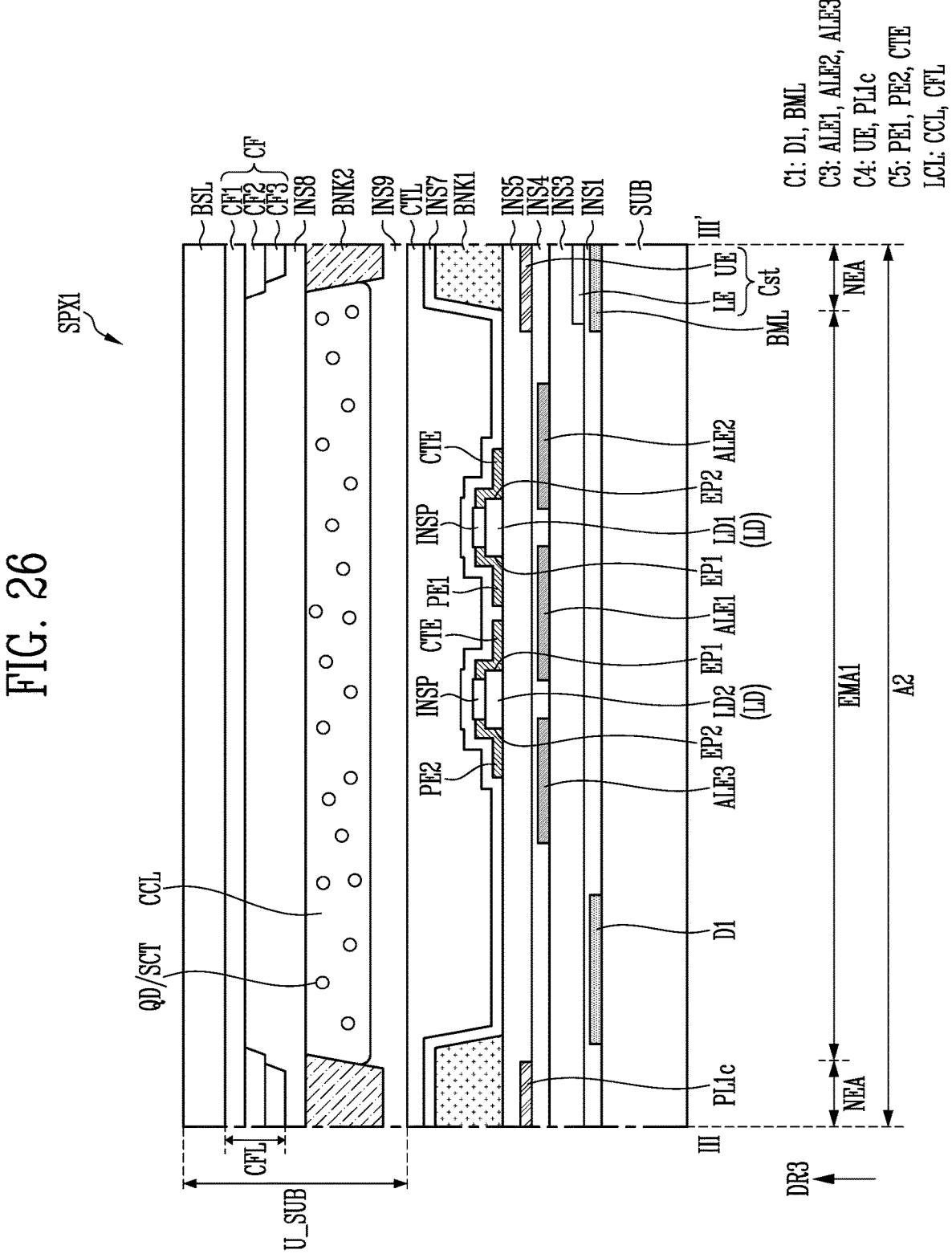

FIGS. 25 and 26 illustrate the first sub-pixel SPX1 in accordance with an embodiment, and are schematic cross-sectional views corresponding to line of FIG. 8.

Embodiments of FIGS. 25 to 26 refer to different modifications with regard to the position of a color conversion layer CCL. For example, FIG. 25 illustrates an embodiment in which the color conversion layer CCL and a color filter layer CFL are disposed over the electrodes PE1 and PE2 and the intermediate electrode CTE through successive processes. FIG. 26 illustrates an embodiment in which an upper substrate U_SUB including the color conversion layer CCL and the color filter layer CFL is disposed on the electrodes PE1 and PE2 and the intermediate electrode CTE through an adhesive process using an intermediate layer CTL.

The description of the embodiments of FIGS. 25 and 26 will be focused on differences from the above-mentioned embodiments so as to avoid redundant description.

Referring to FIGS. 1 to 8 and 25, the first sub-pixel SPX1 may include an optical layer LCL and an encapsulation layer ENC which are disposed on the electrodes PE1 and PE2 and the intermediate electrode CTE.

The optical layer LCL may include at least one of the color conversion layer CCL disposed on the electrodes PE1 and PE2 and the intermediate electrode CTE to correspond to the light emitting elements LD in at least the first emission area EMA1 of the second area A2, and the color filter layer CFL disposed on the color conversion layer CCL. Furthermore, the optical layer LCL may include a second bank BNK2 which encloses the color conversion layer CCL and is disposed on the first bank BNK1 in at least the non-emission area NEA of the second area A2.

The second bank BNK2 may be disposed on the first bank BNK1 in the non-emission area NEA of the first sub-pixel SPX1. The second bank BNK2 may be a dam structure which encloses the first emission area EMA1 of the first sub-pixel SPX1 and defines a position at which the color conversion layer CCL is to be supplied, thus eventually defining the first emission area EMA1.

The second bank BNK2 may include light shielding material. For example, the second bank BNK2 may be a black matrix, but the disclosure is not limited thereto. In an embodiment, the second bank BNK2 may include at least one light shielding material and/or reflective material, and allow light emitted from the color conversion layer CCL to more reliably travel in the image display direction of the display device DD, thus enhancing the light output efficiency of the color conversion layer CCL.

The color conversion layer CCL may include color conversion particles QD corresponding to a specific color. For example, the color conversion layer CCL may include color conversion particles QD which convert a first color of light emitted from the light emitting elements LD to a second color of light (a specific color of light, or light having excellent color reproducibility).

In case that the first sub-pixel SPX1 is a red sub-pixel, the color conversion layer CCL of the first sub-pixel SPX1 may include color conversion particles QD formed of red quantum dots which convert a first color of light emitted from the light emitting elements LD to a second color of light (e.g., red light).

In case that the first sub-pixel SPX1 is a green sub-pixel, the color conversion layer CCL of the first sub-pixel SPX1 may include color conversion particles QD formed of green quantum dots which convert a first color of light emitted from the light emitting elements LD to a second color of light (e.g., green light).

In case that the first sub-pixel SPX1 is a blue sub-pixel, the color conversion layer CCL of the first sub-pixel SPX1 may include color conversion particles QD formed of blue quantum dots which convert a first color of light emitted from the light emitting elements LD to a second color of light (e.g., blue light). In case that the first sub-pixel SPX1 is a blue sub-pixel, depending on the embodiment, there may be provided a light scattering layer including light scattering particles SCT, in place of the color conversion layer CCL including the color conversion particles QD. For example, in case that the light emitting elements LD emit blue-based light, the first sub-pixel SPX1 may include a light scattering layer including light scattering particles SCT. The light scattering layer may be omitted depending on embodiments. In case that the first sub-pixel SPX1 is a blue sub-pixel, depending on the embodiment, there may be provided a transparent polymer, in place of the color conversion layer CCL.

A first capping layer CPL1 may be disposed on the color conversion layer CCL and the second bank BNK2.

The first capping layer CPL1 may be provided, to cover the second bank BNK2 and the color conversion layer CCL, in the overall surface of the first sub-pixel area SPXA1 (or the display area DA) in which the first sub-pixel SPX1 is disposed.

The first capping layer CPL1 may be an inorganic insulating layer including inorganic material. The first capping layer CPL1 may include, e.g., at least one of silicon nitride ($SiN_x$), silicon oxide ($SiO_x$), silicon oxynitride ($SiO_xN_y$), aluminum oxide ($AlO_x$), and the like. The first capping layer CPL1 may cover the entireties of the second bank BNK2 and the color conversion layer CCL and may thus prevent external water, oxygen, or the like from being drawn into the color conversion layer CCL.

In an embodiment, the first capping layer CPL1 may mitigate a step difference (or height difference) formed by components disposed thereunder and may have an even surface. For example, the first capping layer CPL1 may include an organic insulating layer including organic material, but the disclosure is not limited thereto. The first capping layer CPL1 may be a common layer provided in common in the display area DA.

The color filter layer CFL may be disposed on the first capping layer CPL1.

The color filter layer CFL may include a color filter CF corresponding to the first emission area EMA1. For example, the color filter layer CFL may include at least one of a first color filter CF1 disposed on the color conversion layer CCL of the first sub-pixel SPX1, a second color filter CF2 disposed on the color conversion layer CCL of the second sub-pixel SPX2, and a third color filter CF3 disposed on the color conversion layer CCL of the third pixel SPX3.

The first to third color filters CF1, CF2, and CF3 may be disposed in the non-emission area NEA and overlap each other, thus functioning as a light shielding component for preventing optical interference between adjacent sub-pixels from occurring. Each of the first to third color filters CF1, CF2, and CF3 may include color filter material that allows the second color of light converted by the corresponding color conversion layer CCL to selectively pass therethrough. For example, the first color filter CF1 may be a red color filter, the second color filter CF2 may be a green color filter, and the third color filter CF3 may be a blue color filter, but the disclosure is not limited thereto.

The encapsulation layer ENC may be disposed on the color filter layer CFL.

The encapsulation layer ENC may include a second capping layer CPL2. The second capping layer CPL2 may be an inorganic insulating layer including inorganic material or an organic insulating layer including organic material. The second capping layer CPL2 may cover the entireties of components disposed thereunder and prevent external water, moisture, or the like from being drawn into the optical layer LCL. In an embodiment, the second capping layer CPL2 may be used as a planarization layer for mitigating a step difference caused by the components of the optical layer LCL located under the second capping layer CPL2.

The second capping layer CPL2 may have a multilayer structure. For example, the second capping layer CPL2 may be formed of at least two inorganic insulating layers, and at least one organic insulating layer interposed between the at least two inorganic insulating layers. The constituent material and/or structure of the second capping layer CPL2 may be changed in various ways. In some embodiments, at least one overcoat layer, at least one filler layer, and/or at least another substrate may be further disposed over the second capping layer CPL2.

In the first sub-pixel SPX1 in accordance with the foregoing embodiment, the color conversion layer CCL and the color filter layer CFL may be disposed on the light emitting elements LD through successive processes so that light having excellent light reproducibility can be emitted through the color conversion layer CCL and the color filter layer CFL, whereby the light output efficiency can be enhanced.

In an embodiment, as illustrated in FIG. 26, the color conversion layer CCL and the color filter layer CFL may be formed on a surface of a base layer BSL through (or by) successive processes, thus forming a separate substrate, e.g., an upper substrate U_SUB. The upper substrate U_SUB may be coupled, by the intermediate layer CTL, with the substrate SUB on which the electrodes PE1 and PE2, the intermediate electrode CTE, and the like are disposed. A seventh insulating layer INS7 may be selectively disposed on the electrodes PE1 and PE2 and the intermediate electrode CTE. The seventh insulating layer INS7 may prevent the electrodes PE1 and PE2 and the intermediate electrode CTE from being exposed to the outside during a process of coupling the substrate SUB with the upper substrate U_SUB. The seventh insulating layer INS7 may be an inorganic insulating layer including inorganic material, but the disclosure is not limited thereto.

The intermediate layer CTL may be a transparent adhesive layer (or a transparent bonding layer), e.g., an optically clear adhesive layer, for enhancing the adhesive force between the substrate SUB and the upper substrate U_SUB, but the disclosure is not limited thereto. In an embodiment, the intermediate layer CTL may be a refractive index conversion layer configured to change the refractive index of light emitted from the light emitting elements LD toward the upper substrate U_SUB and enhance emission luminance of the first sub-pixel SPX1. In an embodiment, the intermediate layer CTL may include a filler formed of insulating material having insulation property and adhesion property.

The upper substrate U_SUB may include at least one of a base layer BSL, a color filter layer CFL, an eighth insulating layer INS8, a color conversion layer CCL, and a ninth insulating layer INS9, which are stacked each other in a direction opposite to the third direction DR3. The upper substrate U_SUB may include the second bank BNK2 configured to enclose the color conversion layer CCL.

The base layer BSL may be a rigid or flexible substrate, and the material or properties thereof are not particularly limited. The base layer BSL and the substrate SUB may be formed of a same material, or may be formed of different materials.

The color filter layer CFL may be disposed on a surface of the base layer BSL to face the electrodes PE1 and PE2 and the intermediate electrode CTE. The first color filter CF1 of the color filter layer CFL may be disposed on a surface of the base layer BSL to correspond to the light emitting elements LD in the first emission area EMA1. The first, second, and third color filters CF1, CF2, and CF3 of the color filter layer CFL may be disposed in the non-emission area NEA and overlap each other, thus functioning as a light blocking component.

An eighth insulating layer INS8 may be disposed on the color filter layer CFL. The eighth insulating layer INS8 may be disposed on the color filter layer CFL and cover the color filter layer CFL, thus protecting the color filter layer CFL. The eighth insulating layer INS8 may be formed of an inorganic insulating layer including inorganic material and/or an organic insulating layer including organic material.

The second bank BNK2 and the color conversion layer CCL may be disposed on a surface of the eighth insulating layer INS8.

The ninth insulating layer INS9 may be disposed on the overall surfaces of the second bank BNK2 and the color conversion layer CCL.

The ninth insulating layer INS9 may be formed of an inorganic insulating layer including inorganic material or an organic insulating layer including organic material. The ninth insulating layer INS9 may be disposed on the color conversion layer CCL and protect the color conversion layer CCL from external water or moisture so that the reliability of the color conversion layer CCL can be further enhanced.

The upper substrate U_SUB may be coupled with the substrate SUB by the intermediate layer CTL.

In an embodiment, each pixel area (or each sub-pixel area) may be divided into a first area in which a pixel circuit is disposed, and a second area in which an emission component is disposed. Insulating layers that are disposed under an alignment electrode located in at least the second area may be formed of an inorganic insulating layer. An additional conductive layer (or an additional conductive pattern) other than the insulating layers may not be disposed under the alignment electrodes, so that the alignment electrode may have an even surface.

Hence, the alignment electrode may be mitigated or prevented from being affected by a step difference (or height difference) caused by components disposed under the alignment electrode. Consequently, a step coverage of the alignment electrode can be improved.

Because the step coverage of the alignment electrode is improved, the alignment of the light emitting elements aligned on the alignment electrode may be enhanced. Therefore, the number of light emitting elements capable of being used as a valid light source can be increased, so that the light output efficiency of each pixel (or each sub-pixel) may be enhanced.

Consequently, a display device having improved reliability, and a method of fabricating the display device may be provided.

The effects of the disclosure are not limited by the foregoing, and other various effects are anticipated herein.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
pixel areas each including a first area and a second area; and
a pixel provided in each of the pixel areas, wherein
the pixel comprises:
    a first insulating layer, a second insulating layer, a third insulating layer, a fourth insulating layer, and a fifth insulating layer successively stacked on a substrate;
    a power line disposed on the substrate;
    a pixel circuit component provided in the first area, and comprising a transistor disposed on the substrate and electrically connected to the power line; and
    an emission component provided in the second area, and comprising first, second, and third alignment electrodes disposed on the substrate at positions spaced apart from each other, and a light emitting element disposed between the first, the second, and the third alignment electrodes,
at least one of the first to the fifth insulating layers is disposed under the first to the third alignment electrodes, and
the at least one of the first to the fifth insulating layers includes an inorganic insulating layer.

2. The display device according to claim 1, wherein
the first, the second, and the third alignment electrodes are formed of a third conductive layer disposed on the third insulating layer, and
each of the first insulating layer, the second insulating layer, and the third insulating layer includes the inorganic insulating layer.

3. A display device comprising:

pixel areas each including a first area and a second area; and a pixel provided in each of the pixel areas, wherein the pixel comprises:

a first insulating layer, a second insulating layer, a third insulating layer, a fourth insulating layer, and a fifth insulating layer successively stacked on a substrate;

a power line disposed on the substrate;

a pixel circuit component provided in the first area, and comprising a transistor disposed on the substrate and electrically connected to the power line; and an emission component provided in the second area, and comprising first, second, and third alignment electrodes disposed on the substrate at positions spaced apart from each other, and a light emitting element disposed between the first, the second, and the third alignment electrodes, at least one of the first to the fifth insulating layers is disposed under the first to the third alignment electrodes, and the at least one of the first to the fifth insulating layers includes an inorganic insulating layer, wherein the first, the second, and the third alignment electrodes are formed of a third conductive layer disposed on the third insulating layer, wherein each of the first insulating layer, the second insulating layer, and the third insulating layer includes the inorganic insulating layer, and wherein the power line comprises:

a first power line supplied with a voltage of a first driving power supply, and a second power line supplied with a voltage of a second driving power supply different from the voltage of the first driving power supply, the first power line comprises:

a first vertical power line formed of a first conductive layer disposed on the substrate;

a first horizontal power line formed of a fourth conductive layer disposed on the fourth insulating layer; and a first dummy power line integral with the first horizontal power line and extending in a direction different from the first horizontal power line, and the second power line comprises:

a second vertical power line formed of the first conductive layer;

a second horizontal power line formed of the fourth conductive layer; and a second dummy power line integral with the second horizontal power line and extending in a direction different from the second horizontal power line.

4. The display device according to claim 3, wherein the emission component further comprises:

a first floating pattern spaced apart from the first alignment electrode;

a second floating pattern spaced apart from the second alignment electrode; and a third floating pattern spaced apart from the third alignment electrode, the first floating pattern is electrically connected to the second horizontal power line, and the second and the third floating patterns are electrically connected to the first horizontal power line.

5. The display device according to claim 3, wherein the transistor comprises:

an active pattern disposed on the first insulating layer;

a gate electrode disposed on the active pattern with the second insulating layer disposed between the gate electrode and the active pattern;

a source electrode electrically connected to a first end of the active pattern; and a drain electrode electrically connected to a second end of the active pattern, and the gate electrode is formed of a second conductive layer disposed on the second insulating layer.

6. The display device according to claim 5, wherein the pixel comprises:

an emission area in which light is emitted from the light emitting element, and a non-emission area enclosing the emission area; and a first bank provided in the non-emission area, and including an opening corresponding to the emission area, and the emission area is located in the second area.

7. The display device according to claim 6, wherein, at least in the emission area, the first conductive layer and the second conductive layer are not disposed under the first, the second, and the third alignment electrodes.

8. The display device according to claim 7, wherein at least in the emission area, the third alignment electrode, the first alignment electrode, and the second alignment electrode are arranged in a first direction in a listed order, and the light emitting element comprises:

a first light emitting element disposed between the first alignment electrode and the second alignment electrode, and including a first end and a second end which face each other; and a second light emitting element disposed between the first alignment electrode and the third alignment electrode, and including a first end and a second end which face each other.

9. The display device according to claim 8, wherein the emission component further comprises a first electrode, a second electrode, and an intermediate electrode which are formed of a fifth conductive layer disposed on the fifth insulating layer and are disposed to be spaced apart from each other, the first electrode is disposed on a first side of the first alignment electrode and is electrically connected to the first end of the first light emitting element, the second electrode is disposed on the third alignment electrode and is electrically connected to the second end of the second light emitting element, and the intermediate electrode is disposed on the second alignment electrode and electrically connected to the second end of the first light emitting element, and is disposed on a second side of the first alignment electrode and electrically connected to the first end of the second light emitting element.

10. The display device according to claim 9, wherein the pixel circuit component further comprises:

a storage capacitor electrically connected to the transistor; and a connection pattern electrically connected to an electrode of the storage capacitor and formed of the fourth conductive layer, the connection pattern is located in the first area, and the first electrode extends to the first area and is electrically connected to the connection pattern through a first contactor passing through the fifth insulating layer.

11. The display device according to claim 9, wherein the emission component further comprises a bridge line disposed in the non-emission area, the bridge line being integral with the second electrode, and the bridge line comprises a protrusion part protruding in a second direction different from the first direction and electrically connected to the second power line through a second contactor passing through the fifth insulating layer.

12. The display device according to claim 9, wherein the display device further includes a pad area in which a pad electrically connected to the pixel is disposed, the pad comprises:

a first pad electrode formed of the fourth conductive layer; and a second pad electrode formed of the fifth conductive layer, and the first pad electrode and the second pad electrode are electrically connected to each other through a pad contact hole passing through the fifth insulating layer.

13. The display device according to claim 8, wherein the pixel comprises:

a second bank disposed over the first bank in the second area;

a color conversion layer enclosed by the second bank and disposed over the light emitting element; and a color filter disposed on the color conversion layer.

14. The display device according to claim 3, wherein the first vertical power line, the first horizontal power line, and the first dummy power line are electrically connected to each other, and the second vertical power line, the second horizontal power line, and the second dummy power line are electrically connected to each other.

15. The display device according to claim 14, wherein the first dummy power line overlaps the first vertical power line in a plan view, the first horizontal power line extends from the first dummy power line in a first direction, the second dummy power line overlaps the second vertical power line in a plan view, and the second horizontal power line extends from the second dummy power line in the first direction.

16. A display device comprising:

a first sub-pixel area, a second sub-pixel area, and a third sub-pixel area disposed adjacent to each other, and each including a first area and a second area, wherein each of the first, the second, and the third sub-pixel areas comprises:

a first insulating layer, a second insulating layer, a third insulating layer, a fourth insulating layer, and a fifth insulating layer successively stacked on a substrate;

a power line disposed on the substrate, and comprising a first power line supplied with a voltage of a first driving power supply, and a second power line spaced apart from the first power line and supplied with a voltage of a second driving power supply;

a pixel circuit component provided in the first area, and comprising a transistor disposed on the substrate and electrically connected to the power line, and a storage capacitor electrically connected to the transistor; and an emission component provided in the second area, and comprising first, second, and third alignment electrodes disposed on the substrate at positions spaced apart from each other, and a light emitting element disposed between the first, the second, and the third alignment electrodes, and at least one of the first to the fifth insulating layers is disposed under the first to the third alignment electrodes, and the at least one of the first to the fifth insulating layers includes an inorganic insulating layer.

17. The display device according to claim 16, wherein the second area includes an emission area in which light is emitted from the light emitting element, and a conductive layer is not disposed under the first, the second, and the third alignment electrodes at least in the emission area.

18. The display device according to claim 16, wherein the light emitting element comprises:

a first light emitting element disposed between the first alignment electrode and the second alignment electrode, and including a first end and a second end which face each other; and a second light emitting element disposed between the first alignment electrode and the third alignment electrode, and including a first end and a second end which face each other, and the emission component further comprises a first electrode, a second electrode, and an intermediate electrode which are disposed on the fifth insulating layer and spaced apart from each other.

19. A display device comprising:

a first sub-pixel area, a second sub-pixel area, and a third sub-pixel area disposed adjacent to each other, and each including a first area and a second area, wherein each of the first, the second, and the third sub-pixel areas comprises:

a first insulating layer, a second insulating layer, a third insulating layer, a fourth insulating layer, and a fifth insulating layer successively stacked on a substrate;

a power line disposed on the substrate, and comprising a first power line supplied with a voltage of a first driving power supply, and a second power line spaced apart from the first power line and supplied with a voltage of a second driving power supply;

a pixel circuit component provided in the first area, and comprising a transistor disposed on the substrate and electrically connected to the power line, and a storage capacitor electrically connected to the transistor; and an emission component provided in the second area, and comprising first, second, and third alignment electrodes disposed on the substrate at positions spaced apart from each other, and a light emitting element disposed between the first, the second, and the third alignment electrodes, and at least one of the first to the fifth insulating layers is disposed under the first to the third alignment electrodes, and the at least one of the first to the fifth insulating layers includes an inorganic insulating layer, wherein the light emitting element comprises:

a first light emitting element disposed between the first alignment electrode and the second alignment electrode, and including a first end and a second end which face each other; and a second light emitting element disposed between the first alignment electrode and the third alignment electrode, and including a first end and a second end which face each other, the emission component further comprises a first electrode, a second electrode, and an intermediate electrode which are disposed on the fifth insulating layer and spaced apart from each other, the emission component further comprises a bridge line located in the second area and electrically connected to the second electrode of each of the first, the second, and the third sub-pixel areas, and the bridge line comprises a protrusion part protruding from the second area to the first area and electrically connected to the second power line.

20. A method of fabricating a display device, comprising:

forming, on a substrate, a pixel in each of pixel areas each including a first area and a second area, wherein forming the pixel comprises:

forming a first insulating layer, a second insulating layer, and a third insulating layer on the substrate;

forming first, second, and third alignment lines spaced apart from each other, on the third insulating layer in the second area;

forming, on the first, the second, and the third alignment lines, a fourth insulating layer including a contact hole through which one area of each of the first, the second, and the third alignment lines is exposed;

forming, on the fourth insulating layer in the second area, a first horizontal power line electrically connected to the first alignment line, and a second horizontal power line electrically connected to the second and the third alignment lines;

forming a fifth insulating layer on the first and the second horizontal power lines;

aligning a first light emitting element on the fifth insulating layer between the first alignment line and the second alignment line, and aligning a second light emitting element on the fifth insulating layer between the first alignment line and the third alignment line;

forming a first electrode on a first end of the first light emitting element, forming an intermediate electrode on a second end of the first light emitting element and a first end of the second light emitting element, and forming a second electrode on a second end of the second light emitting element; and forming an alignment electrode and a floating pattern disposed to be spaced apart from each other by removing a portion of each of the first, the second, and the third alignment lines in the second area, and each of the first insulating layer, the second insulating layer, and the third insulating layer that are located under the first, the second, and the third alignment lines includes an inorganic insulating layer.

* * * * *